United States Patent
Shinmoto et al.

(10) Patent No.: US 8,723,387 B2
(45) Date of Patent: May 13, 2014

(54) ELECTRIC WIRE, COIL, DEVICE FOR DESIGNING ELECTRIC WIRE, AND ELECTRIC MOTOR

(71) Applicant: Fujikura Ltd., Tokyo (JP)

(72) Inventors: Takashi Shinmoto, Noda (JP); Shotaro Yoshida, Edogawa-ku (JP); Ning Guan, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/874,852

(22) Filed: May 1, 2013

(65) Prior Publication Data

US 2013/0234637 A1 Sep. 12, 2013

Related U.S. Application Data

(60) Division of application No. 13/770,445, filed on Feb. 19, 2013, which is a continuation of application No. PCT/JP2011/066563, filed on Jul. 21, 2011.

(30) Foreign Application Priority Data

| Aug. 20, 2010 | (JP) | 2010-185635 |
| Aug. 20, 2010 | (JP) | 2010-185636 |
| Aug. 20, 2010 | (JP) | 2010-185637 |
| Aug. 20, 2010 | (JP) | 2010-185638 |
| Sep. 17, 2010 | (JP) | 2010-209651 |
| Dec. 20, 2010 | (JP) | 2010-283809 |

(51) Int. Cl.
*H02K 1/00* (2006.01)

(52) U.S. Cl.
USPC .......................... 310/180; 310/213

(58) Field of Classification Search
USPC ............... 310/45, 179–180.198, 208, 213
See application file for complete search history.

(56) References Cited

U.S. PATENT DOCUMENTS

| 5,438,997 | A  | * | 8/1995  | Sieben et al. ............. 600/463 |
| 5,563,375 | A  | * | 10/1996 | Hayami .................. 174/120 R |
| 5,861,578 | A  | * | 1/1999  | Hake et al. .............. 174/120 R |
| 6,180,888 | B1 | * | 1/2001  | Yin et al. ................ 174/110 R |
| 7,239,061 | B2 | * | 7/2007  | Huang et al. ................ 310/211 |
| 8,390,167 | B2 | * | 3/2013  | Jung et al. ................. 310/254.1 |
| 8,441,165 | B2 | * | 5/2013  | Jung et al. ............... 310/216.012 |
| 2001/0036414 | A1 |  | 11/2001 | Makino et al. |
| 2007/0278890 | A1 | * | 12/2007 | Huang et al. ................ 310/211 |

FOREIGN PATENT DOCUMENTS

| JP | 62-076216 A | 4/1987 |
| JP | 2001-280249 A | 10/2001 |
| JP | 2002-150633 A | 5/2002 |
| JP | 2002-358840 A | 12/2002 |
| JP | 2005-108654 A | 4/2005 |
| JP | 2008-148533 A | 6/2008 |
| JP | 2009-129654 A | 6/2009 |
| JP | 2009-129550 A | 11/2009 |
| JP | 2010-093145 A | 4/2010 |
| KR | 2001-0032560 A | 4/2001 |
| WO | 99/28992 A1 | 6/1999 |
| WO | 2006/046358 A1 | 5/2006 |
| WO | 2009/004989 A1 | 1/2009 |

* cited by examiner

*Primary Examiner* — Thanh Lam
(74) *Attorney, Agent, or Firm* — Sughrue Mion, PLLC

(57) ABSTRACT

An electric wire includes a conductive portion 11 made of a material having a volume resistivity higher than that of copper, wherein the volume resistivity of the conductive portion is specified so that, in a frequency range in which the electric wire is used, a ratio of AC resistance of the conductive portion 11 to AC resistance of reference copper wire is less than 1.

6 Claims, 41 Drawing Sheets

| STRAND DIAMETER (mm) | 0.4 |
| --- | --- |
| NUMBER OF STRANDS | 55 |
| NUMBER OF TURNS | 17 |
| LENGTH (m) | 6.6 |

| FREQUENCY | 10kHz | 20kHz | 50kHz | 100kHz | 200kHz |
|---|---|---|---|---|---|
| COPPER WIRE (Ω) | 0.0596 | 0.0864 | 0.195 | 0.506 | 1.37 |
| BRASS WIRE (Ω) | 0.0496 | 0.0551 | 0.0938 | 0.230 | 0.755 |

FIG. 15

| WIRE TYPE | COPPER WIRE | 5% CCA WIRE | 10% CCA WIRE | 15% CCA WIRE | 5% CCA WIRE (Al alloy) | | BRASS WIRE | | SILICON BRONZE WIRE | PHOSPHOR BRONZE WIRE |
|---|---|---|---|---|---|---|---|---|---|---|
| WIRE DIAMETER (mm) | 0.4 | 0.4 | 0.4 | 0.4 | 0.6 | 0.4 | 0.6 | 0.4 | 0.4 | 0.4 |
| VOLUME RESISTIVITY (μΩ-cm) | 1.724 | 2.74 | 2.66 | 2.59 | 2.92 | 2.92 | 6.3 | 6.3 | 2.5 | 6.0 |
| Rp (Ω/m) | 0.33 | 0.226 | 0.231 | 0.247 | 0.447 | 0.214 | 0.215 | 0.098 | 0.238 | 0.103 |
| Rp RATIO | 1.0 | 0.68 | 0.70 | 0.75 | 1.35 | 0.65 | 0.65 | 0.30 | 0.72 | 0.31 |

FIG. 21

| | FREQUENCY (kHz) | CURRENT VALUE (A) | MAGNITUDE RATIO (%) |
|---|---|---|---|
| DC COMPONENT | 0 | 0.5793 | 48.8 |
| FUNDAMENTAL | 127 | 1.1865 | 100.0 |
| 2ND HARMONIC | 253 | 0.4730 | 39.9 |
| 3RD HARMONIC | 380 | 0.1170 | 9.9 |
| 4TH HARMONIC | 507 | 0.2989 | 25.2 |
| 5TH HARMONIC | 633 | 0.1613 | 13.6 |
| 6TH HARMONIC | 760 | 0.1001 | 8.4 |
| 7TH HARMONIC | 887 | 0.1727 | 14.6 |
| 8TH HARMONIC | 1013 | 0.0692 | 5.8 |
| 9TH HARMONIC | 1140 | 0.0844 | 7.1 |
| 10TH HARMONIC | 1267 | 0.1216 | 10.2 |
| 11TH HARMONIC | 1393 | 0.0252 | 2.1 |
| 12TH HARMONIC | 1520 | 0.0817 | 6.9 |
| 13TH HARMONIC | 1647 | 0.0789 | 6.7 |
| 14TH HARMONIC | 1773 | 0.0117 | 1.0 |
| 15TH HARMONIC | 1900 | 0.0734 | 6.2 |
| 16TH HARMONIC | 2027 | 0.0572 | 4.8 |
| 17TH HARMONIC | 2154 | 0.0226 | 1.9 |
| 18TH HARMONIC | 2280 | 0.0632 | 5.3 |
| 19TH HARMONIC | 2407 | 0.0363 | 3.1 |
| 20TH HARMONIC | 2534 | 0.0186 | 1.6 |

FIG. 22

| | COPPER WINDING WIRE Φ0.6mm | CCA WINDING WIRE Φ0.2mm |
|---|---|---|
| LOSS (W) | 14.5 | 8.0 |

| α [mm-1] | LOWER LIMIT FREQUENCY [Hz] | UPPER LIMIT FREQUENCY [Hz] |
|---|---|---|
| 2.2 | 116 | 1145 |
| 3.2 | 80 | 1167 |
| 3.9 | 65 | 1173 |
| 4.5 | 56 | 1176 |
| 5.5 | 45 | 1179 |

| r[mm] | LOWER LIMIT FREQUENCY [Hz] | UPPER LIMIT FREQUENCY [Hz] |
|---|---|---|
| 0.7 | 98 | 1522 |
| 0.8 | 65 | 1173 |
| 0.9 | 45 | 926 |

| α [mm⁻¹] | LOWER LIMIT FREQUENCY [Hz] | UPPER LIMIT FREQUENCY [Hz] |
|---|---|---|
| 1.0 | 147 | 670 |
| 1.7 | 77 | 731 |
| 2.2 | 59 | 742 |
| 3.2 | 40 | 750 |
| 4.5 | 27 | 754 |

| r[mm] | LOWER LIMIT FREQUENCY [Hz] | UPPER LIMIT FREQUENCY [Hz] |
|---|---|---|
| 0.9 | 81 | 910 |
| 1.0 | 59 | 742 |
| 1.1 | 43 | 616 |

| α [mm-1] | LOWER LIMIT FREQUENCY [Hz] | UPPER LIMIT FREQUENCY [Hz] |
|---|---|---|
| 0.9 | 93 | 477 |
| 1.2 | 64 | 500 |
| 1.6 | 48 | 511 |
| 2.2 | 33 | 519 |
| 3.2 | 22 | 524 |

| r[mm] | LOWER LIMIT FREQUENCY [Hz] | UPPER LIMIT FREQUENCY [Hz] |
|---|---|---|
| 1.1 | 63 | 604 |
| 1.2 | 48 | 511 |
| 1.3 | 37 | 437 |

FIG. 60

| | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| WIRE TYPE | PURE Al | PURE Al | 5%CCA | 5%CCA | 5%CCA | 10% CCA | 15% CCA | 5%CCA (Al ALLOY) | 5%CCA (Al ALLOY) | 5%CCA (Al ALLOY) | BRASS | BRASS | BRASS | SILICON BRONZE | PHOSPHOR BRONZE |
| WIRE DIAMETER (mm) | 1.8 | 0.4 | 0.9 | 0.4 | 0.3 | 0.2 | 0.4 | 0.6 | 0.4 | 0.2 | 0.6 | 0.4 | 0.2 | 0.4 | 0.4 |
| REFERENCE DC RESISTANCE (mΩ/cm) | 0.11 | 2.25 | 0.43 | 2.18 | 3.88 | 8.47 | 2.06 | 1.03 | 2.32 | 9.28 | 2.22 | 5.01 | 20 | 1.99 | 4.78 |
| SECOND FREQUENCY (KHz) | 22 | 410 | 82 | 410 | 730 | 1530 | 370 | 157 | 385 | 1540 | 271 | 611 | 2445 | 385 | 596 |

| | COPPER WINDING WIRE Φ0.6mm | BRASS WINDING WIRE Φ0.2mm |
|---|---|---|
| LOSS (W) | 14.5 | 5.3 |

| | VOLUME RESISTIVITY ($\mu \Omega$-cm) |
|---|---|
| COPPER | 1.724 |
| PURE ALUMINUM | 2.826 |
| BRASS | 5~7 |
| SILICON BRONZE | 2.5~4.3 |
| PHOSPHOR BRONZE | 6.0~6.5 |

US 8,723,387 B2

ELECTRIC WIRE, COIL, DEVICE FOR DESIGNING ELECTRIC WIRE, AND ELECTRIC MOTOR

CROSS-REFERENCE TO RELATED APPLICATIONS

This application is a Divisional of U.S. patent application Ser. No. 13/770,445, filed on Feb. 19, 2013, which is a Continuation of PCT Application No. PCT/JP2011/066563, filed on Jul. 21, 2011, and claims the benefit of priority from the prior Japanese Patent Applications No. 2010-185638, filed on Aug. 20, 2010, No. 2010-185637, filed on Aug. 20, 2010, No. 2010-185636, filed on Aug. 20, 2010, No. 2010-185635, filed on Aug. 20, 2010, No. 2010-209651, filed on Sep. 17, 2010 and No. 2010-283809, filed on Dec. 20, 2010, the entire contents of which are incorporated herein by reference.

BACKGROUND OF THE INVENTION

The present invention relates to an electric wire, a coil, an apparatus for designing the electric wire, and an electric motor.

In winding wires and power cables of devices to which high-frequency current is applied (transformers, motors, reactors, induction heaters, magnetic head devices, and the like), the magnetic field generated by the high-frequency current causes an eddy current loss within a conductor, and the AC resistance (high-frequency resistance) is therefore increased (or the skin effect and the proximity effect are increased). This causes heat generation and increases power consumption. Countermeasures to prevent the increases in the skin effect and proximity effect include, generally, reducing the diameter of wires and employing litz wires including strands individually coated and insulated (see Japanese Patent Laid-open Publication No. 2009-129550, Japanese Patent Laid-open Publication No. S62-76216, Japanese Patent Laid-open Publication No. 2005-108654, International Publication No. 2006/046358 and Japanese Patent Laid-open Publication No. 2002-150633, for example).

As one of electric wires used for winding wires and the like, for example, copper-clad aluminum wire (hereinafter, referred to as CCA wire) is known. The CCA wire includes aluminum wire (hereinafter, referred to as Al wire) whose surface is covered with a thin copper layer. However, in a particular frequency range in which high-frequency wire is used, it is difficult to make the AC resistance of the high-frequency wire definitely lower than that of copper wire (hereinafter, referred to as Cu wire) having a same diameter as that of the high-frequency wire.

SUMMARY

In the light of the aforementioned problem, an object of the present invention is to provide an electric wire, a coil, a apparatus for designing an electric wire, and an electric motor in which the AC resistance of the electric wire can be reduced by making the eddy current loss equal to or less than that of reference Cu wire.

According to an aspect of the present invention, an electric wire is provided, including: a conductive portion made of a material having a volume resistivity higher than that of copper, in which the volume resistivity of the conductive portion is specified so that, in a frequency range in which the electric wire is used, a ratio of AC resistance of the conductive portion to AC resistance of reference copper wire is less than 1.

In the aspect of the present invention, the reference copper wire may have a same diameter as the conductive portion.

In the aspect of the present invention, a DC resistance value of the conductive portion per unit length may be specified so that among a first frequency and a second frequency higher than the first frequency, the second frequency is not less than the upper limit of the frequency range in which the electric wire is used, the first and second frequencies being frequencies at which the AC resistance of the electric wire is equal to that of the reference copper wire and between which the AC resistance of the electric wire is lower than that of the reference copper wire.

In the aspect of the present invention, the DC resistance value may be specified by a relationship of $$0.7 \times 10^{(0.925 \times \log_{10} R_{dc} + 2.24)} \le f_2 \le 1.3 \times 10^{(0.925 \times \log_{10} R_{dc} + 2.24)}$$

where $R_{dc}$ is the DC resistance value and $f_2$ is the second frequency.

In the aspect of the present invention, the conductive portion may be made of any one of copper-clad aluminum and an copper alloy selected from brass, phosphor bronze, silicon bronze, copper-beryllium alloy, and copper-nickel-silicon alloy.

In the aspect of the present invention, the frequency range in which the electric wire is used may include a fundamental frequency to 20th order harmonic frequencies.

In the aspect of the present invention, the frequency range in which the electric wire is used may be 10 kHz to 1 MHz.

According to another aspect of the present invention, a coil is provided, including an electric wire as a strand, in which the electric wire includes a conductive portion made of a material having a higher volume resistivity than copper, and the volume resistivity of the conductive portion is specified so that, in a frequency range in which the electric wire is used, a ratio of AC resistance of the conductive portion to AC resistance of reference copper wire is less than 1.

In the another aspect of the present invention, the reference copper wire may have a same diameter as the conductive portion.

In the another aspect of the present invention, a DC resistance value of the conductive portion per unit length maybe specified so that among a first frequency and a second frequency higher than the first frequency, the second frequency is not less than the upper limit of the frequency range in which the electric wire is used, the first and second frequencies being frequencies at which the AC resistance of the electric wire is equal to that of the reference copper wire and between which the AC resistance of the electric wire is lower than that of the reference copper wire.

In the another aspect of the present invention, the DC resistance value may be specified by a relationship of $$0.7 \times 10^{(0.925 \times \log_{10} R_{dc} + 2.24)} \le f_2 \le 1.3 \times 10^{(0.925 \times \log_{10} R_{dc} + 2.24)}$$

where $R_{dc}$ is the DC resistance value and $f_2$ is the second frequency.

In the another aspect of the present invention, the conductive portion may be made of any one of copper-clad aluminum and an copper alloy selected from brass, phosphor bronze, silicon bronze, copper-beryllium alloy, and copper-nickel-silicon alloy.

In the another aspect of the present invention, the frequency range in which the electric wire is used may include a fundamental frequency to 20th order harmonic frequencies.

In the another aspect of the present invention, the frequency range in which the electric wire is used may be 10 kHz to 1 MHz.

According to still another aspect of the present invention, an apparatus of designing an electric wire made of a material having a higher volume resistivity than that of copper is provided, the apparatus including: a resistance calculation unit calculating AC resistance of a conductive portion as a candidate for the electric wire and AC resistance of reference copper wire in a frequency range in which the electric wire is used; a ratio calculation unit calculating a ratio of AC resistance due to a proximity effect of the conductive portion to AC resistance due to the proximity effect of the reference copper wire; and a determination unit determining that the candidate is applicable to the electric wire if the ratio is less than 1.

According to still another aspect of the present invention, an electric motor is provided, including: a plurality of iron cores arranged on a circle; a plurality of coils wound with an electric wire on the plurality of iron cores, the electric wire including a central conductor made of aluminum or aluminum alloy and a cover layer made of copper covering the central conductor; and a rotor rotated by the plurality of coils to which alternating-current is applied, in which the frequency of alternating current applied to the coils is controlled by an inverter method to fall between a first frequency and a second frequency higher than the first frequency, the first and second frequencies being frequencies at which the AC resistance of the coil is lower than that of a coil wound with the reference copper wire.

BRIEF DESCRIPTION OF THE DRAWINGS

FIG. 15 is a table showing calculation results of the ratio of the AC resistance of various materials to that of the Cu wire in the first embodiment of the present invention.

FIG. 21 is a graph for explaining the fundamental frequency and harmonic components.

FIG. 22 is a table showing losses of CCA and copper winding wires.

FIG. 60 is a table showing the reference DC resistance and second frequency which are measured by varying the material and diameter of the electric wire.

DETAILED DESCRIPTION OF THE EMBODIMENT OF THE INVENTION

Figure 1A:
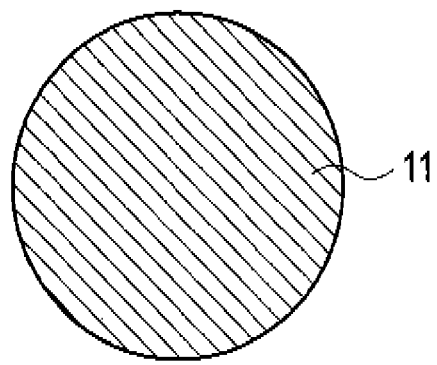
FIG. 1A is a cross-sectional view showing an example of an electric wire according to a first embodiment of the present invention.

Next, with reference to the drawings, a description is given of embodiments of the present invention. In the following description of the drawings, same or similar parts are given same or similar reference numerals. However, it should be noted that the drawings are schematic and that the relationship between thickness and planar dimensions, the proportion of thicknesses of layers, and the like are different from real ones. Accordingly, specific thicknesses and dimensions should be determined with reference to the following description. It is certain that some portions have different dimensional relations and proportions between the drawings.

The following embodiments show devices and methods to embody the technical idea of the invention by way of example. The technical ideas of the invention do not specify the materials, shapes, structures, arrangements, and the like of the constituent components to those described below. The technical idea of the invention can be variously changed within the scope of claims.

(First Embodiment)
<Electric Wire Structure>

As shown in FIG. 1A, an electric wire according to a first embodiment of the present invention is an electric wire used in a particular frequency range and includes a conductive portion 11 made of a material having a higher volume resistivity than that of copper. In the electric wire according to the first embodiment of the present invention, the volume resistivity of the conductive portion 11 is specified so that the ratio of the AC resistance due to the proximity effect of the conductive portion 11 to that of a reference Cu wire is less than 1 in the particular frequency range.

Herein, the particular frequency range refers to a frequency range specified (set) as a frequency range in which the electric wire (product) of interest is used. The upper and lower limits and range of the particular frequency range are properly set according to the specifications of each product and are not particularly limited. The particular frequency range may be about several kHz to 100 kHz or about 10 kHz to 1 MHz. In the case of IH cookers, the particular frequency range may be about 20 kHz to 60 kHz. In the case of products directly using the commercial power frequencies of Japan, the United States, or Europe, the particular frequency range may be about 50 Hz to 60 Hz. Moreover, the "reference Cu wire" is previously specified (set) and may have a same diameter as that of the conductive portion 11 or may have a different diameter from the same.

The diameter of the conductive portion 11 is desirably about 0.05 to 0.6 mm but is not particularly limited. The material of the conductive portion 11 can be copper alloy including brass, phosphor bronze, silicon bronze, copper-beryllium alloy, and copper-nickel-silicon alloy. The brass is an alloy (Ch—Zn) containing copper (Cu) and zinc (Zn) and may contain small amounts of elements other than copper and zinc. The silicon bronze is an alloy (Cu—Sn—Si) containing copper, tin (Sn) and silicon (Si) and may contain small amounts of elements other than copper, tin, and silicon. The phosphor bronze is an alloy (Cu—Sn—P) containing copper, tin, and phosphor (P) and may contain small amounts of elements other than copper, tin, and phosphor.

These copper alloy wires are subjected to annealing, for example, and may be plated with tin, copper, chrome (Cr), or the like. Moreover, the conductive portion 11 may have various shapes including a cylinder and a rectangle.

Figure 1B:
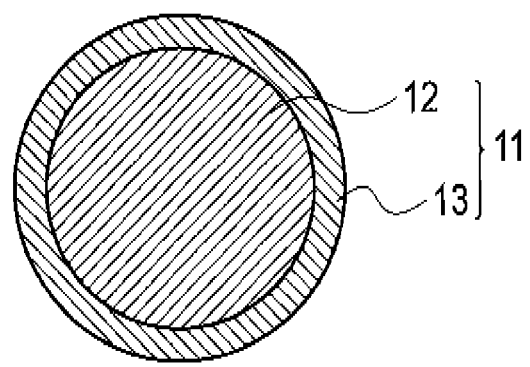
FIG. 1B is another example of the electric wire according to the first embodiment of the present invention.

Moreover, as shown in FIG. 1B, the electric wire according to the first embodiment of the present invention may be CCA wire including, as the conductive portion 11, a central conductor 12 made of aluminum (Al) or aluminum alloy and a cover layer 13 made of copper (Cu) covering the central conductor 12.

The diameter of the entire CCA wire is desirably about 0.05 mm to 0.6 mm. The cross-sectional area of the cover layer 13 is not more than 15% of the cross-sectional area of the entire electric wire composed of the central conductor 12 and cover layer 13, desirably about 3% to about 15%, more preferably about 3% to about 10%, and still more preferably about 3% to about 5%. The lower the ratio of the cross-sectional area of the cover layer 13 to that of the entire electric wire, the lower the AC resistance. The central conductor 12 can be made of electrical aluminum (EC aluminum) or aluminum alloy such as Al—Mg—Si alloy (JIS60008), for example. The aluminum alloy is more desirable than the EC aluminum because the volume resistivity of the aluminum alloy is higher than that of the EC aluminum.

The winding wires of normal transformers, reactors, and the like are composed of Cu wire coated and insulated with polyurethane, polyester, polyesterimide, polyamide-imide, or polyimide. As for coaxial cables, since high-frequency current signals flow therethrough, coaxial cables are therefore composed of CCA wire, for example, in the light of the skin effect characteristics.

Figure 2:
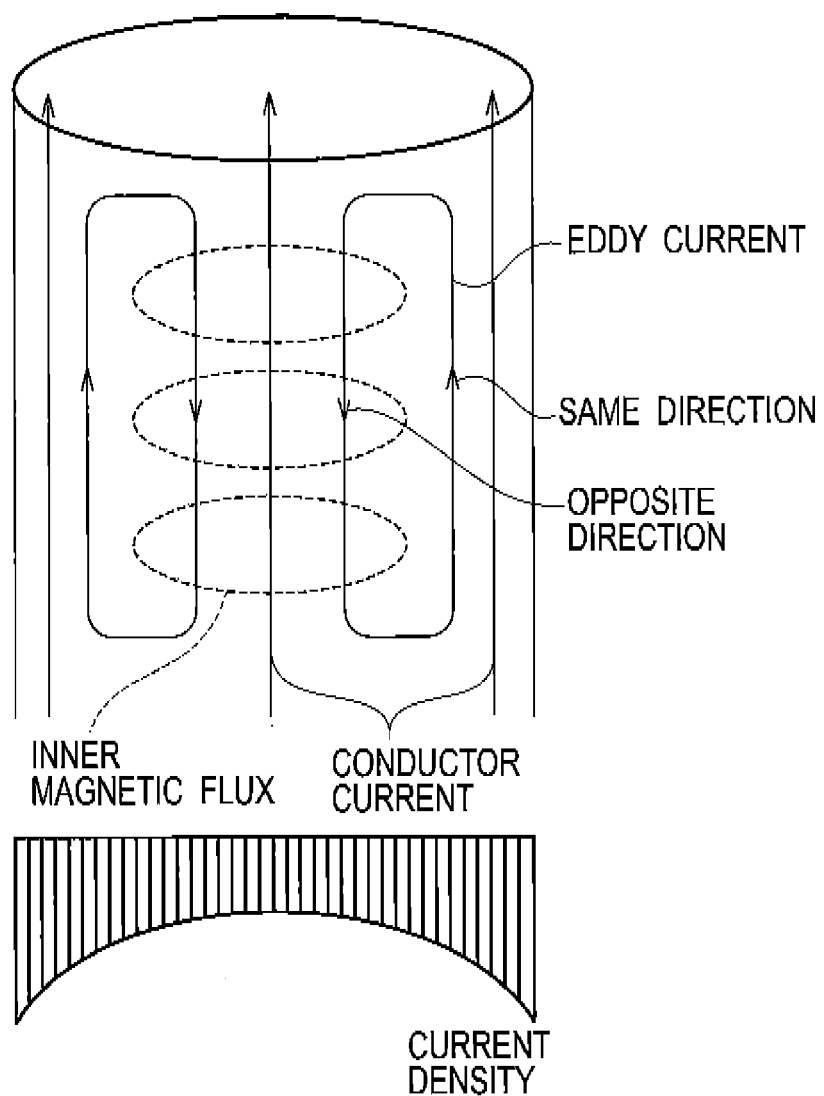
FIG. 2 is a schematic view for explaining the skin effect according to the first embodiment of the present invention.
Figure 3:
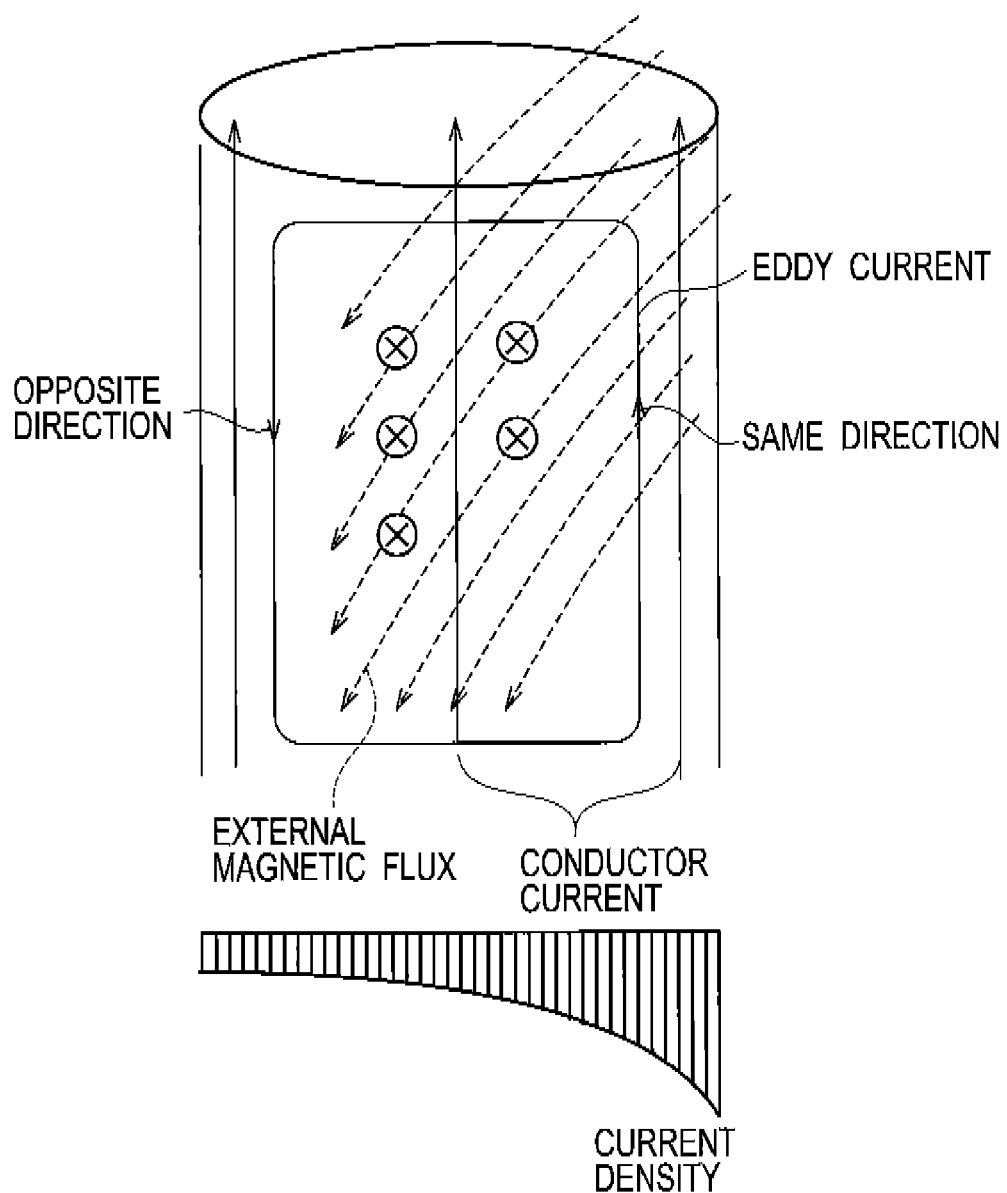
FIG. 3 is a schematic view for explaining the proximity effect according to the first embodiment of the present invention.
Figure 4:
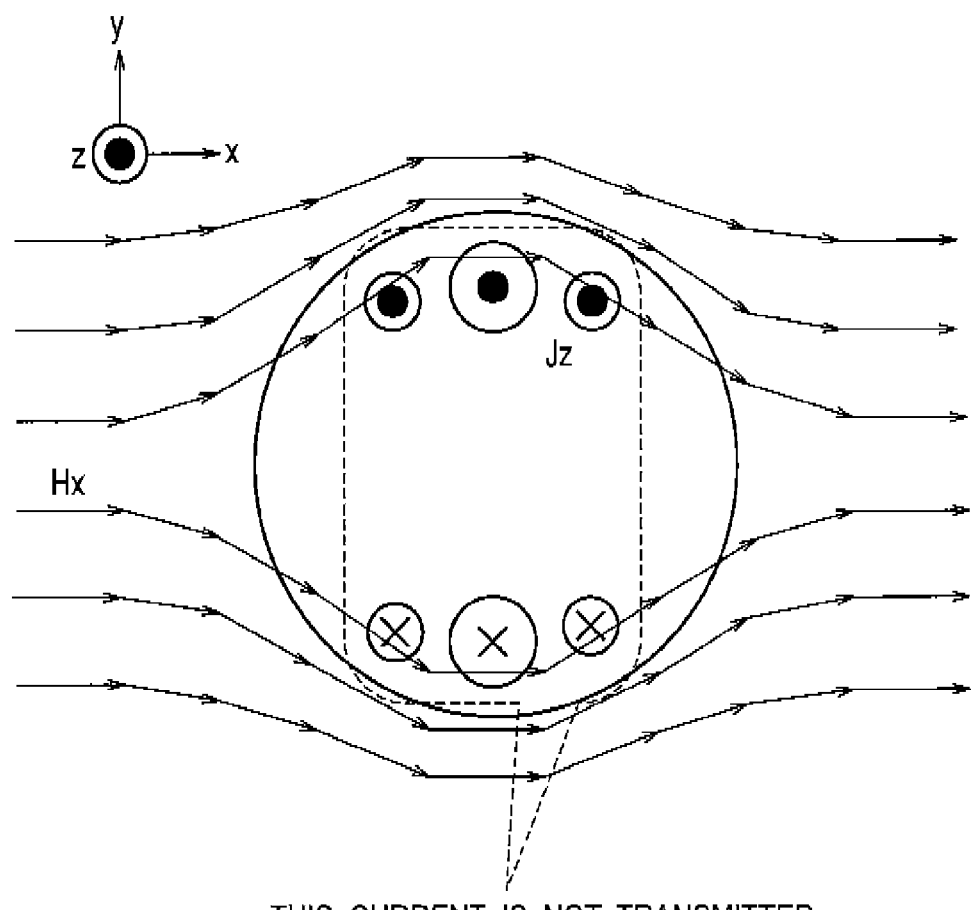
FIG. 4 is another schematic view for explaining the proximity effect according to the first embodiment of the present invention.

As shown in FIG. 2, with regard to a conductor, eddy currents are generated within the conductor by magnetic flux. The generated eddy currents increase the AC resistance as the skin effect. Moreover, as shown in FIGS. 3 and 4, eddy currents are generated within the conductor by external magnetic flux, and the generated eddy currents increase the AC resistance as the proximity effect.

The AC resistance $R_{ac}$ is expressed by the following equation (1) where $R_{dc}$ is a DC resistance component, $R_s$ is an AC resistance due to the skin effect, and $R_p$ is an AC resistance (proximity effect component) due to the proximity effect.

[Equation 1]

$$R_{ac} = (1 + k_s)R_{dc} + R_p \qquad (1)$$
$$= R_s + R_p$$

Herein, $K_s$ is a skin effect coefficient.

Figure 5:
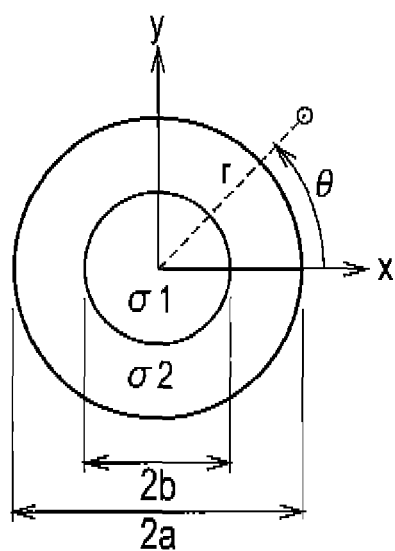
FIG. 5 is a cross-sectional view of a conductive wire of a double-layer structure.

First, a description, is given of an example of the method of calculating the AC resistance $R_s$ due to the skin effect in the first embodiment of the present invention. As shown in FIG. 5, the consideration is given to a cylindrical conducting wire having a double-layer structure and being distributed uniformly in a direction z. It is assumed that the conductivities of the inner and outer layers of the conducting wire are $\sigma_1$ and $\sigma_2$, respectively, and that current flows through the conducting wire in the direction z.

In the following formulation, each magnetic field is given by complex representation, and the time factor is indicated by $e^{j\omega t}$. Herein, $\omega$ is an angular frequency.

The flowing current generates a z-direction component Ez of an electric field, which satisfies the following wave equation (2).

[Equation 1]

$$\frac{\partial^2 E_z}{\partial r^2} + \frac{1}{r}\frac{\partial E_z}{\partial r} - j\omega\mu_0\sigma E_z = 0 \qquad (2)$$

Herein, $\mu_0$ indicates a magnetic permeability in vacuum. A magnetic field $H_\theta$ has only a $\theta$-direction component and is given as follows.

[Equation 2]

$$H_\theta = \frac{1}{j\omega\mu_0}\frac{\partial E_z}{\partial r} \qquad (3)$$

Herein, if
[Equation 3]

$$k_1^2 = -j\omega\mu_0\sigma_1 \qquad (4)$$

$$k_2^2 = -j\omega\mu_0\sigma_2 \qquad (5)$$

then, the solution of the wave equation (2) can be as follows.
[Equation 4]

$$E_{z1} = AJ_0(k_1 r), (r < b) \qquad (6)$$

$$E_{z2} = BJ_0(k_2 r) + CM_0(k_2 r), r \leq r \leq a \qquad (7)$$

$J_\nu(z)$ is a Bessel function of the first kind.

$$M_\nu(z) \equiv \tfrac{1}{2}\pi j H_\nu^{(1)}(z)$$

$H_\nu^{(1)}$ is a Hankel function of the first kind.

Under the boundary condition where $E_z$ and $H_\theta$ are continuous at r=b.

[Equation 5]

$$B = B_1 A \qquad (8)$$

$$C = C_1 A \qquad (9)$$

[Equation 6]

$$B_1 = \frac{J_0(k_1 b)M_0'(k_2 b) - \frac{k_1}{k_2}J_0'(k_1 b)M_0(k_2 b)}{J_0(k_2 b)M_0'(k_2 b) - J_0'(k_2 b)M_0(k_2 b)} \qquad (10)$$

$$C_1 = \frac{\frac{k_1}{k_2}J_0'(k_1 b)J_0(k_2 b) - J_0(k_1 b)J_0'(k_2 b)}{J_0(k_2 b)M_0'(k_2 b) - J_0'(k_2 b)M_0(k_2 b)} \qquad (11)$$

Herein, $$J_0'(x) = dJ_0(x)/dx$$

$$M_0'(x) = dM_0(x)/dx$$

From the equation (3), the following equation (12) is obtained.

[Equation 7]

$$H_\theta = \frac{k_2}{j\omega\mu_0}[BJ_0'(k_2 r) + CM_0'(k_2 r)], (b \leq r \leq a) \qquad (12)$$

Total current I flowing through the conducting wire is obtained according to the Ampere's rule as follows.

[Equation 8]

$$I = \oint H_\theta|_{r=a} dl = 2\pi a H_\theta|_{r=a} \qquad (13)$$

$$= \frac{2\pi a k_2}{j\omega\mu_0}[BJ_0'(k_2 a) + CM_0'(k_2 a)]$$

Herein, $\oint$ represents line integral along the outer circumference of the conducting wire. By substituting the equations (8) and (9) into the equation (13), the following equation (14) is obtained.

[Equation 9]

$$A = \frac{j\omega\mu_0}{2\pi k_2 a} \cdot \frac{I}{B_1 J_0'(k_2 a) + C_1 M_0'(k_2 a)} \qquad (14)$$

Figure 6:
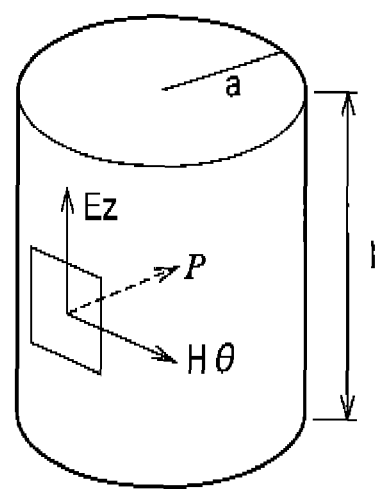
FIG. 6 is a schematic view showing an electromagnetic field in the surface of the conductive wire through which electric current flows.

On the other hand, the power flow into the conducting wire shown in FIG. 6 is calculated from the Poynting vector as shown in the following equation (15).

[Equation 10]

$$\bar{P}_S = -\oint \bar{P} \cdot dS = -\frac{1}{2}\oint E \times H^* \cdot dS = \\ -\frac{1}{2}\oint (-a_r)(E_2 H_\theta^*)\big|_{r=a} \cdot a_r dS = \pi a \cdot l \cdot (E_2 H_\theta^*)\big|_{r=a} \quad (15)$$

Herein, $\oint$ represents surface integral over the cylindrical surface of the conducting wire in FIG. 6. dS represents a surface element vector in the normal direction. P is the Poynting vector, and a, is a unit vector in a direction r.

By substituting the equations (7) and (12) into the equation (15), the following equation (16) is obtained.

[Equation 11]

$$\bar{P}_s = \frac{j\omega\mu_0 l |I|^2}{4\pi k_2 a} \cdot \frac{B_1 J_0(k_2 a) + C_1 M_0(k_2 a)}{B_1 J_0'(k_2 a) + C_1 M_0'(k_2 a)} \quad (16)$$

Herein, $$\bar{P}_s = \frac{1}{2}(R + j\omega L)|I|^2$$

Accordingly, the following equation (17) is obtained.

[Equation 12]

$$R + j\omega L = \frac{j\omega\mu_0 l}{2\pi k_2 a} \cdot \frac{B_1 J_0(k_2 a) + C_1 M_0(k_2 a)}{B_1 J_0'(k_2 a) + C_1 M_0'(k_2 a)} \quad (17)$$

The AC resistance per unit length due to the skin effect is therefore given as follows.

[Equation 13]

$$R_s = \Re\left[\frac{j\omega\mu_0}{2\pi k_2 a} \cdot \frac{B_1 J_0(k_2 a) + C_1 M_0(k_2 a)}{B_1 J_0'(k_2 a) + C_1 M_0'(k_2 a)}\right] \quad (18)$$

Herein, $\Re$ represents a real part and indicates a DC resistance $R_{dc}$ when the frequency is 0.

When the conducting wire has a single-layer structure, from $\sigma_1 = \sigma_2$, the equations (10) and (11),
[Equation 14]

$$B_1 = 1 \quad (19)$$

$$C_1 = 0 \quad (20)$$

The equation (18) becomes:

[Equation 15]

$$R_s = \Re\left[\frac{j\omega\mu_0}{2\pi k_2 a} \cdot \frac{J_0(k_2 a)}{J_0'(k_2 a)}\right] \quad (21)$$

Figure 7:
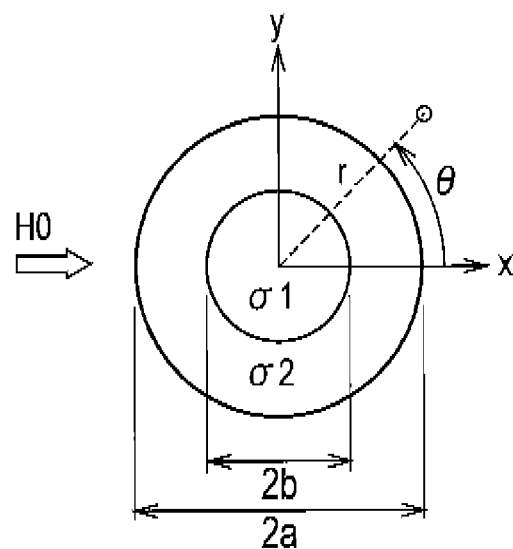
FIG. 7 is a cross-sectional view of the conductive wire of the double-layer structure when an external magnetic field is applied thereto.

Next, a description is given of an example of the method of calculating the proximity effect component $R_p$ in the first embodiment of the present invention. As shown in FIG. 7, it is assumed that a high-frequency magnetic field $H_e$ in the direction x is applied to the outside of the conducting wire as follows. Herein, $a_x$ is a unit vector in the direction x.

[Equation 16]

$$H_e = a_x H_0 \quad (22)$$

Herein, if the magnetic potential satisfying $H = \nabla \times A$ is introduced,
[Equation 17]

$$A = a_z A_z(r, \theta) \quad (23)$$

then, the following external potential
[Equation 18]

$$A_{ze} = H_0 r \sin\theta \quad (24)$$

gives a magnetic field expressed by the equation (22).

The magnetic potential satisfies the following wave equation (25).

[Equation 19]

$$\frac{\partial^2 A_z}{\partial r^2} + \frac{1}{r}\frac{\partial A_z}{\partial r} + \frac{1}{r^2}\frac{\partial^2 A_z}{\partial \theta^2} - j\omega\mu_0\sigma A_z = 0 \quad (25)$$

Herein, $\mu_0$ is a magnetic permeability in vacuum.

The solution of the equation (25) can be provided as follows.

[Equation 20]

$$A_{z1} = D J_1(k_1 r)\sin\theta, \, (r < b) \quad (26)$$

$$A_{z2} = [E J_1(k_2 r) + F M_1(k_2 r)]\sin\theta, \, (b \leq r \leq a) \quad (27)$$

$$A_{z3} = \left(G r + \frac{H}{r}\right)\sin\theta, \, (a < r) \quad (28)$$

From the boundary condition where the tangent component ($H_\theta$) of the magnetic field and the normal component ($\mu_0 H r$) of the magnetic flux density are continuous at each boundary,

[Equation 21]

$$D = \frac{2H_0}{k_2[E_1 J_0(k_2 a) + F_1 M_0(k_2 a)]} \quad (29)$$

$$E = E_1 D \quad (30)$$

$$F = F_1 D \quad (31)$$

$$G = H_0 \quad (32)$$

$$H = a^2 H_0 \frac{E_1 J_2(k_2 a) + F_1 M_2(k_2 a)}{E_1 J_0(k_2 a) + F_1 M_0(k_2 a)} \quad (33)$$

Herein,

[Equation 22]

$$E_1 = \frac{J_1(k_1 b)M_1'(k_2 b) - \frac{k_1}{k_2}J_1'(k_1 b)M_1(k_2 b)}{J_1(k_2 b)M_1'(k_2 b) - J_1'(k_2 b)M_1(k_2 b)} \quad (34)$$

-continued $$F_1 = \frac{\frac{k_1}{k_2}J_1'(k_1b)J_1(k_2b) - J_1(k_1b)J_1'(k_2b)}{J_1(k_2b)M_1'(k_2b) - J_1'(k_2b)M_1(k_2b)} \quad (35)$$

Herein, $$J_1'(x)=dJ_1(x)/dx$$

and $$M_1'(x)=dM_1(x)/dx$$

The magnetic field $H_\theta$ is obtained as follows.
[Equation 23]

$$H_\theta = -k_2[EJ_1'(k_2r)+FM_1'(k_2r)] \sin\theta, (b \le r \le a) \quad (36)$$

Moreover, the electric field $E_z$ is obtained as follows.

[Equation 24]

$$E_z = \frac{k_2^2}{\sigma_2}[EJ_1(k_2r) + FM_1(k_2r)]\sin\theta, (b \le r \le a) \quad (37)$$

Figure 8:
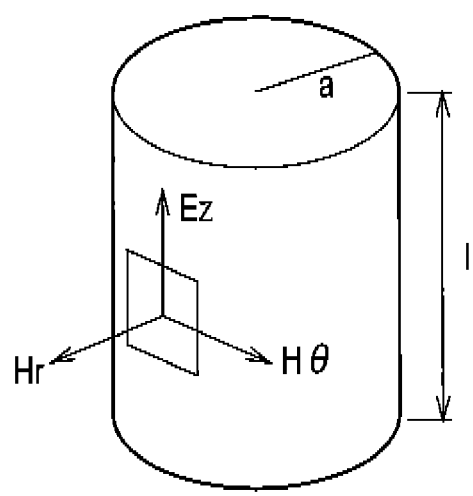
FIG. 8 is a schematic view showing an electromagnetic field in the surface of the conductive wire when the external magnetic field is applied thereto.

The power flow penetrating from the surface of the conducting wire to the inside thereof, which is shown in FIG. 8, is calculated as the following equation (38).
[Equation 25]

$$\overline{P}_p = -\oint P \cdot dS = \frac{1}{2}a\int_0^{2\pi}E_zH_\theta^*|_{r=a}d\theta \quad (38)$$

Herein, P represents the Poynting vector, and $\oint$ represents surface integral over the surface of the conducting wire in FIG. 8.
By substituting the equations (36) and (37) into the equation (38), the following equation (39) is obtained.

[Equation 26]

$$\overline{P}_p = -\frac{2\pi lk_2a}{\sigma_2}\frac{TQ^*}{|R|^2}|H_0|^2 \quad (39)$$

[Equation 27]

$$T = E_1J_1(k_2a) + F_1M_1(k_2a) \quad (40)$$

$$Q = E_1J_1'(k_2a) + F_1M_1'(k_2a) \quad (41)$$

$$R = E_1J_0(k_2a) + F_1M_0(k_2a) \quad (42)$$

The loss $P_L$ of the conducting wire is calculated as follows.

[Equation 28]

$$P_L = \Re[\overline{P}_p] = -\frac{2\pi l}{\sigma_2}|H_0|^2\Re\left[k_2a\frac{TQ^*}{|R|^2}\right] \quad (43)$$

When the conducting wire has a single-layer structure, from $\sigma_1 = \sigma_2$, the equations (34) and (35),
[Equation 29]

$$E_1 = 1 \quad (44)$$

$$F_1 = 0 \quad (45)$$

The equation (43) becomes the following equation (46).

[Equation 30]

$$P_L = \Re[\overline{P}_p] = -\frac{2\pi l}{\sigma_2}|H_0|^2\Re\left[k_2a\frac{J_1(k_2a)J_1'^*(k_2a)}{|J_0(k_2a)|^2}\right] \quad (46)$$

When the coil or the like is wound with one conducting wire like a transformer, a reactor, or the like, the external magnetic field is formed by current flowing through the conducting wire. In that case, the strength $|H_0|$ of the external magnetic field is in proportional to the magnitude $|I|$ of the current as shown in the following equation (47).
[Equation 31]

$$|H_0|=\alpha|I| \quad (47)$$

Herein, $\alpha$ is a proportional coefficient and depends on how the conducting wire is wound. By substituting this into the equation (43), the resistance $R_p$ per unit length due to the proximity effect is given as follows.

[Equation 32]

$$R_p = \frac{2P_L}{|I|^2 l} = -\frac{4\pi}{\sigma_2}\alpha^2\Re\left[k_2a\frac{TQ^*}{|R|^2}\right] \quad (48)$$

Figures 9, 10:
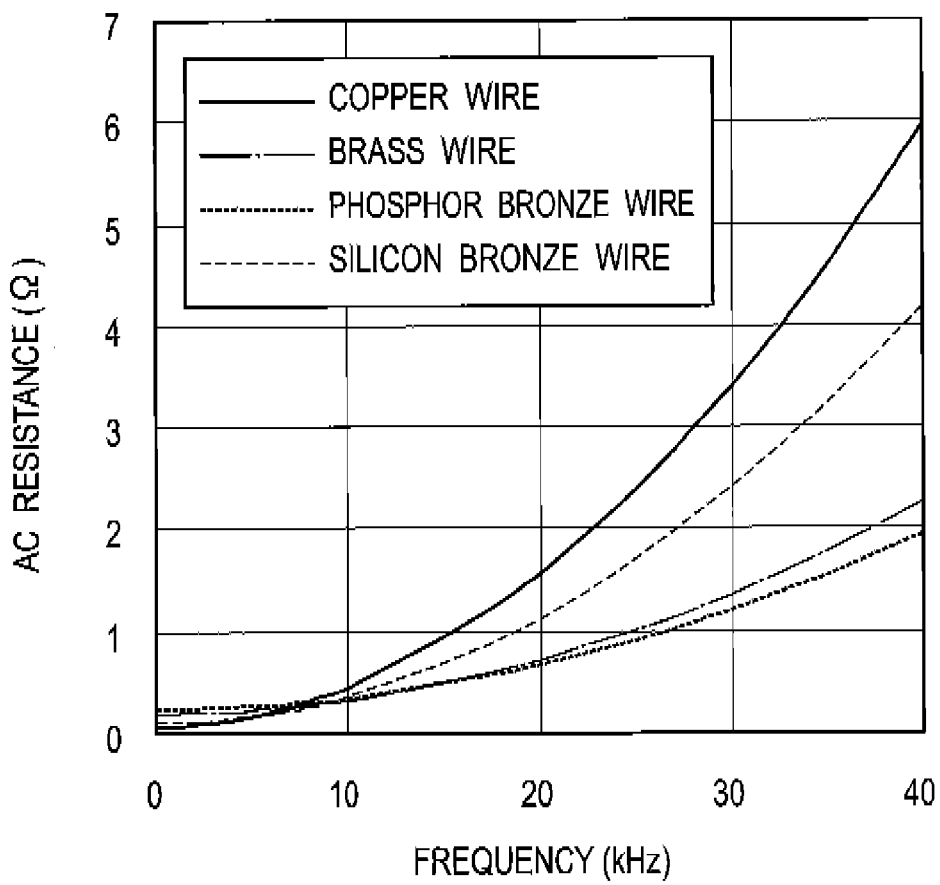
FIG. 9 is a graph illustrating the relationship between frequency and AC resistance of the electric wire according to the first embodiment of the present invention and a Cu wire according to a comparative example.
FIG. 10 is a table showing production conditions of magnetic field generating coils in which each strand is composed of the brass wire according to the first embodiment of the present invention or the Cu wire according to the comparative example.

As shown in FIG. 9, the AC resistance due to the proximity effect of the brass wire, phosphor bronze wire, silicon bronze wire according to the first embodiment of the present invention and the Cu wire according to the comparative example at an external magnetic strength H of 1 (A/mm) are calculated using the aforementioned equation (48). FIG. 9 reveals that the AC resistances of the brass wire, phosphor bronze wire, and silicon bronze wire are lower than that of the Cu wire in the predetermined frequency range.

Figures 11, 12:
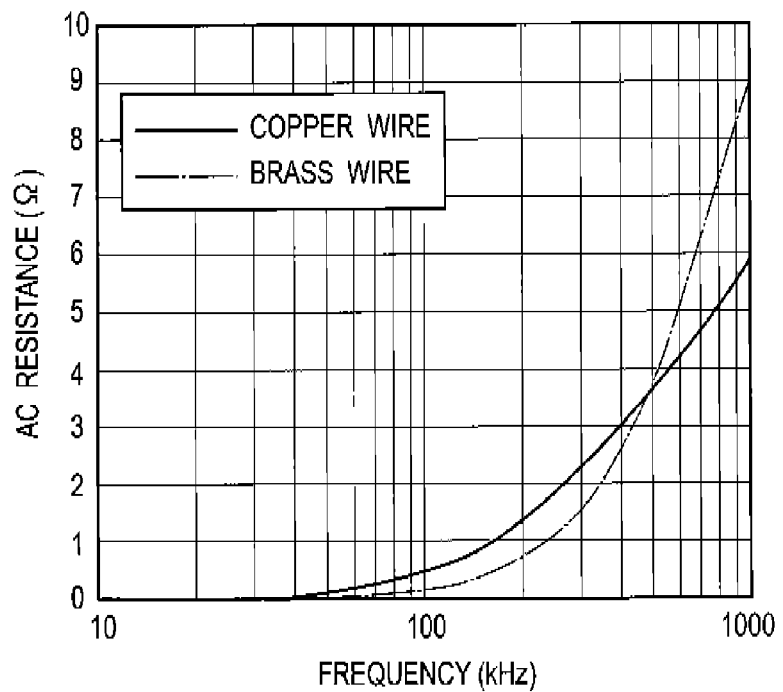
FIG. 11 is a graph illustrating the relationship between the frequency and AC resistance of the magnetic field generating coils in which each strand is composed of the brass wire according to the first embodiment of the present invention or the Cu wire according to the comparative example.
FIG. 12 is a table showing the relationship between the frequency and AC resistance of the magnetic field generating coils in which each strand is composed of the brass wire according to the first embodiment of the present invention or the Cu wire according to the comparative example.

As shown in FIG. 10, magnetic filed generating coils for an IH cooker were manufactured in such a manner that 55 strands (diameter: 0.4 mm, length: 6.6 m) in a litz wire construction are used to be wound in 17 turns. Each strand is composed of the brass wire according to the first embodiment of the present invention or Cu wire according to the comparative example. The manufactured magnetic field generating coils are subjected to characteristic confirmation tests. The test results are shown in FIGS. 11 and 12. IH cookers generally use high frequency current of about 20 kHz to 60 kHz. The test revealed that in a frequency range including about 20 kHz to 60 kHz, the AC resistance of the brass wire is lower than that of the Cu wire.

Figure 13:
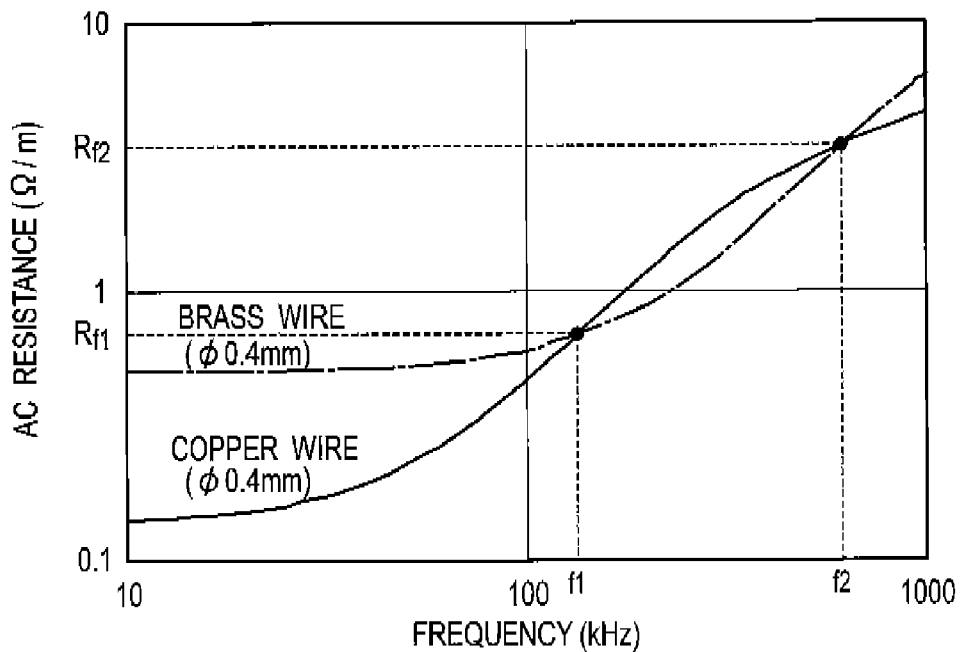
FIG. 13 is a graph illustrating the relationship between the frequency and AC resistance in the brass wire according to the first embodiment of the present invention and the Cu wire.

As shown in FIG. 13, the AC resistances of the brass wire and the Cu wire as the comparative example at an external magnetic field strength H of 1 A/mm are calculated using the aforementioned equations (1), (18), and (48), each wire having a diameter of 0.4 mm. FIG. 13 shows that the AC resistance of the brass wire is lower than that of the Cu wire having the same diameter as that of the brass wire in a frequency range specified between first and second frequencies f1 and f2. In other words, in the frequency range lower than the first frequency f1, the AC resistance of the brass wire is higher than that of the Cu wire. At the first frequency f1, the AC resistance of the brass wire equals to that of the Cu wire. In the frequency range higher than the first frequency f1, the eddy current loss is dominant, and the relative magnitudes of the AC resistances of the brass wire and the Cu wire are therefore reversed. In the frequency range between the first frequency f1 and second frequency f2, the AC resistance of the Cu wire is higher than that of the brass wire. At the second frequency f2, the AC resistance of the brass wire equals to that of the Cu wire again. In the frequency range higher than the second frequency f2, the proximity effect of the brass wire has a greater influence than that of the Cu wire has, and the relative magnitudes of the AC resistances of the brass wire and Cu wire are therefore reversed.

Figure 14:
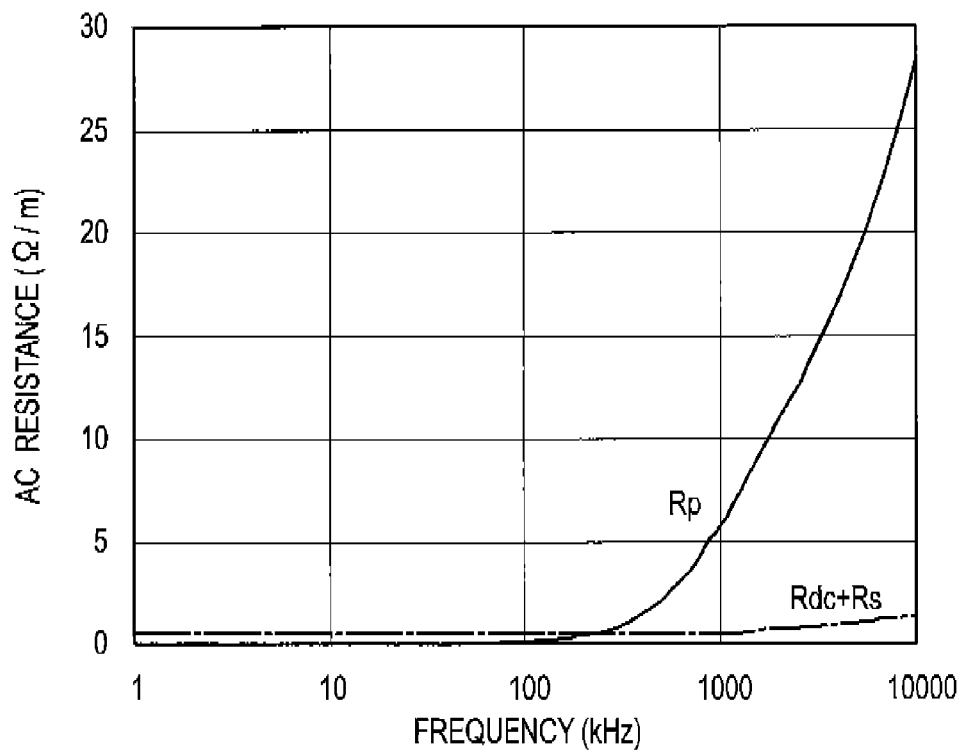
FIG. 14 is a graph illustrating the relationship between the frequency and AC resistance in the proximity effect component and skin effect component according to the first embodiment of the present invention.

FIG. 14 shows calculation results of the sum of the skin effect component $R_s$ and DC resistance $R_{dc}$ and the proximity effect component $R_p$ of the brass wire having a diameter of 0.4 mm at an external magnetic field strength H of 1 A/mm. The DC resistance $R_{dc}$ is a value when the frequency is 0 in the equation (1). As shown in FIGS. 9 and 11 to 13, the brass wire and the like have AC resistances lower than that of the Cu wire in a predetermined frequency range although the brass wire and the like have high volume resistivities than that of cupper. The reason why the above phenomenon occurs is because the AC resistance highly depends on the proximity effect as shown in FIG. 14 and there is a frequency range in which the higher the voltage resistivity, the smaller the proximity effect.

FIG. 15 shows the results of calculation of the ratio (Rp ratio) of the AC resistance due to the proximity effect of conductor materials to that of the reference Cu wire at an external magnetic field strength H of 1 A/mm with a current frequency of 100 kHz using the aforementioned equation (48). In FIG. 15, the conductor materials used in the above calculation are: copper wire (Cu wire) in which the conductive portion 11 shown in FIG. 1A is made of pure aluminum; 5% CCA wire in which the central conductor 12 shown in FIG. 1B is made of aluminum and the cross-sectional area of the cover layer 13 is 5% of the cross-sectional area of the entire electric wire; 10% CCA wire in which the central conductor 12 shown in FIG. 1B is made of aluminum and the cross-sectional area of the cover layer 13 is 10% of the cross-sectional area of the entire electric wire; 15% CCA wire in which the central conductor 12 shown in FIG. 1B is made of aluminum and the cross-sectional area of the cover layer 13 is 15% of the cross-sectional area of the entire electric wire; 5% CCA wire (alloy Al) in which the central conductor 12 shown in FIG. 1B is made of aluminum alloy and the cross-sectional area of the cover layer 13 is 5% of the cross-sectional area of the entire electric wire; and wires in which the conductive portion 11 shown in FIG. 1A is made of brass, silicon bronze, and phosphor bronze. The volume resistivity of the CCA wires is an equivalent volume resistivity calculated by conversion using the ratio of the cross-sectional areas of the two layers. FIG. 15 reveals that there is a condition in which the $R_p$ ratio is less than 1 even if the wire has a larger diameter than the Cu wire in addition to the condition where the diameter of the wire is equal to that of the Cu wire.

The first embodiment of the present invention therefore focuses on this Rp ratio. Specifically, in the electric wire according to the first embodiment of the present invention, the volume resistivity of the conductive portion 11 is specified so that the ratio (Rp ratio) of the AC resistance due to the proximity effect of the conductive portion 11 shown in FIGS. 1A and 13 to that of the reference Cu wire is less than 1 in a particular frequency range in which the electric wire of interest is used. The diameter of the reference Cu wire may be equal to or different from that of the conductive portion 11 shown in FIGS. 1A and 1B and can be properly set.

With the electric wire according to the first embodiment of the present invention, when the electric wire is used in a particular frequency range, the AC resistance of the electric wire can be made equal to or lower than that of the reference Cu wire.

<Electric Wire Designing Apparatus>

Figure 16:
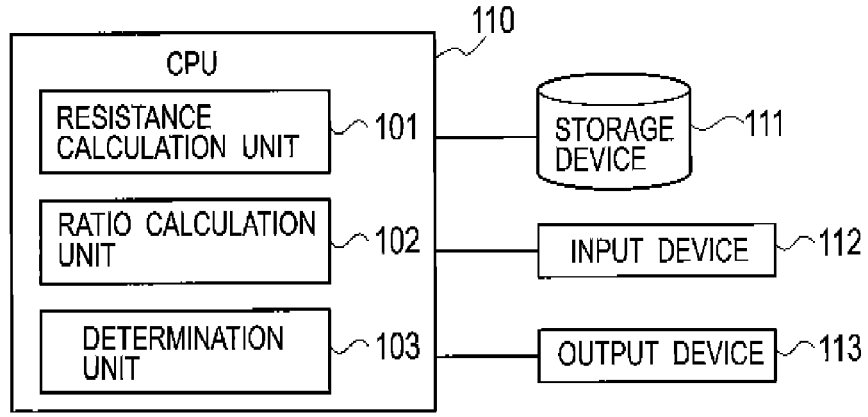
FIG. 16 is a schematic diagram illustrating an example of an apparatus for designing the electric wire according to the first embodiment of the present invention.

As shown in FIG. 16, an electric wire designing apparatus according to the first embodiment of the present invention includes a central processing unit (CPU) 110, a storage device 111, an input device 112, and an output device 113.

The CPU 110 logically includes a resistance calculation unit 101, a ratio calculation unit 102, and a determination unit 103 as modules (logical circuits) which are hardware sources.

The resistance calculation unit 101 reads from the storage device 111, wire type information including the material, shape, and diameter of the conductive portion 11 of candidates for electric wire which can be produced and the particular frequency range in which the electric wire is used. The resistance calculation unit 101 uses the aforementioned equation (48) to calculate values of AC resistance due to the proximity effect of the conductive portion 11 of the candidates for the electric wire in the particular frequency range. Moreover, the resistance calculation unit 101 reads from the storage device 111, the particular frequency range in which the electric wire of interest is used and the information concerning the reference Cu wire and uses the aforementioned equation (48) to calculate the value of AC resistance wire clue to the proximity effect of the reference Cu in the particular frequency range. The values of AC resistance of the conductive portion 11 and Cu wire may be calculated at plural frequencies in the particular frequency range or may be at least one frequency in the particular frequency range (for example, at the upper limit of the particular frequency range). Moreover, the diameter of the reference Cu wire may be equal to or different from that of the conductive portion 11 of the candidates and can be properly set.

The ratio calculation, unit 102 calculates, based on the values of AC resistance due to the proximity effect of the conductive portion 11 and Cu wire which are calculated by the resistance calculation unit 101, the ratio (Rp ratio) of the AC resistance values due to the proximity effect of the conductive portion 11 as the candidate to that of the Cu wire at a same frequency.

The determination unit 103 determines based on the Rp ratio calculated by the ratio calculation unit 102 whether the candidate is applicable to the electric wire. For example, the determination unit 103 determines whether the Rp ratio is less than 1. If the Rp ratio is determined to be less than 1, the determination unit 103 determines that the candidate is applicable to the electric wire.

The storage device 111 stores: information concerning the equation (48) for calculating the AC resistance due to the proximity effect; information of plural candidates for the conductive portion 11; the particular frequency range used by each device to which the electric wire is applied; the values of AC resistance due to the proximity effect of the conductive portion 11 and Cu wire which are calculated by the resistance calculation unit 101; the Rp ratio calculated by the ratio calculation unit 102; the determination results by the determination unit 103; and the like.

The storage device 111 can be a semiconductor memory, a magnetic disk, an optical disk, or the like, for example. The storage device 111 can be caused to function as a storage device or the like storing programs executed by the CPU 110 (the programs are described in detail). The storage device 111 can be caused to function as a temporary data memory which temporarily stores data used in the program execution process of the CPU 110 or is used as a work area.

The input device 112 can include a recognition device such as a touch panel, a keyboard, a mouse, or an OCR, an image input device such as a scanner or a camera, a voice input device such as a microphone, or the like, for example. The output device 113 can include a display device such as a liquid crystal device (LCD), an organic electroluminescence (EL) display, or a CRT display, a printing device such as an ink-jet printer, a laser printer, or the like.

<High-Frequency Electric Wire Manufacturing Method>

Figure 17:
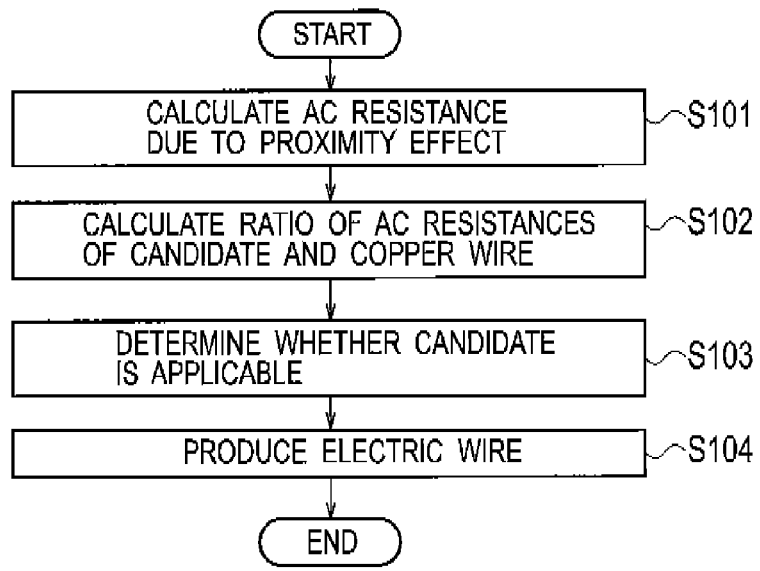
FIG. 17 is a flowchart for explaining examples of methods of designing and manufacturing the electric wire according to the first embodiment of the present invention.

Using a flowchart of FIG. 17, a description is given of an example of the method of manufacturing a high-frequency electric wire including the designing method using the electric wire designing apparatus according to the first embodiment of the present invention. Herein, the description is given of the method of manufacturing a CCA wire, but it is certain that the high-frequency electric wire is not limited to the same.

i) In step S101, the resistance calculation unit 101 reads from the storage device 111, information concerning the conductive portion 11 as a candidate for the electric wire and a particular frequency range in which the electric wire is used. The resistance calculation unit 101 uses the aforementioned equation (48) to calculate the value of AC resistance due to the proximity effect of the conductive portion 11 in the particular frequency range. Furthermore, the resistance calculation unit 101 uses the aforementioned equation (48) to calculate the value of AC resistance due to the proximity effect of the reference Cu wire. The calculated values of AC resistance of the conductive portion 11 and Cu wire are stored in the storage device 111. The values of AC resistance of the conductive portion 11 and Cu wire may be stored in the storage device 111 in advance or may be inputted from the input device 112. The values of AC resistance of the conductive portion 11 and Cu wire may be actually measured instead of being calculated using the theoretical formula.

ii) In step S102, based on the values of the AC resistance due to the proximity effect of the conductive portion 11 and Cu wire, which are calculated by the resistance calculation unit 101, the ratio calculation unit 102 calculates the ratio (Rp ratio) of the value of the AC resistance due to the proximity effect of the conductive portion 11 to that of the Cu wire.

iii) In step S103, the determination unit 103 determines whether the Rp ratio calculated by the ratio calculation unit 102 is less than 1. If the Rp ratio is less than 1 as a result, it is determined that the candidate is applicable to the electric wire. The determination result is stored in the storage device 111.

iv) In step S104, the electric wire is manufactured with the material, shape, diameter, and the like of the candidate which is determined by the determination unit 103 to be applicable. In the case of CCA wire, for example, the central conductor 12 which has a diameter of about 9.5 to 12.0 mm and is made of aluminum or aluminum alloy is prepared. The surface of the central conductor 12 is covered with the cover layer 13 by performing TIG welding, plasma welding, or the like with about 0.1 to 0.4 mm thick copper tape longitudinally attached to the surface of the central conductor 12. Next, the central conductor 12 covered with the cover layer 13 is subjected to skin pass rolling to have a diameter of about 9.3 to 12.3 mm, thus resulting in a base material composed of the central conductor 12 covered with the cover layer 13. Next, the base material is drawn through plural drawing dies (about 25 to 26 dies). By causing the base material to pass through the plural drawing dies, the final diameter of the electric wire is equal to the determined diameter.

According to the method of manufacturing a high-frequency electric wire including the designing method using the electric wire designing apparatus according to the first embodiment of the present invention, the wire type can be determined based on the Rp ratio calculated using the equation (48) for calculating the AC resistance due to the proximity effect. It is therefore possible to design the wire diameter of a high-frequency electric wire which has a smaller eddy current loss than that of the reference Cu wire and therefore has less AC resistance corresponding to the particular frequency range in which the high-frequency electric wire is used.

The manufacturing method shown in FIG. 17 may be performed by: in the step S102, calculating individual values of AC resistance due to the proximity effect for plural candidates; in the step S102, calculating the Rp ratio of each of the plural candidates; and in the step S103, determining whether each of the plural candidates is applicable. If some of the plural candidates are applicable, in the step S104, the wire type of one of the applicable candidates is properly selected.

<Electric Wire Designing Program>

The series of steps shown in FIG. 17, which includes: i) the step of individually calculating the AC resistance due to the proximity effect of the conductive portion 11, which is a candidate for the electric wire, in the particular frequency range and the AC resistance due to the proximity effect of the reference Cu wire in the particular frequency range; ii) the step of calculating the ratio of the AC resistance due to the proximity effect of the conductive portion to that of the reference Cu wire; iii) the step of determining based on the calculated ratio whether the candidate is applicable to the electric wire, can be executed by controlling the electric wire designing apparatus shown in FIG. 16 through a program having an algorithm equivalent to the method shown in FIG. 17.

This program can be stored in the storage device 111 of a computer system constituting the electric wire designing apparatus of the present invention. This program can be stored in a computer-readable recording medium. By loading this recording medium into the storage device 111 or the like, the series of steps of the first embodiment of the present invention can be executed.

Herein, the computer-readable recording medium refers to a medium or the like in which programs can be recorded, for example, such as a semiconductor memory, a magnetic disk, or an optical disk. For example, the body of the electric wire designing apparatus can be configured to incorporate or be externally connected to a device to read the recording medium. Furthermore, the programs in the recording medium can be stored in the recording device 111 via an information processing network such as a wireless communication network.

(Second Embodiment)

<Electric Wire Structure>

Figure 18:
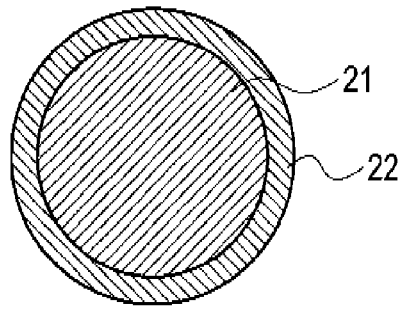
FIG. 18 is a cross-sectional view showing an example of an electric wire according to a second embodiment of the present invention.

An electric wire according to a second embodiment of the present invention is an electric wire used in a particular frequency range. As shown in FIG. 18, the electric wire is a CCA wire including a central conductor 21 made of aluminum (Al) or aluminum alloy and a cover layer 22 made of copper (Cu) covering the central conductor 21. As for the electric wire according to the second embodiment of the present invention, the particular frequency range falls within a frequency range which is specified between the first and second frequencies at which the AC resistance of the electric wire is equal to that of a Cu wire having the same diameter as that of the electric wire and in which the AC resistance of the electric wire is smaller than that of the Cu wire.

The diameter of the entire electric wire is desirably about 0.05 mm to 0.6 mm. The cross-sectional area of the cover layer 22 is not more than 15% of that of the whole electric wire including the central conductor 21 and cover layer 22, desirably about 3% to about 15%, more preferably about 3% to about 10%, and still more preferably about 3% to about 5%.

The lower the ratio of cross-sectional area between the cover layer 22 and the entire electric wire, the lower the high-frequency resistance.

The central conductor 21 can be made of electrical aluminum (EC aluminum) or aluminum alloy such as Al—Hg—Si alloy (JIS6000s), for example. The aluminum alloy is more desirable than the EC aluminum because the aluminum alloy has a higher volume resistivity than that of the EC aluminum.

The AC resistances of the CCA wire according to the second embodiment of the present invention and the Cu wire were calculated through the simulation using the aforementioned theoretical formula. This results in finding the characteristics that the CCA wire has a smaller eddy-current loss than the Cu wire of the same diameter has because of the proximity effect and therefore has a lower AC resistance.

Figure 19:
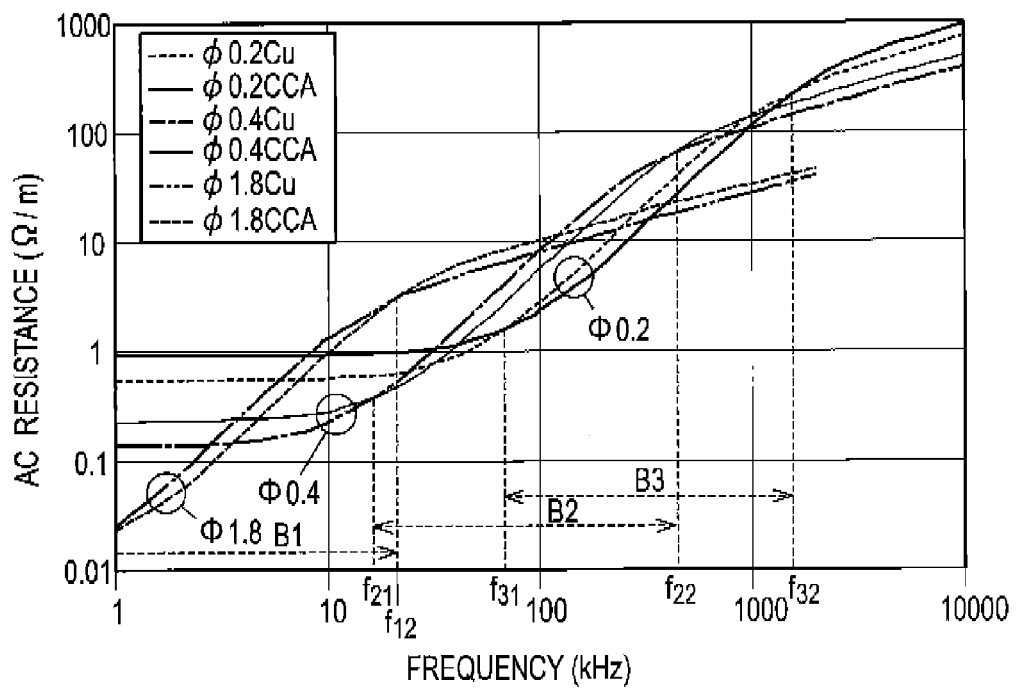
FIG. 19 is a graph illustrating the relationship between the frequency and AC resistance in a CCA wire according to the second embodiment of the present invention and a Cu wire.

FIG. 19 shows the relationship between the frequency and AC resistance of CCA and Cu wires having diameters of 1.8 mm, 0.4 mm, and 0.2 mm. In the case of the Cu wire and CCA wire having a diameter of 1.8 mm, in a frequency range lower than a first frequency f11 (not shown) of about 1 kHz, the AC resistance of the CCA wire is higher than that of the Cu wire. At the first frequency f11, the AC resistance of the CCA wire equals to that of the Cu wire. In a frequency range higher than the first frequency f1, the eddy current loss is dominant, and the relative magnitudes of the AC resistances of the CCA wire and Cu wire are therefore reversed. In a frequency range B1 between the first frequency f11 and a second frequency f12 of about 10 kHz, the AC resistance of the Cu wire is higher than that of the CCA wire. At the second frequency f12, the AC resistance of the CCA wire equals to that of the Cu wire again. In a frequency range higher than the second frequency f12, the proximity effect in the CCA wire has a larger influence than that in the Cu wire, and the relative magnitudes of the AC resistances of the CCA wire and Cu wire are therefore reversed.

Also in the case of the Cu wire and CCA wire each having a diameter of 0.4 mm, the AC resistance of the CCA wire equals to that of the Cu wire at first and second frequencies f21 and f22. In a frequency range B2 between the first and second frequencies f21 and f22, the AC resistance of the Cu wire is higher than that of the CCA wire.

Also in the case of the Cu wire and CCA wire each having a diameter of 0.2 mm, the AC resistance of the CCA wire equals to that of the Cu wire at first and second frequencies f31 and f32. In a frequency range B3 between the first and second frequencies 31 and 32, the AC resistance of the Cu wire is higher than that of the CCA wire.

Moreover, as shown in FIG. 19, the characteristics are found in which as the diameter of the CCA and Cu wires gets smaller like 1.8 mm, 0.4 mm, and 0.2 mm, the first and second frequencies f11 and f12 are shifted to higher frequencies and the frequency range (B1, B2, and B3) specified between the first frequency (f11, f12, and f13) and the second frequency (f12, f22, and f32) are therefore shifted to higher frequencies. Even if the strength of the magnetic field increases, the second frequency (f12, f22, and f23) changes very little, but the first frequency (f11, f21, and f31) moves to lower frequency.

Figure 20:
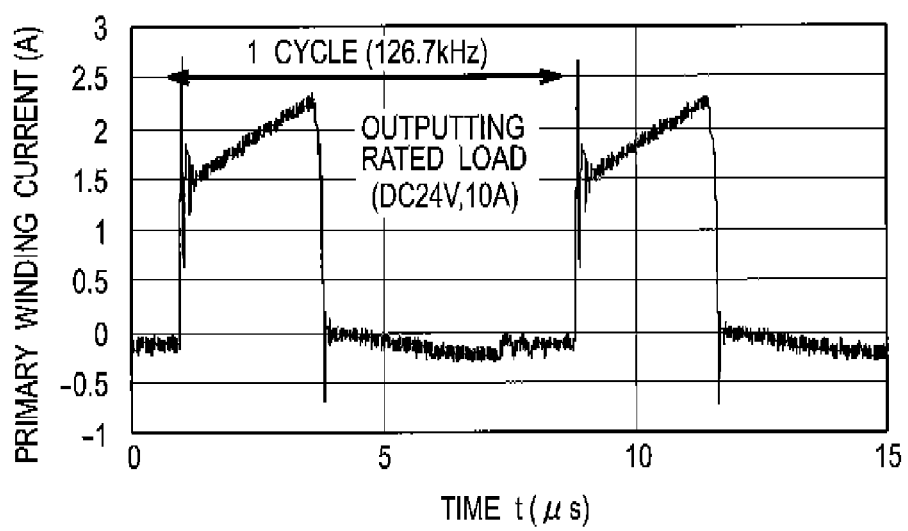
FIG. 20 is a graph illustrating a primary winding current waveform of a high-frequency transformer.

Moreover, in a winding wire of a high-frequency transformer incorporated in a switching power supply, current having a highly distorted waveform flows as shown in FIG. 20. This is because the frequency of the alternating current contains many high-order harmonic components in addition to the frequency of the fundamental (fundamental frequency). Accordingly, the loss (copper loss) generated in the high-frequency transformer is the sum of the direct-current component and the fundamental and higher order harmonic components. As shown in FIG. 22, for example, the loss of a CCA winding wire (diameter: 0.2 mm) according to the second embodiment of the present invention is 8.0 W, and the loss of a Cu winding wire (diameter; 0.6 mm) according to the comparative example is 14.5 W.

Accordingly, it is preferable that the diameter, material, cross-sectional area ratio, and the like of the CCA wire are designed so that, as the frequency range of the alternating current used in the CCA wire, the fundamental frequency and higher order harmonics of the alternating current fall within the frequency range (B1, B2, or B3) specified by the first frequency (f11, f21, or f31) and the second frequency (f12, f22, or f32). It may be properly determined depending on the intended purpose of the CCA wire which ones of the high-order harmonic components are to be considered. For example, it is possible to consider the frequency range from the fundamental frequency up to the tenth-order harmonic component or the frequency range from the fundamental frequency up to the twentieth-order harmonic component.

When used in the particular frequency range, the CCA strand according to the second embodiment of the present invention can have an eddy-current loss equal to or smaller than that of the Cu wire having the same diameter as that of the CCA strand, and therefore the AC resistance of the CCA wire can be reduced.

<Electric Wire Designing Apparatus>

Figure 23:
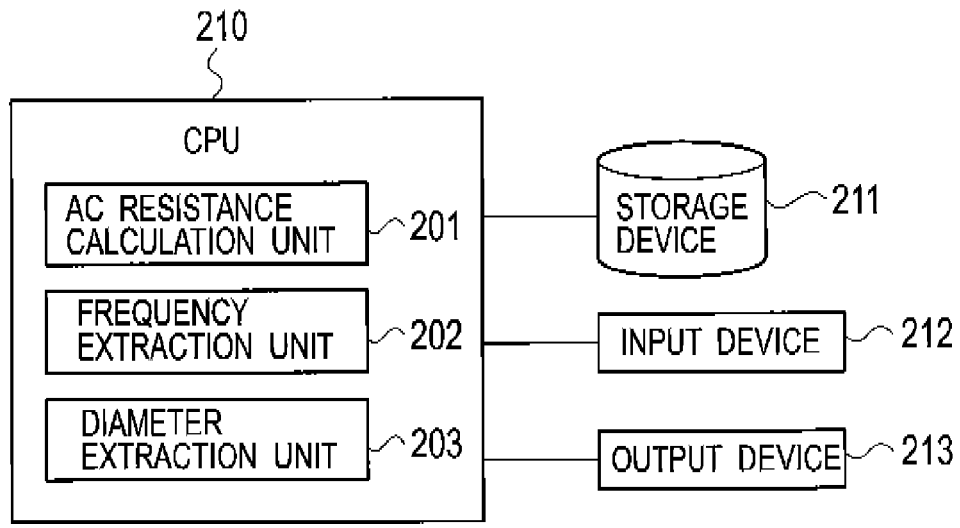
FIG. 23 is a schematic view showing an example of an apparatus of designing the electric wire according to the second embodiment of the present invention.

As shown in FIG. 23, an electric wire designing apparatus according to the second embodiment of the present invention includes a central processing unit (CPU) 210, a storage device 211, an input device 212, and an output device 213.

The CPU 210 logically includes an AC resistance calculation unit 201, a frequency extraction unit 202, and a diameter extraction unit 203 as modules (logical circuits) which are hardware sources.

The AC resistance calculation unit 201 reads information necessary to calculate AC resistances of the target CCA wire and the Cu wire from the storage device 211 and then, as shown in FIG. 19, calculates the AC resistances of CCA wires having plural diameters and Cu wires of the same diameters as those of the CCA wires at different frequencies.

The frequency extraction unit 202, based on the AC resistances of the CCA wires having plural diameters and the Cu wires having the same diameters as those of the CCA wires, which are calculated by the AC resistance calculation unit 201, as shown in FIG. 19, for each of the plural diameters of the CCA and Cu wires, extracts the first frequency (f11, f21, or f31 (f11 is not shown)) and second frequency (f12, f22, or f32) at which the AC resistance of the CCA wire is equal to that of the Cu wire and between which the AC resistance of the CCA wire is lower than that of the Cu wire.

Herein, at the frequencies extracted as the first frequency (f11, f21, or f31) and the second frequency (f12, f22, or f32), the AC resistance of the CCA wire may not be strictly equal to that of the Cu wire. For example, it is possible to extract a frequency just before (lower frequency) or just after (higher frequency) the relative magnitudes of the AC resistances of the CCA wire and Cu wire are reversed. Alternatively, it is possible to extract a frequency at which approximate curves of the AC resistances of the CCA wire and Cu wire, which are obtained from the calculation results thereof, intersect each other.

The diameter extraction unit 203 reads from the storage device 211, a particular frequency range in which the CCA wire is used. Based on the first frequency (f11, f21, or f31) and the second frequency (f12, f22, or f32) which are extracted by the frequency extraction unit 202, the diameter extraction unit 203 extracts a diameter of the CCA wire corresponding to the first and second frequencies so that the frequency range (B1, B2, or B3) specified between the extracted first frequency (f11, f21, or f32) and second frequency (f12, f22, or f32) falls in the particular frequency range in which the CCA wire is used (for example, a diameter of 0.4 mm is extracted corresponding to the first frequency f21 and second frequency f22). The particular frequency range in which the CCA wire is used may include the fundamental frequency and tenth or less order harmonic components shown in FIG. 21 or may include the fundamental frequency and twentieth or less order harmonic components.

The storage device 211 shown in FIG. 23 stores information necessary to calculate the AC resistances of CCA wires and Cu wires having various diameters, a particular frequency range in which each CCA wire is used, the AC resistances calculated by the AC resistance calculation unit 201, the first frequencies f11, f21, and f31 and the second frequencies f12, f22, and f32 which are extracted by the frequency extraction unit 202, and the diameter of the CCA wire which is extracted by the diameter extraction unit 203. The storage device 211 can be a semiconductor memory, a magnetic disk, an optical disk, or the like, for example. The storage device 211 can be caused to function as a storage device or the like storing programs executed by the CPU 210 (the programs are described in detail). The storage device 211 can be caused to function as a temporary data memory which temporarily stores data used in the program execution process of the CPU 210 and is used as a work area.

The input device 212 shown in FIG. 23 can include a recognition device such as a touch panel, a keyboard, a mouse, and an OCR, an image input device such as a scanner and a camera, a voice input device such as a microphone, and the like, for example. The output device 213 can include a display device such as a liquid crystal device (LCD), an organic electroluminescence (EL) display, and a CRT display, a printing device such as an ink-jet printer and a laser printer, and the like.

<CCA Wire Manufacturing Method>

Figure 24:
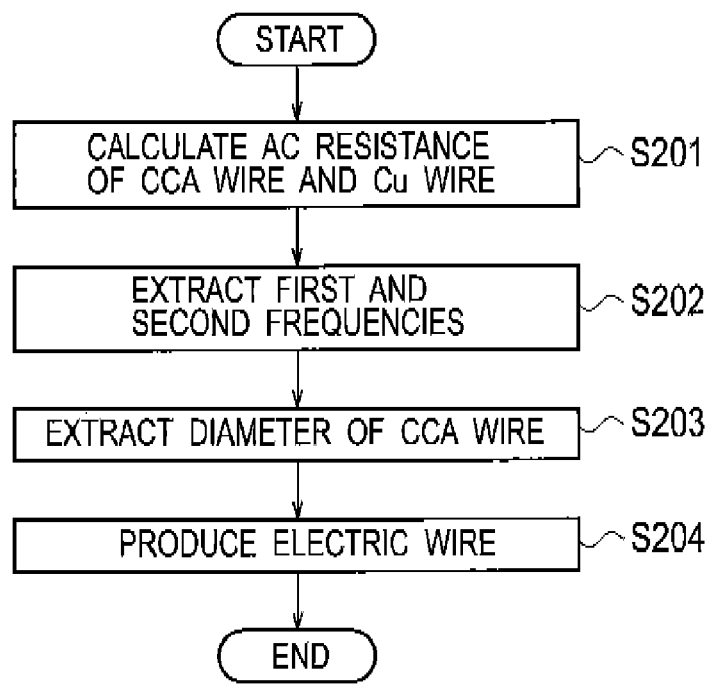
FIG. 24 is a flowchart for explaining an example of a method of designing the electric wire according to the second embodiment of the present invention.

Using a flowchart of FIG. 24, a description is given of an example of the method of manufacturing a CCA strand including the electric wire designing method using the electric wire design apparatus according to the second embodiment of the present invention.

i) In step S201, the AC resistance calculation unit 201 calculates for different frequencies, the AC resistances of the CCA wires of plural diameters and the Cu wire having the same diameters as those of the CCA wires. This calculation results are stored in the storage device 211. The material, the ratio of cross-sectional area, and the like of the CCA wires to be calculated can be properly set. The AC resistances of the CCA and Cu wires may be actually measured instead of being calculated.

ii) In step S202, as shown in FIG. 19, the frequency extraction unit 202, for each of the plural diameters, extracts the first frequency (f11, f21, or f31 (f11 is not shown)) and the second frequency (f12, f22, or f32) at which the AC resistances of the CCA wire and Cu wire of the same diameter are equal to each other and between which the AC resistance of the CCA wire is smaller than that of the Cu wire. The ranges of wire diameter and frequency to be calculated can be properly set to ranges in which the CCA wire can be used. The extracted first frequencies (f11, f21, and f31) and second frequencies (f12, f22, and f32) are stored in the storage device 211.

iii) In step S203, the diameter extraction unit 203 extracts a diameter of the CCA wire corresponding to the first and second frequencies so that the frequency range (B1, B2, or B3) specified between the extracted first frequency (f11, f21, or f32) and second frequency (f12, f22, or f32) fall within the particular frequency range in which the CCA wire is used (for example, a diameter of 1.8 mm is extracted corresponding to the first frequency f11 and second frequency f12). The extracted diameter is stored in the storage device 211.

iv) In step S204, a CCA strand having the diameter stored in the storage device 211 is manufactured. Specifically, the central conductor 21 which is made of aluminum or aluminum alloy and has a diameter of about 9.5 mm to 12.0 mm is prepared. The surface of the central conductor 12 is covered with the cover layer 13 by performing TIE welding, plasma welding, or the like with about 0.1 mm to 0.4 mm thick copper tape longitudinally attached to the surface of the central conductor 12. Next, the central conductor 21 coated with the cover layer 22 is subjected to skin pass rolling so as to have a diameter of about 9.3 mm to 12.3 mm, thus producing a base material composed of the central conductor 21 covered with the cover layer 22. Next, the base material is drawn through plural drawing dies (about 25 to 26 dies). By causing the base material to pass through the plural drawing dies, the electric wire finally has a diameter equal to the diameter stored in the storage device 211.

By the method of manufacturing a CCA strand including the designing method using the electric wire designing apparatus according to the second embodiment of the present invention, it is possible to design the diameter of a CCA wire whose eddy current loss can be made equal to or less than that of the Cu wire having the same diameter and whose AC resistance can be reduced corresponding to the particular frequency range in which the CCA wire is used.

<Designing Program>

The series of steps shown in FIG. 24, which includes: i) the step of individually calculating the AC resistances of CCA wires having plural diameters and the AC resistance of the Cu wire having the same diameters as those of the CCA wire at different frequencies; ii) the step of extracting, for each of the plural diameters, the first frequency (f11, f21, or f31) and the second frequency (f12, f22, or f32) at which the AC resistance of the CCA wire is equal to that of the Cu wire and at which the AC resistance of the CCA wire is lower than that of the Cu wire; iii) the step of extracting a diameter corresponding to the first frequency (ill, f21, or f31) and the second frequency (f12, f22, or f32) so that the frequency range B1, B2, or 53 specified between the first frequency f11, f21, or f31 and the second frequency (f12, f22, or f32) falls within the particular frequency range in which the CCA wire is used and the like, can be executed by controlling the electric wire designing apparatus shown in FIG. 23 through a program having an algorithm equivalent to the method shown in FIG. 24.

This program can be stored in the storage device 211 of a computer system constituting the electric wire designing apparatus of the present invention. This program can be also stored in a computer-readable recording medium. By loading this recording medium into the storage device 211 or the like, the series of steps of the second embodiment of the present invention can be executed.

Herein, the computer-readable recording medium refers to a medium in which programs can be recorded, for example, such as a semiconductor memory, a magnetic disk, or an optical disk. For example, the main body of the electric wire designing apparatus can be configured to incorporate or be externally connected to a device to read the recording medium. Furthermore, the programs in the recording medium can be stored in the storage device 211 via an information processing network such as a wireless communication network.

<Electric Motor>

Next, a description is given of an electric motor according to the second embodiment of the present invention. Electric motors using inverter devices and the like to control the rotation speed and torque are highly efficient and are used in a wide range of fields including drive of railway cars and electric cars and inverter air conditioners in the field of electrical appliances.

A coil of an electric motor is configured by winding conducting wire in a multiple manner. In the electric motor, copper (Cu) has a lower resistivity than aluminum (Al) and can be soldered. Conventional coils are generally composed of Cu wires.

However, this type of electric motor has a variable rotation speed and is often used at a high rotation speed. The driving current of the electric motor has a higher frequency at a higher rotation speed. Moreover, the inverter device properly controls on and off of direct-current voltage to produce high frequency. The driving current therefore includes the fundamental frequency component and higher frequency components than the same.

As the frequency increases, the resistance of the coil increases because of the skin and proximity effects. The resistance due to the skin effect of Al wire is always higher than that of Cu wire, but the resistance due to proximity effect, of Al wire is not always higher than that of Cu wire. In the case of a coil wound with Cu wire, the proximity effect increases the high frequency resistance and therefore increases the loss due to the same in some cases. Particularly in the cases where the operating frequency of the electric motor is high, where the electric motor is driven by using the inverter device, and the like, the loss due to the proximity effect becomes conspicuous.

Herein, coils have various shapes. Coils having different shapes have different ratios between the skin effect and proximity effect of high frequency resistance of the conducting wire. The skin effect depends on the cross-sectional shape, the number, and the length of conducting wires constituting a coil, but the proximity effect also depends on how the coil is wound. The proximity effect becomes high when the conducting wires are wound closely or are wound with many turns. The high-frequency resistance per unit length of conducting wires constituting a coil is expressed as the following equation (49).

$$R_{ac} = R_s + \alpha^2 P_p \quad (49)$$

Herein, $R_s$ (Ω/m) is a high-frequency resistance due to the skin effect per unit length; $P_p$ (Ω·m) is a high-frequency loss due to the proximity effect per unit length; and α (1/m) is a shape factor (structural factor) depending on the shape of the coil. α is a constant little depending on the frequency. The more closely the coil is wound, or the longer the wound conducting wires are, the larger the α value is. α depends on necessary output power of the electric motor but varies.

$R_s$ and $P_p$ are given by the following equations (50) and (51).

[Equation 33]

$$Rs = \Re\left[\frac{j\omega\mu_0}{2\pi k_2 a} \cdot \frac{B_1 J_0(k_2 a) + C_1 M_0(k_2 a)}{B_1 J_0'(k_2 a) + C_1 M_0'(k_2 a)}\right] \quad (50)$$

$$P_p = -\frac{4\pi}{\sigma^2}\Re\left[k_2 a \frac{TQ^*}{|R|^2}\right] \quad (51)$$

FIRST EXAMPLE

Figure 25:
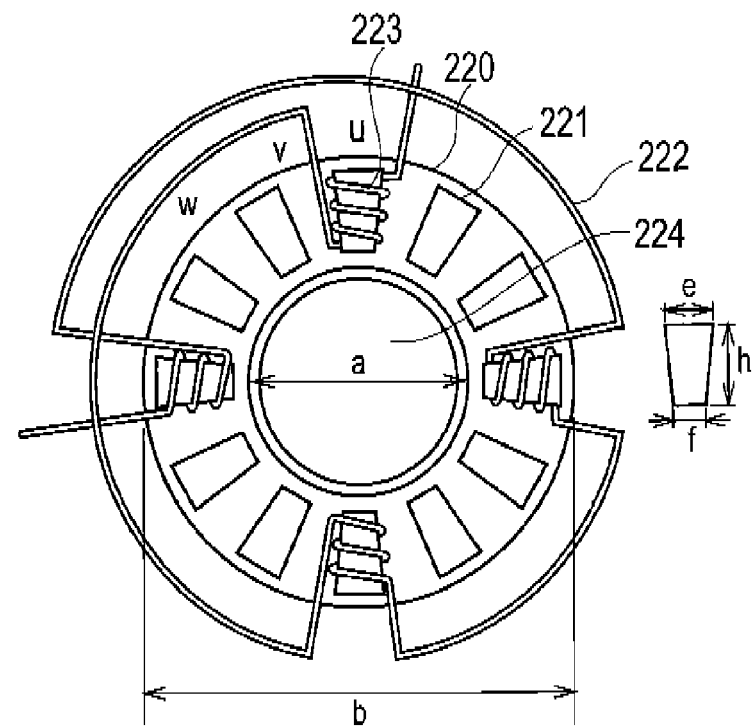
FIG. 25 is a schematic view showing an example of an electric motor according to a first example of the second embodiment of the present invention.

As shown in FIG. 25, an electric motor (three-phase AC synchronous motor) according to a first example of the second embodiment of the present invention includes: plural iron cores 221 arranged on a circle; plural coils 223 wound on the plural iron cores 221 with an electric wire 222 composed of Al or CCA wire; and a rotor 224 which is rotated when current is applied to the plural coils 223. The plural iron cores 221, the plural coils 223, a coil holder 20, and the like constitute a stator.

The electric motor according to the first example of the second embodiment of the present invention has 12 coils. An inner diameter a of the coil holder 20 is 150 mm; an outer diameter b thereof is 200 mm; a length h of each iron core 221, 40 mm; a diameter e of an end thereof on the outer side, 30 mm; and a diameter f of the other end thereof, 20 mm. The coil of each pole is cylindrically wound with ten turns of the electric wire 222 around the iron cores 21, the electric wire 222 having a radius r of 0.8 mm. The entire length l is about 3.1 m. FIG. 25 shows only the U-phase coils 223. The V-phase and W-phase coils (not shown) have structures similar to the coils 223.

The rotor 224 is composed of a permanent magnet. The rotor 224 is attracted and rotated by the peripheral rotating magnetic field formed by alternating current applied to the coils 223.

In the electric motor according to the first example of the second embodiment of the present invention, the rotation speed is controlled by adjusting the frequency of the driving current in an inverter method using a variable voltage variable frequency (VVVF) type inverter device. The inverter device is a three-phase output inverter including six switching elements, for example, and uses the switching elements to produce three-phase alternating current in a pseudo manner.

Herein, the frequency of the alternating current applied to the coils 223 is controlled by the inverter method so as to fall between a first frequency and a second frequency higher than the first frequency, the first and second frequencies being frequencies between which the alternating current resistance of the coils 223 is lower than that of a coil wound with Cu wire having a same shape as the coils 223.

Moreover, the driving current includes high frequency components having amplitudes not less than ⅓ of that of the fundamental frequency component and includes high frequency components having powers not less than ⅑ of that of the fundamental frequency component.

Figure 26:
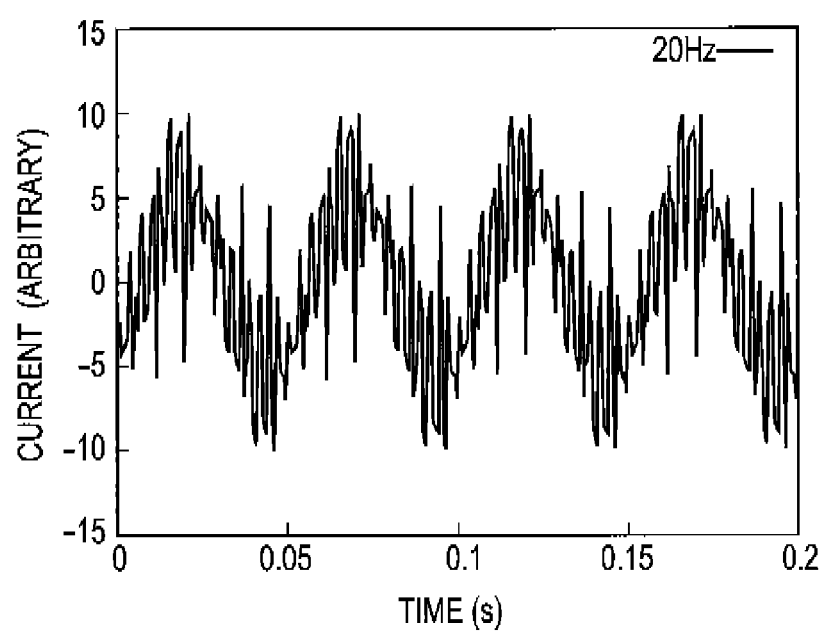
FIG. 26 is a graph illustrating current response of a coil which includes the Cu wire according to the comparative example when the operating frequency thereof is 20 Hz.
Figure 27:
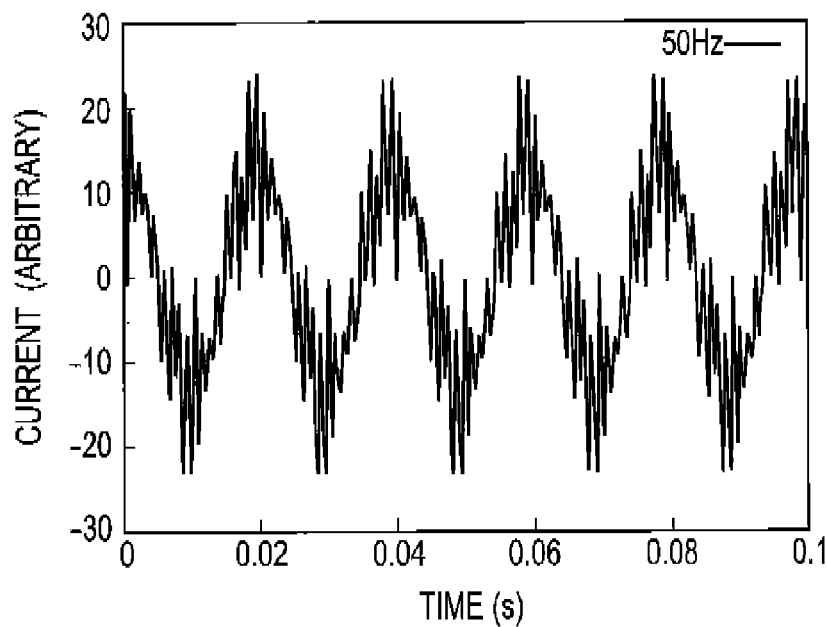
FIG. 27 is a graph illustrating current response of the coil which includes the Cu wire according to the comparative example when the operating frequency thereof is 50 Hz.
Figure 28:
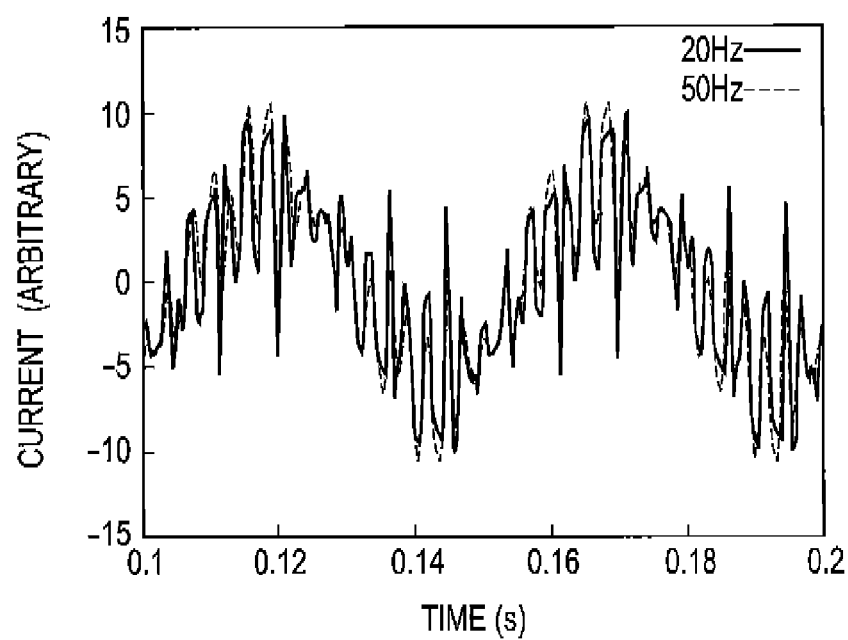
FIG. 28 is a graph illustrating the responses of FIGS. 26 and 27 together.

FIGS. 26 and 27 show current waveforms of the electric motor shown in FIG. 25 at operating frequencies of 20 Hz and 50 Hz. FIG. 28 shows a waveform obtained by extending the time axis of FIG. 27 two and a half times and superimposing the same on FIG. 26. FIG. 26 shows that the current has a fundamental period of 0.05 s. However, for the inverter method is used to clip variable voltage to produce high-frequency waves, many drastic changes are included in the sinusoidal waveform. In FIG. 27, the fundamental period is 0.02 s. FIG. 28 reveals that the configuration of the sinusoidal waveform is substantially constant without depending on the frequency of the current.

Figure 29:
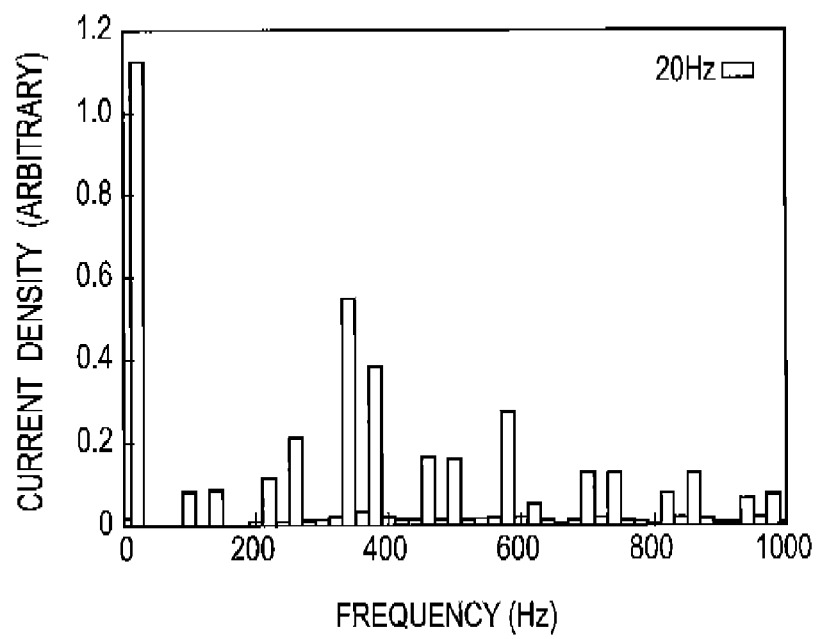
FIG. 29 is a graph illustrating a frequency spectrum of the current of FIG. 26.

FIG. 29 shows the frequency spectrum of FIG. 26. As shown in FIG. 29, the current includes the fundamental frequency of 20 Hz and many other high frequency components. Because of the existence of these high-frequency components, the high-frequency resistance is increased, and therefore, the loss due to the proximity effect therefore become pronounced.

Figure 30:
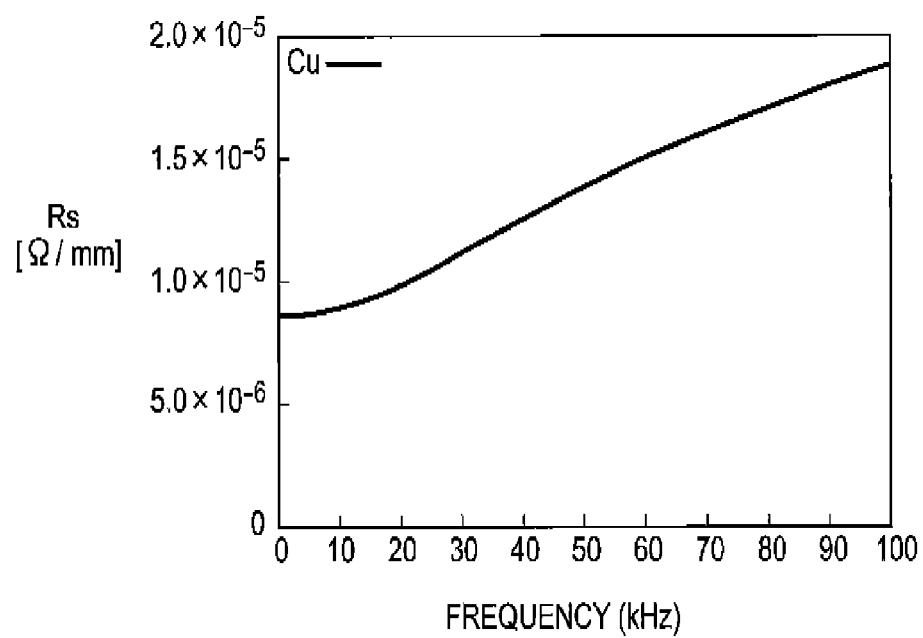
FIG. 30 is a graph illustrating high-frequency resistance due to the skin effect in the Cu wire according to the comparative example, the Cu wire having a radius of 0.8 mm.
Figure 31:
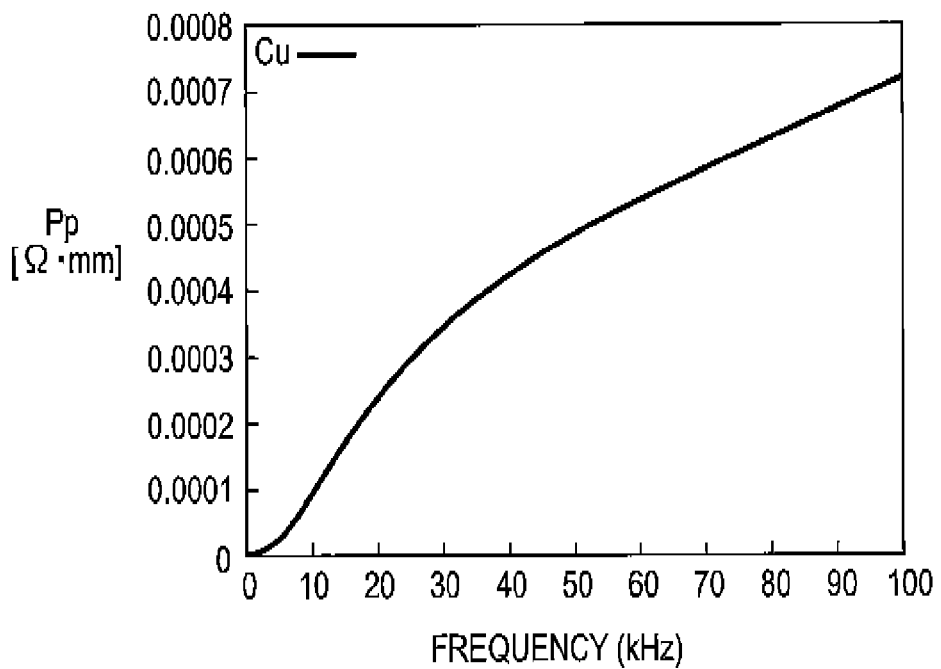
FIG. 31 is a graph illustrating the high-frequency loss due to the proximity effect ($H_0$=1 A/mm) in the Cu wire according to the comparative example, the Cu wire having a radius of 0.8 mm.

As a comparative example, FIG. 30 shows the high-frequency resistance $R_s$ per unit length due to the skin effect of a coil wound with Cu wire having a radius r of 0.8 mm and a length l of 3.1 m. FIG. 31 shows the loss $P_p$ per unit length due to the proximity effect when the external magnetic field H0 is 1 A/mm.

Figure 32:
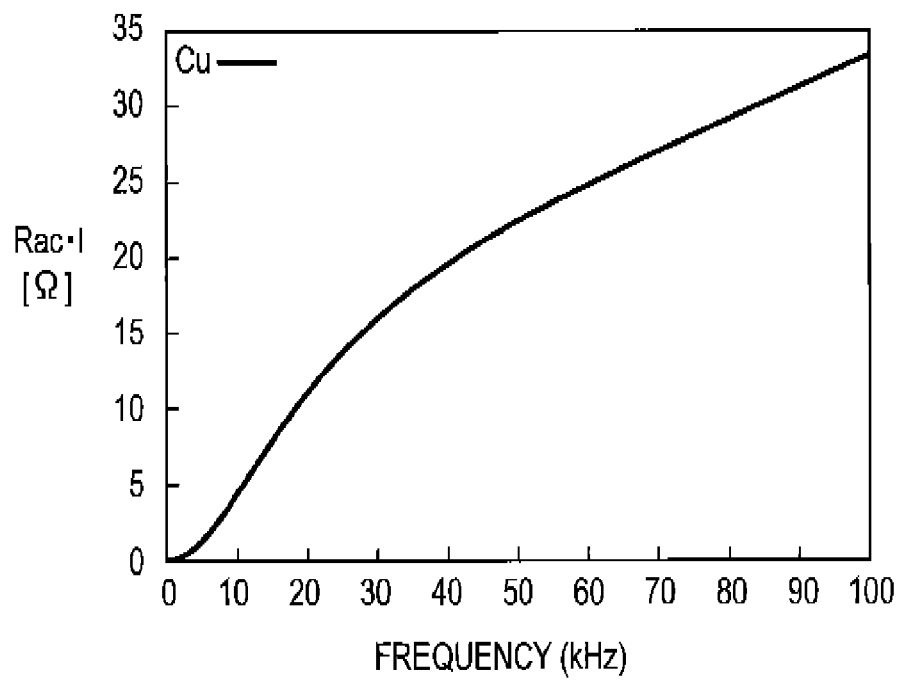
FIG. 32 is a graph illustrating high-frequency resistance static characteristics of a coil wound with the Cu wire according to the comparative example.

Moreover, the coil wound with the same Cu wire has a static characteristic of the high-frequency resistance as shown in FIG. 32. Herein, the static characteristic refers to the characteristic when sinusoidal current is applied to the electric motor. In this case, the structural factor α in the equation (49) is 3.9 mm$^{-1}$.

On the other hand, in the case of the driving current of FIG. 26, the high-frequency resistance of the coil is calculated from the spectrum of FIG. 29 as the following equation (52).

[Equation 34]

$$R_{ac}^d = \frac{\sum_{n=0}^{\infty} I^2(\omega_n) R_{ac}(\omega_n)}{\sum_{n=0}^{\infty} I^2(\omega_n)}, \omega_n = 2\pi f_n \quad (52)$$

$f_n$ is a frequency of an n-order high-frequency component.

Figure 33:
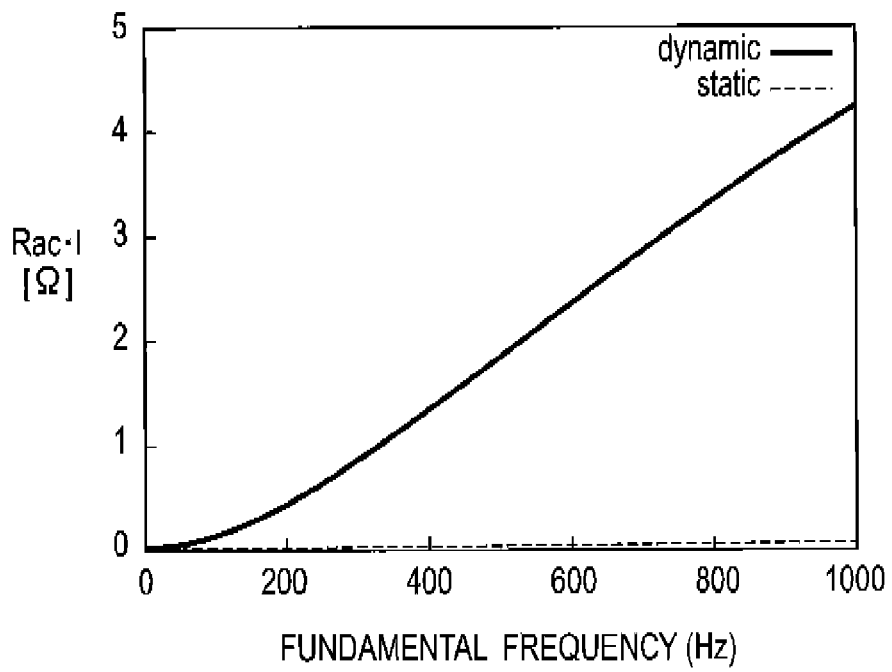
FIG. 33 is a graph illustrating high-frequency resistance dynamic characteristics of the coil wound with the Cu wire according to the comparative example.

It is assumed that the driving current of FIG. 26 is produced by an inverter device and the waveform constituting the sinusoidal wave does not relatively change even if the frequency changes. Calculation of the dynamic characteristic of the high frequency resistance of the coil by the equation (52) provides calculation results shown in FIG. 33. This dynamic characteristic refers to the characteristic when the periodic driving current as shown in FIG. 26 is applied to the electric motor. The fundamental frequency at that time is defined as a reciprocal of the period of the driving current. FIG. 33 reveals that the dynamic characteristic significantly increases compared with the static characteristic.

Figure 34:
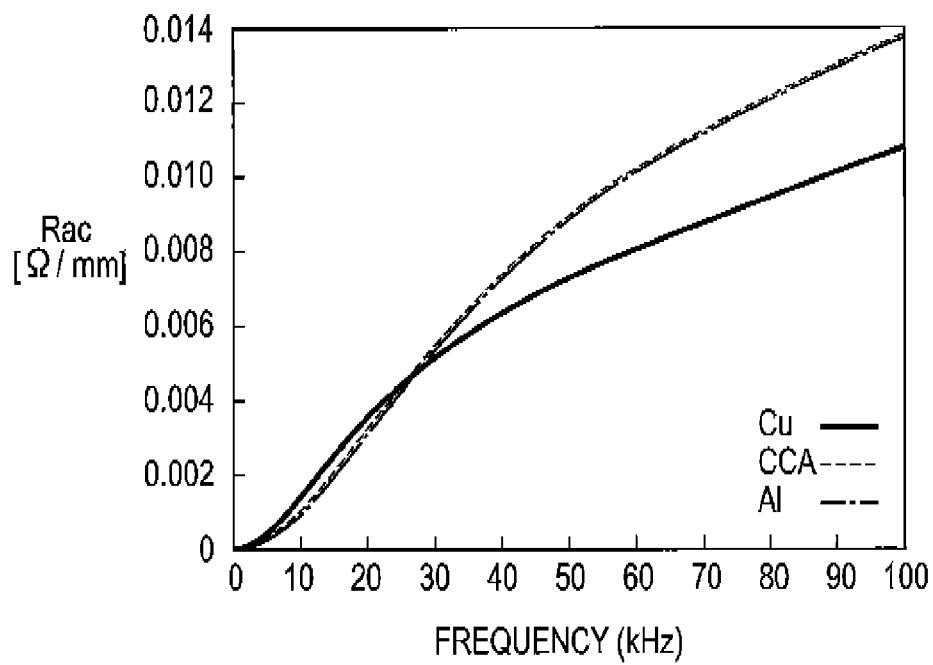
FIG. 34 is a graph illustrating the high-frequency resistance static characteristics (No. 1) of coils wound with the CCA wire and Al wire according to the first example of the second embodiment of the present invention and a coil wound with the Cu wire according to the comparative example.
Figure 35:
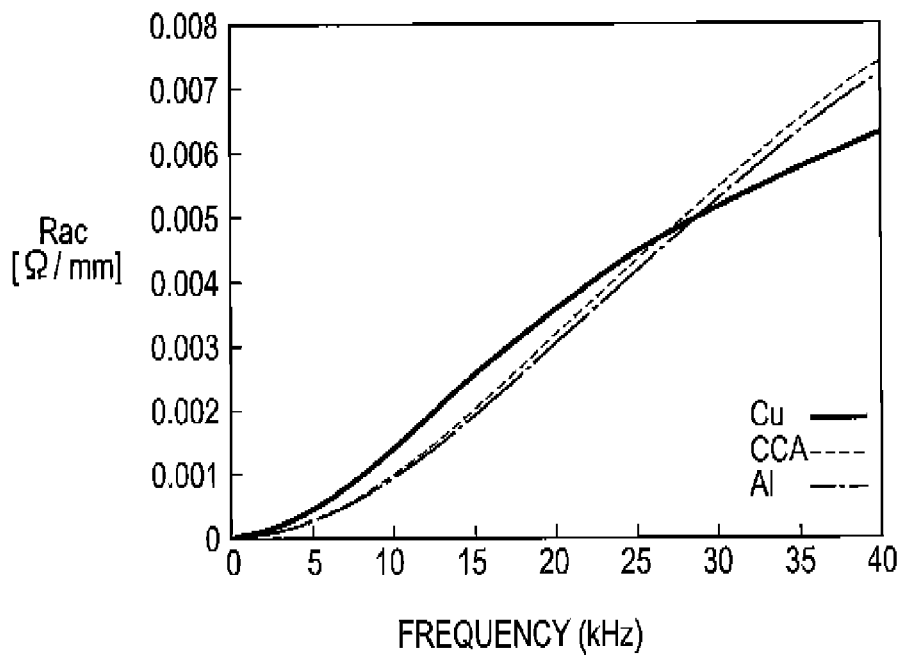
FIG. 35 is a graph illustrating the high-frequency resistance static characteristics (No. 2) of the coils wound with the CCA, wire and Al wire according to the first example of the second embodiment of the present invention and the coil wound with the Cu wire according to the comparative example.

On the other hand, FIGS. 34 and 35 show the static characteristic in the electric motor according to the first example of the second embodiment of the present invention which is configured as follows: the electric wire 222 of the coils 223 is composed of CCA or Al wire. As shown in FIG. 18, the CCA wire includes: the central conductor 21 made of aluminum (Al) or aluminum alloy; and the cover layer 22 made of copper (Cu) covering the central conductor 21 (b=0.78 mm, a=0.8 mm), Moreover, the cross-sectional area of the cover layer 22 is 5% of that of the entire high-frequency wire (hereinafter, the CCA wire is referred to as 5% CCA wire). Herein, the CCA and Al wires have the same diameter. FIGS. 34 and 35 reveal that the resistances of the CCA and Al wires are lower than that of Cu wire in a range of the frequency f: 0.9 kHz≤f≤27 kHz.

Figure 36:
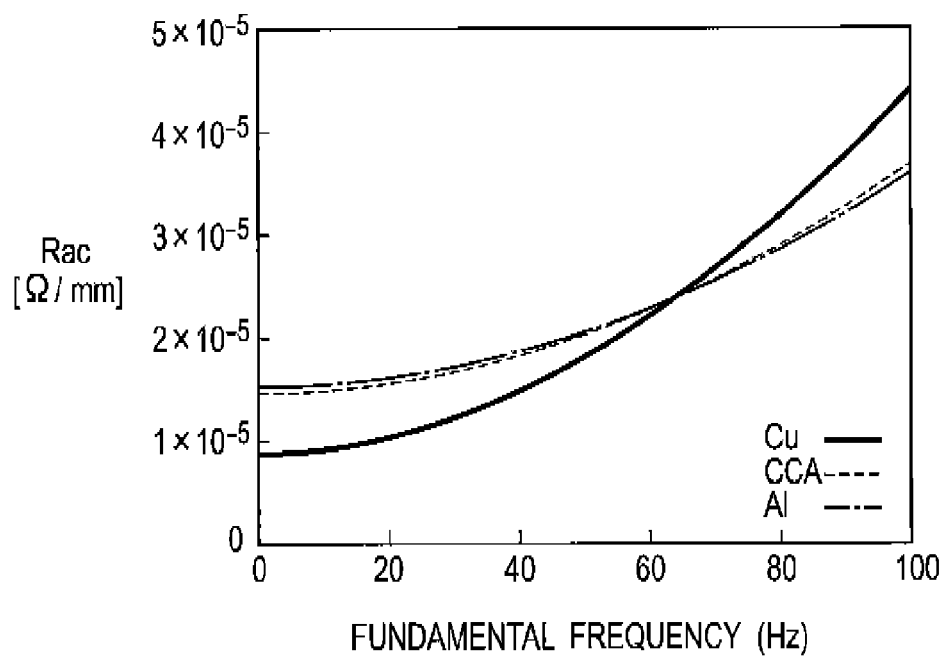
FIG. 36 is a graph illustrating the high-frequency resistance dynamic characteristics (No. 1) of the coils wound with the CCA wire and Al wire according to the first example of the second embodiment of the present invention and the coil wound with the Cu wire according to the comparative example.
Figures 37, 38, 39:
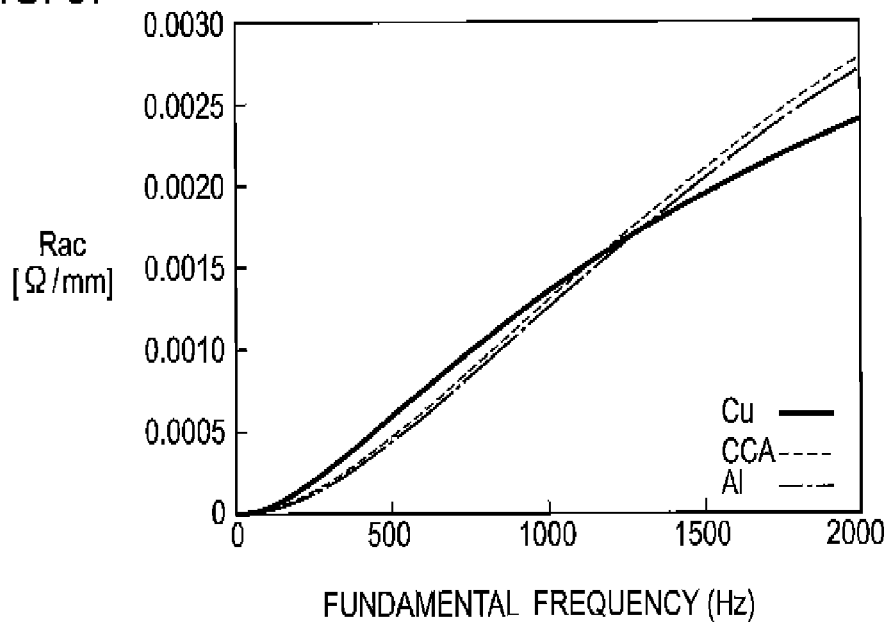
FIG. 37 is a graph illustrating the high-frequency resistance dynamic characteristics (No. 2) of the coils wound with the CCA wire and Al wire according to the first example of the second embodiment of the present invention and the coil wound with the Cu wire according to the comparative example.
FIG. 38 is a table showing the frequency range in which the dynamic characteristic high-frequency resistance of the CCA wire is lower than that of the Cu wire for each different α value in the first example of the second embodiment of the present invention.
FIG. 39 is a table showing the frequency range in which the dynamic characteristic high-frequency resistance of the CCA wire is lower than that of the Cu wire for each different value of radius r in the first example of the second embodiment of the present invention.

FIGS. 36 and 37 show the dynamic characteristic of the high-frequency resistance of coils wound with the same CCA and Al wires. FIGS. 36 and 37 show that the resistances of the CCA and Al wires are lower than that of the Cu wire in a range of the frequency f: 65 Hz≤f≤1173 Hz. In this case, by controlling the frequency of the driving current in the range of 65 Hz≤f≤1173 Hz with the first and second frequencies being set to 65 Hz and 1173 Hz, respectively, it is possible to obtain a high-frequency resistance equal to or lower than that of the Cu wire. The first and second frequencies at which each of the CCA and Al wires has a high-frequency resistance equal to or smaller than that of the Cu wire may be calculated using the equations (49) to (52) based on the shape of the coils 223 or may be actually measured.

In the first example of the second embodiment of the present invention, the electric wire 222 having a circular cross-section is described. The cross-sectional shape of the electric wire 222 may be flat or rectangular. An electric wire made of CCA wire having a cross-sectional area of not less than 2.0 mm$^2$ can provide the same effect. Moreover, in the case where the density of the winding and the length of the conducting wire of the intended electric motor change, the same effect is provided even if a changes in a range of 2.2 mm$^{-1}$≤α≤5.5 mm$^{-1}$.

FIG. 38 shows frequency ranges corresponding to different α values, in which the dynamic characteristic high-frequency resistance of the CCA wire is lower than that of the Cu wire. The larger the α value (for example, the more closely or more turns the conducting wires are wound), the wider the frequency range in which the CCA wire is advantageous.

FIG. 39 shows frequency ranges in which the dynamic characteristic high-frequency resistance of the CCA wire is lower than that of Cu wire for each conducting wire having different radii r at a same α=3.9 mm$^{-1}$. The CCA wire having a larger diameter is more advantageous in the lower frequency.

As described above, with the electric motor according to the first example of the second embodiment of the present invention, by using Al or CCA, wire having a lower conductivity than Cu wire and controlling the frequency of the driving current between the first and second frequencies by the inverter method, the high-frequency resistance of the Al or CCA wire can be made equal to or lower than that of Cu wire. It is therefore possible to reduce the loss of the electric motor.

Furthermore, since aluminum (Al) is lighter than copper (Cu), use of the Al or CCA wire can reduce the weight of the electric motor.

Still furthermore, in the case of using CCA wire, the CCA wire can be soldered as conventional, and the reduction in high-frequency resistance and weight can be achieved without degrading the workability. Moreover, if the skin depth of the CCA wire is equal to the thickness of the copper layer, the loss due to the skin effect becomes comparable with that of conventional conducting wires.

SECOND EXAMPLE

Figure 40:
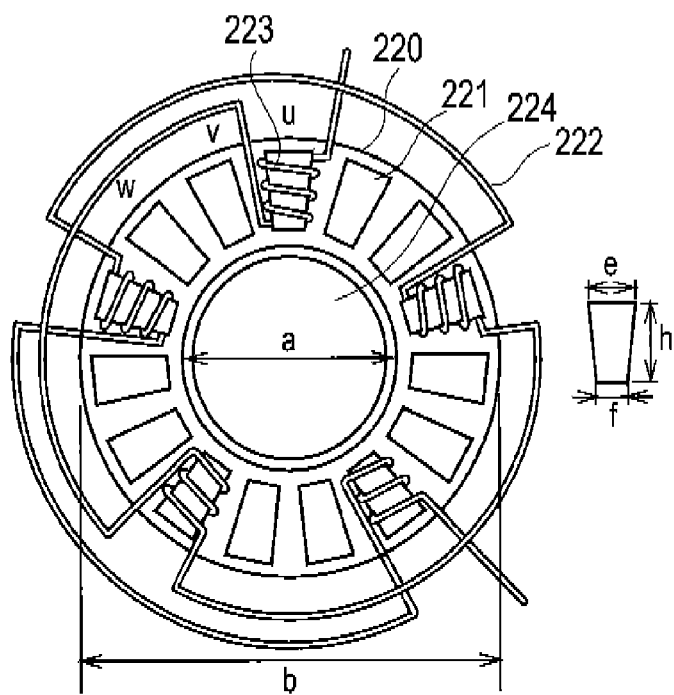
FIG. 40 is a schematic view showing an example of an electric motor according to a second example of the second embodiment of the present invention.

As shown in FIG. 40, an electric motor (three-phase AC synchronous motor) according to a second example of the second embodiment of the present invention includes: plural iron cores 221 arranged on a circle; plural coils 223 wound on the plural iron cores 221 with electric wire 222 which is composed of Al or CCA wire; and a rotor 224 which is rotated when current is applied to the plural coils 223.

The electric motor according to the second example of the second embodiment of the present invention has 15 coils. An inner diameter a of the coil holder 20 is 170 mm; an outer diameter b thereof is 220 mm; a length h of each iron core 221 is 45 mm; a diameter e of an end thereof on the outer side, 33 mm; and a diameter f of the other end thereof, 25 mm. The coil of each pole is cylindrically wound with ten turns of the electric wire 222 around the iron cores 221. The electric wire 222 has a radius r of 1.0 mm and an entire length l of about 4.8 m. FIG. 40 shows only the U-phase coils 223. The V-phase and W-phase coils (not shown) have similar structures to the coils 223.

The other configuration of the electric motor according to the second example of the second embodiment of the present invention is substantially the same as the electric motor according to the first example of the second embodiment of the present invention, and the overlapping description is omitted.

Figure 41:
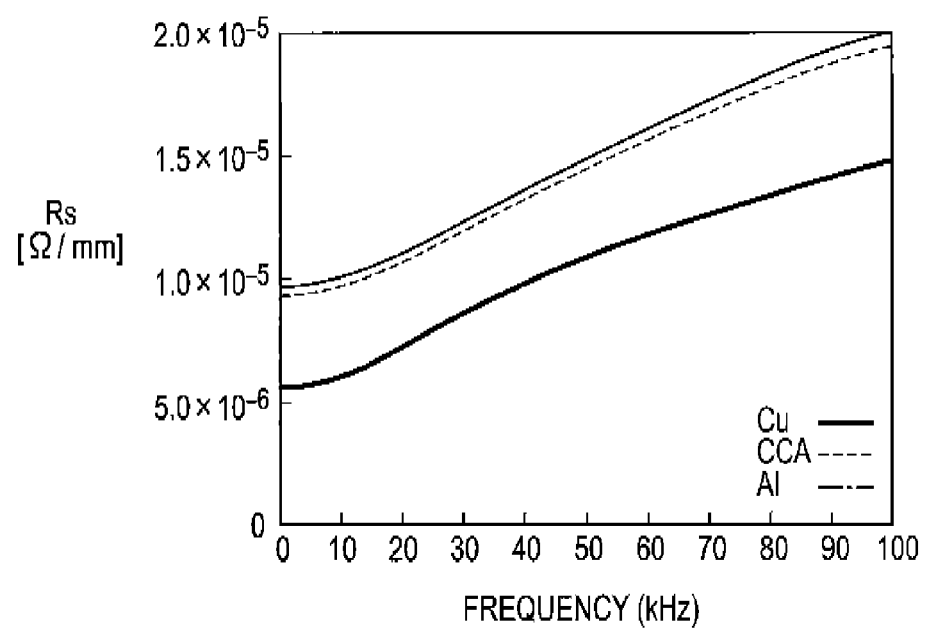
FIG. 41 is a graph illustrating high-frequency resistances due to the skin effect in the CCA wire and Al wire according to the second example of the second embodiment of the present invention and the Cu wire according to the comparative example, each wire having a radius of 1.0 mm.
Figure 42:
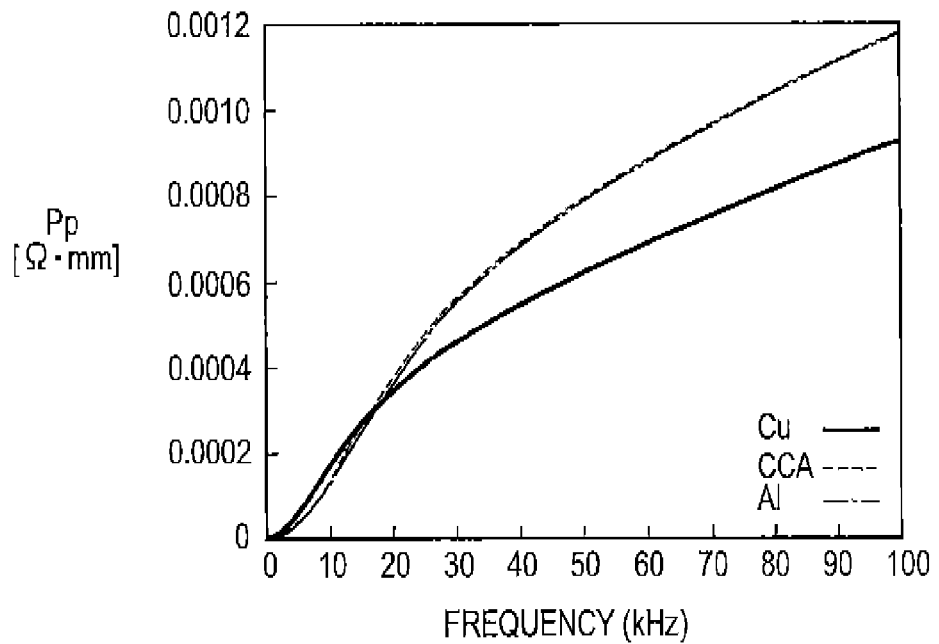
FIG. 42 is a graph illustrating high-frequency losses due to the proximity effect ($H_0$=1 A/mm) in the CCA wire and Al wire according to the second example of the second embodiment of the present invention and the Cu wire according to the comparative example, each wire having a radius of 1.0 mm.

As the coils 223 according to the second example of the second embodiment of the present invention, 5% CCA wire and Al wire having a radius r of 1.0 mm and a length of 4.8 m are used, and as a comparative example, Cu wire is used. In the 5% CCA wire, the outer diameter b of the coil holder 20 is 0.95 mm, and the inner diameter a of the coil holder 20 is 1 mm. FIG. 41 shows the high-frequency resistance $R_s$ per unit length due to the skin effect in the above case. FIG. 42 shows the loss $P_p$ per unit length due to the proximity effect when the external magnetic field is $H_0$=1 A/mm.

Figure 43:
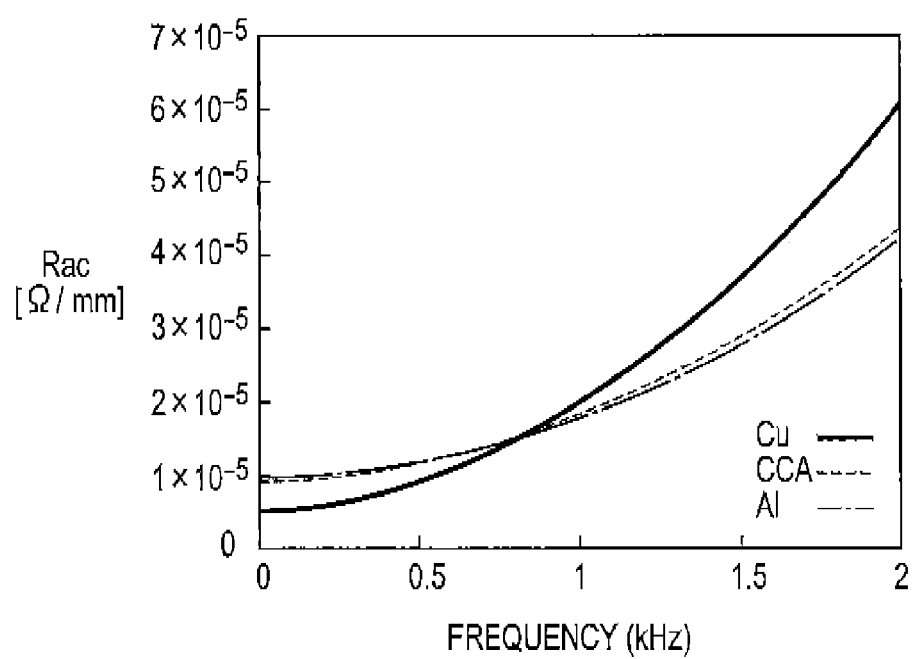
FIG. 43 is a graph illustrating the high-frequency resistance static characteristics (No. 1) of coils wound with the CCA wire and Al wire according to the second example of the second embodiment of the present invention and a coil wound with the Cu wire according to the comparative example.
Figure 44:
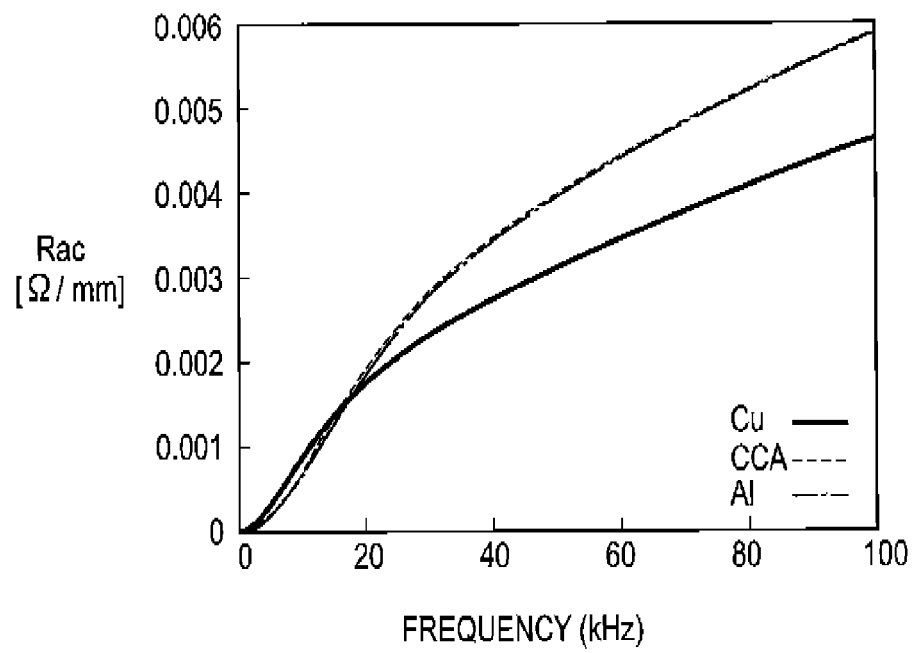
FIG. 44 is a graph illustrating the high-frequency resistance static characteristics (No. 2) of the coils wound with the CCA wire and Al wire according to the second example of the second embodiment of the present invention and the coil wound with the Cu wire according to the comparative example.

Moreover, coils wound with the aforementioned conducting wires provide the high-frequency resistance static characteristics as shown in FIGS. 43 and 44. In that case, the structural factor $\alpha$ in the equation (49) is 2.2 $mm^{-1}$. In FIGS. 43 and 44, the resistances of the CCA and Al wires are lower than that of the Cu wire when the frequency f falls in a range of 0.8 kHz≤f≤17 kHz.

Figure 45:
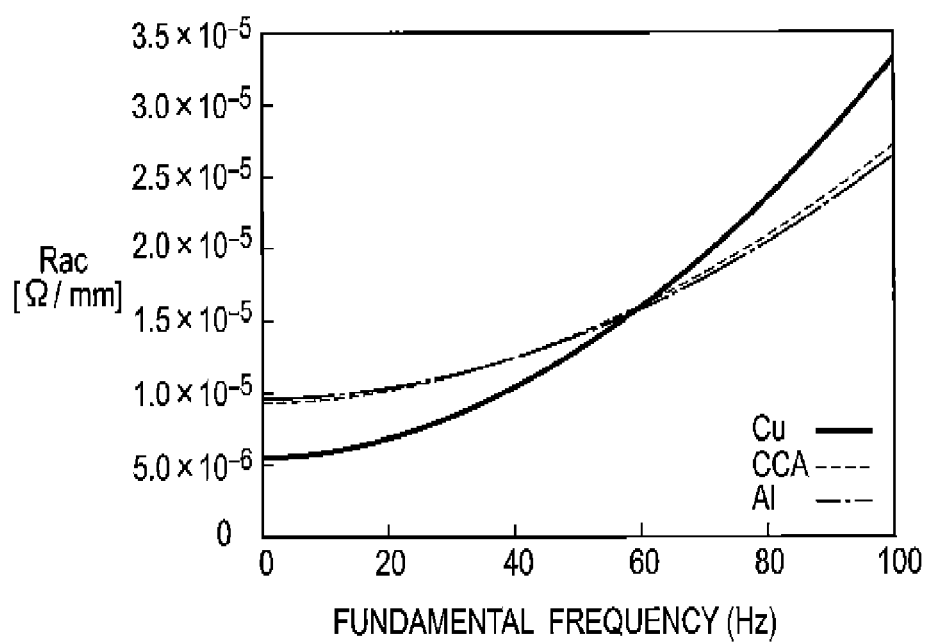
FIG. 45 is a graph illustrating the high-frequency resistance dynamic characteristics (No. 1) of the coils wound with the CCA wire and Al wire according to the second example of the second embodiment of the present invention and the coil wound with the Cu wire according to the comparative example.
Figures 46, 47, 48:
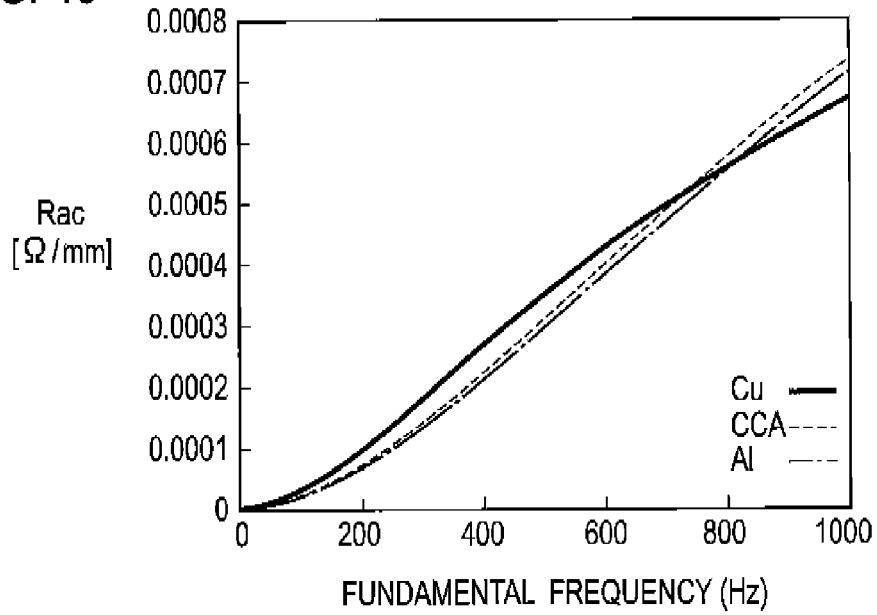
FIG. 46 is a graph illustrating the high-frequency resistance dynamic characteristics (No. 2) of the coils wound with the CCA wire and Al wire according to the second example of the second embodiment of the present invention and the coil wound with the Cu wire according to the comparative example.
FIG. 47 is a table showing the frequency range in which the dynamic characteristic high-frequency resistance of the CCA wire is lower than that of the Cu wire for each different α value in the second example of the second embodiment of the present invention.
FIG. 48 is a table showing the frequency range in which the dynamic characteristic high-frequency resistance of the CCA wire is lower than that of the Cu wire for each different value of radius r in the second example of the second embodiment of the present invention.

FIGS. 45 and 46 show the high-frequency resistance dynamic characteristics when it is assumed that the driving current of FIG. 26 is produced by an inverter and the waveform constituting the sinusoidal wave does not relatively change even if the frequency changes. FIGS. 45 and 46 show that the resistances of the CCA and Al wires are lower than that of the Cu wire when the frequency f falls in a range of 59 kHz≤f≤742 kHz. In this case, by controlling the frequency of the driving current in a range of 59 Hz≤f≤742 Hz with the first and second frequencies set to 59 Hz and 742 Hz, respectively, it is possible to obtain a high-frequency resistance equal to or lower than that of Cu wire.

In the second example of the second embodiment of the present invention, the electric wire 222 having a circular cross-section is described. The cross-sectional shape of the electric wire 222 may be flat or rectangular. An electric wire made of CCA wire having a cross-sectional area of at least 3.1 $mm^2$ can provide the same effect. Moreover, in the case where the density of the winding and the length of the electric wire 222 of the intended electric motor change, the same effect is provided even if $\alpha$ changes in a range of 1.0 $mm^{-1}$≤$\alpha$≤4.5 $mm^{-1}$.

FIG. 47 shows frequency ranges in which the dynamic characteristic high-frequency resistance of the CCA wire is lower than that of the Cu wire for each different $\alpha$ value. It is therefore revealed that the larger the value $\alpha$ is (for example, the more closely or more turns the conducting wire is wound), the wider the frequency range in which the CCA wire is advantageous to the Cu wire.

FIG. 48 shows frequency ranges in which the dynamic characteristic high-frequency resistance of the CCA wire is lower than that of the Cu wire for the respective conducting wires having different radii r at a same $\alpha$=2.2 $mm^{-1}$. The thicker the wire is, the CCA wire is advantageous at the lower frequency.

THIRD EXAMPLE

Figure 49:
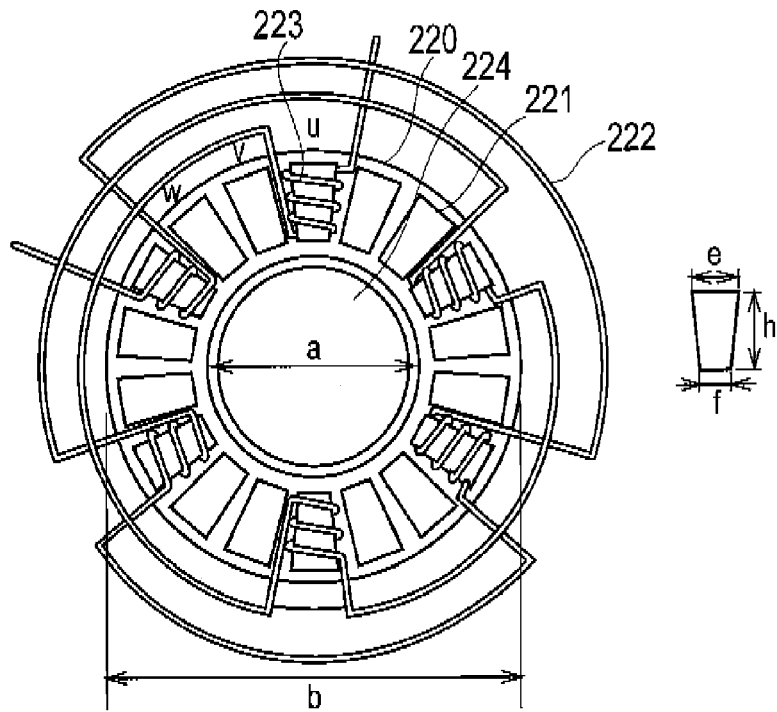
FIG. 49 is a schematic view showing an example of an electric motor according to a third example of the second embodiment of the present invention.

As shown in FIG. 49, an electric motor (three-phase AC synchronous motor) according to a third example of the second embodiment of the present invention includes: plural iron cores 221; plural coils 223 wound with the electric wire 222 which is composed of Al or CCA wire around the plural iron cores 221; and a rotor 224 which is rotated when current is applied to the plural coils 223.

The electric motor according to the third example of the second embodiment of the present invention has 18 coils. An inner diameter a of the coil holder 20 is 180 mm; an outer diameter b thereof is 230 mm; a length h of each iron core 221, 50 mm; a diameter e of an end thereof on the outer side, 36 mm; and a diameter f of the other end thereof, 27 mm. The coil of each pole is cylindrically wound with 11 turns of the electric wire 222 around the iron cores 21, the electric wires 222 having a radius r of 1.2 mm. The entire length l is about 7.0 m. FIG. 49 shows only the U-phase coils. The V-phase and W-phase coils (not shown) have similar structures to the coils 223.

The other configuration of the electric motor according to the third example of the second embodiment of the present invention is substantially the same as the electric motor according to the first example of the second embodiment of the present invention, and the overlapping description is omitted.

Figure 50:
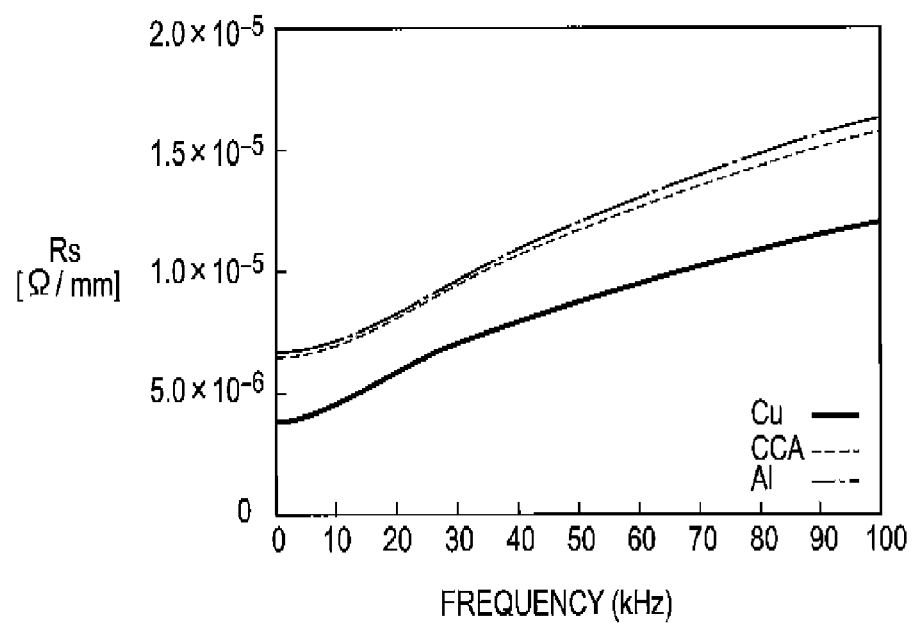
FIG. 50 is a graph illustrating high-frequency resistances due to the skin effect in the CCA wire and Al wire according to the third example of the second embodiment of the present invention and the Cu wire according to the comparative example, each wire having a radius of 1.2 mm.
Figure 51:
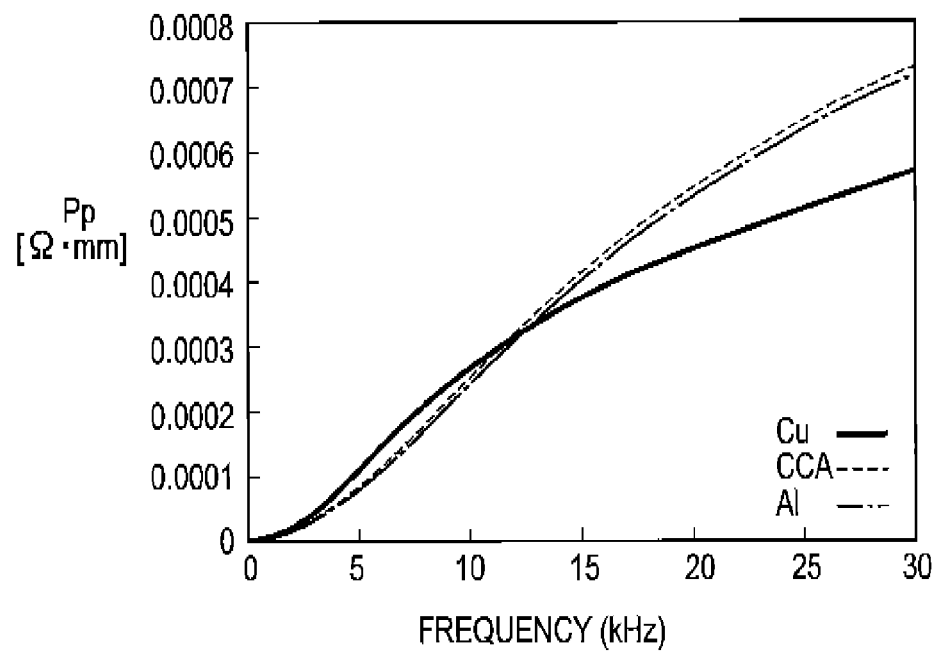
FIG. 51 is a graph illustrating high-frequency losses due to the proximity effect ($H_0$=1 A/mm) in the CCA wire and Al wire according to the third example of the second embodiment of the present invention and the Cu wire according to the comparative example, each wire having a radius of 1.2 mm.

As the coils 223 according to the third example of the second embodiment of the present invention, 5% CCA wire and Al wire each having a radius r of 1.2 mm and a length of 7.0 m are used, and as a comparative example, Cu wire is used as a comparative example. In the 5% CCA wire, the outer diameter b of the coil holder 20 is 1.17 mm, and the inner diameter a of the coil holder 20 is 1.2 mm. FIG. 50 shows the high-frequency resistance $R_s$ per unit length due to the skin effect in the above case. FIG. 51 shows the loss $P_p$ per unit length due to the proximity effect when the external magnetic field $H_0$=1 A/mm.

Figure 52:
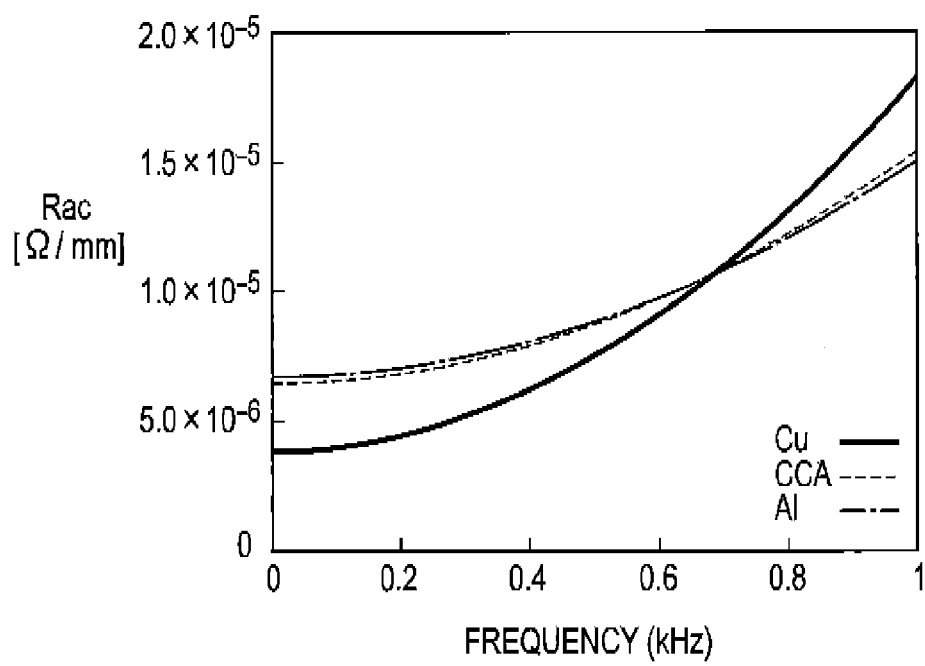
FIG. 52 is a graph illustrating the high-frequency resistance static characteristics (No. 1) of coils wound with the CCA wire and Al wire according to the third example of the second embodiment of the present invention and a coil wound with the Cu wire according to the comparative example.
Figure 53:
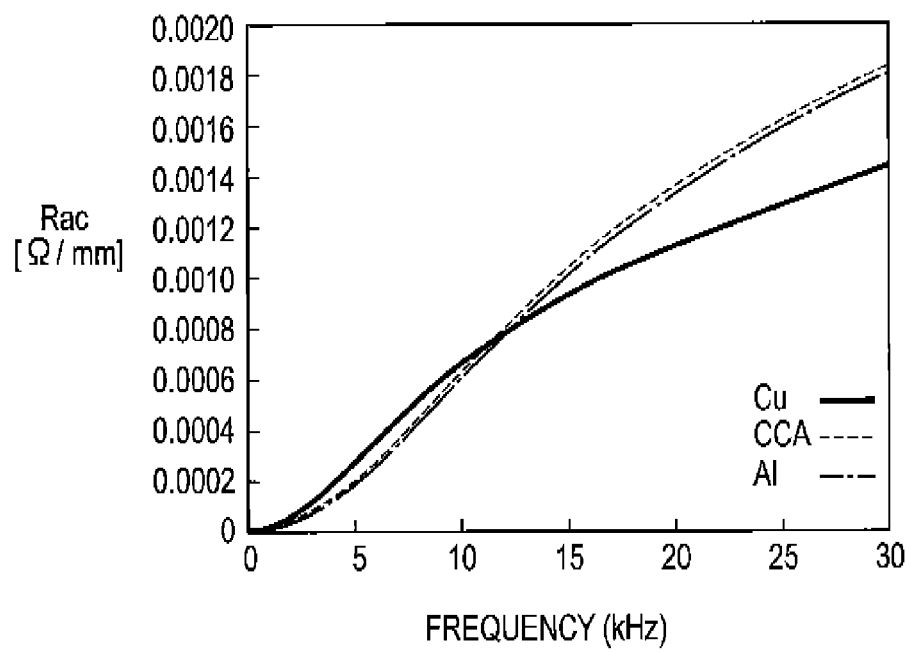
FIG. 53 is a graph illustrating the high-frequency resistance static characteristics (No. 2) of the coils wound with the CCA wire and Al wire according to the third example of the second embodiment of the present invention and the coil wound with the Cu wire according to the comparative example.

Moreover, coils wound with the aforementioned conducting wires exert provide high-frequency resistance static characteristics as shown in FIGS. 52 and 53. In that case, the structural factor $\alpha$ in the equation (49) is 1.6 $mm^{-1}$. In FIGS. 52 and 53, the resistances of the CCA and Al wires are lower than that of the Cu wire when the frequency f falls in a range of 0.7 kHz≤f≤12 kHz.

Figure 54:
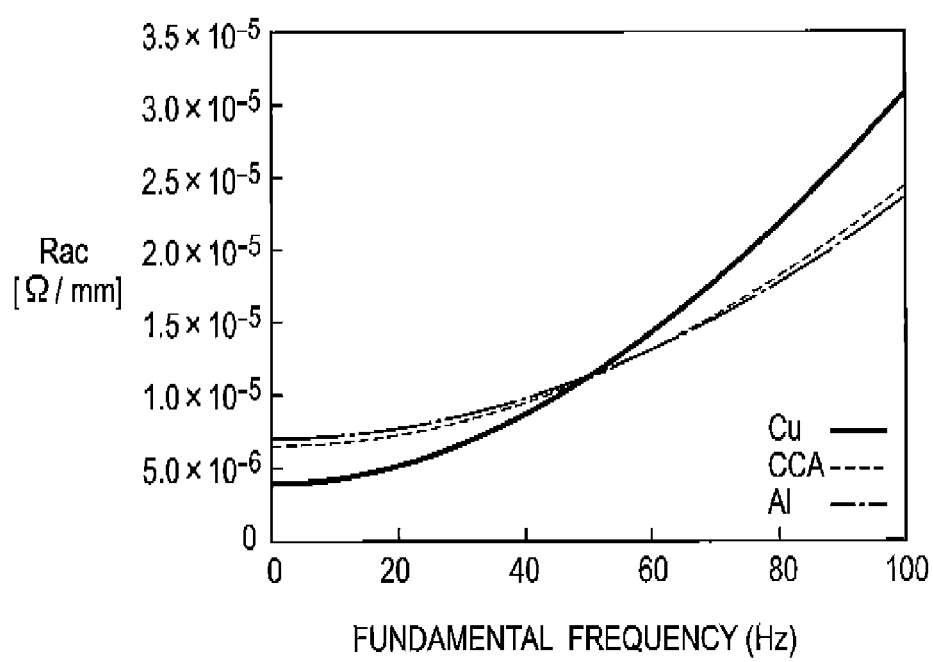
FIG. 54 is a graph illustrating the high-frequency resistance dynamic characteristics (No. 1) of the coils wound with the CCA wire and Al wire according to the third example of the second embodiment of the present invention and the coil wound with the Cu wire according to the comparative example.
Figures 55, 56, 57:
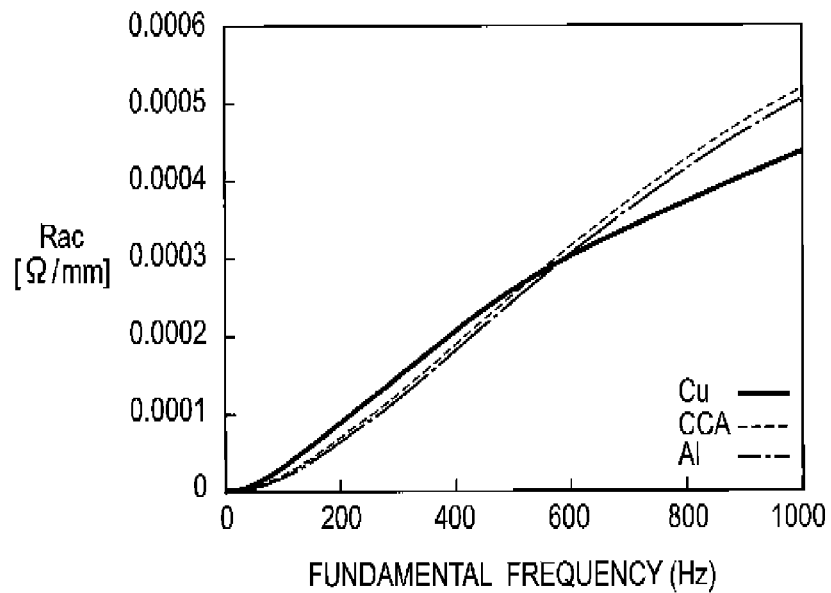
FIG. 55 is a graph illustrating the high-frequency resistance dynamic characteristics (No. 2) of the coils wound with the CCA wire and Al wire according to the third example of the second embodiment of the present invention and the coil wound with the Cu wire according to the comparative example.
FIG. 56 is a table showing the frequency range in which the dynamic characteristic high-frequency resistance of the CCA wire is lower than that of the Cu wire for each different a value in the third example of the second embodiment of the present invention.
FIG. 57 is a table showing the frequency range in which the dynamic characteristic high-frequency resistance of the CCA wire is lower than that of the Cu wire for each different value of radius r in the third example of the second embodiment of the present invention.

FIGS. 54 and 55 show the high-frequency resistance dynamic characteristics when it is assumed that the driving current of FIG. 26 is produced by an inverter device and the waveform constituting the sinusoidal wave does not relatively change even if the frequency changes. FIGS. 54 and 55 show that the resistances of the CCA and Al wires are lower than that of the Cu wire when the frequency f falls in a range of 48 kHz≤f≤511 kHz. In this case, by controlling the frequency of the driving current in a range of 48 Hz≤f≤511 Hz with the first and second frequencies set to 48 Hz and 511 Hz, respectively, it is possible to obtain a high-frequency resistance equal to or lower than that of Cu wire.

In the above description of the third example of the second embodiment of the present invention, the electric wire 222 has a circular cross-section. The cross-sectional shape of the electric wire 222 may be flat or rectangular. An electric wire made of CCA wire having a cross-sectional area of at least 4.5 $mm^2$ can provide the same effect. Moreover, in the case where the density of the winding and the length of the electric wire 222 of the intended electric motor change, the same effect is provided even if a changes in a range of 0.9 $mm^{-1}$≤$\alpha$≤3.2 $mm^{-1}$.

FIG. 56 shows frequency ranges corresponding to different $\alpha$ values in coils wound with conducting wires of a same shape, in which the dynamic characteristic high-frequency resistance of the CCA wire is lower than that of the Cu wire. The larger the value $\alpha$ is (for example, the more closely or the more turns the conducting wires are wound), the wider the frequency range in which the CCA wire is advantageous to the Cu wire.

FIG. 57 shows frequency ranges in which the dynamic characteristic high-frequency resistances of the CCA wire is lower than that of Cu wire for each conducting wire of different radii r at a same α=1.6 mm$^{-1}$. FIG. 57 reveals that the thicker the wire is, the CCA wire is advantageous at the lower frequency.

In the second embodiment of the present invention, the CCA wires and Cu wires having diameters of 1.8 mm, 0.4 mm, and 0.2 mm are described. However, the present invention is not limited to the CCA and Cu wires having the above three different diameters and may be applied to CCA and Cu wires having various diameters.

Moreover, as the electric wire according to the second embodiment of the present invention, the CCA wire is described. However, the electric wire according to the second embodiment of the present invention can be Al wire.

Furthermore, in the description of the electric motors according to the first to third examples of the second embodiment of the present invention, the examples are three-phase AC synchronous motors. However, the electric wire according to the present invention can be applied to electric motor including various coils. The electric motor according to the present invention can be applied to various types of electric motors including coils wound with CCA or Al wire.

(Third Embodiment)
<Electric Wire Structure>

Figure 58A:
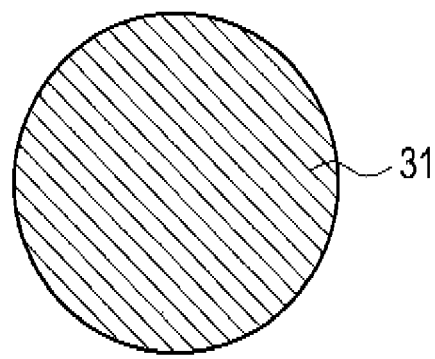
FIG. 58A is a cross-sectional view showing an example of an electric wire according to a third embodiment of the present invention.

As shown in FIG. 58A, an electric wire according to a third embodiment of the present invention includes a conductive portion 31 made of a material having a volume resistivity higher than that of copper. In the electric wire according to the third embodiment of the present invention, direct current resistance value per unit length, which is obtained by dividing the volume resistivity of the conductive portion 31 by the cross-sectional area thereof, is specified so that, among first and second frequencies at which the AC resistance of the electric wire is equal to that of Cu wire and between which the AC resistance of the electric wire is lower than that of Cu wire, the second frequency is not lower than the upper limit of the particular frequency range.

The diameter of the conductive portion 31 is desirably about 0.05 mm to 0.6 mm but is not particularly limited. The material of the conductive portion 31 can be copper alloy such as brass, phosphor bronze, silicon bronze, copper-beryllium alloy, and copper-nickel-silicon alloy. The brass is an alloy (Ch—Zn) containing copper (Cu) and zinc (Zn) and may contain small amounts of elements other than copper and zinc. The silicon bronze is an alloy (Cu—Sn—Si) containing copper (Cu), tin (Sn), and silicon (Si) and may contain small amounts of elements other than copper, tin, and silicon. The phosphor bronze is an alloy (Cu—Sn—P) containing copper, tin, and phosphor (P) and may contain small amounts of elements other than copper, tin, and phosphor.

These copper alloy wires are subjected to annealing, for example, and may be plated with tin, copper, chrome (Cr), or the like. Moreover, the conductive portion 31 may have various shapes such as a cylinder or a rectangle.

Figure 58B:
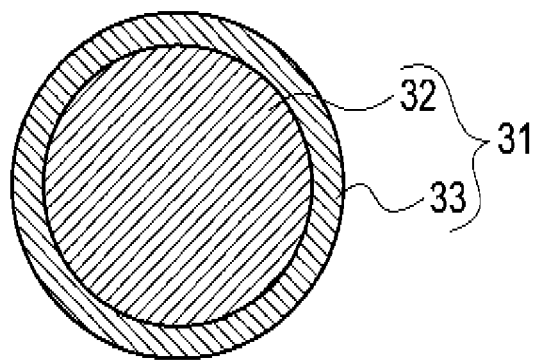
FIG. 58B is a cross-sectional view showing another example of the electric wire according to the third embodiment of the present invention.

Moreover, as shown in FIG. 58B, the electric wire according to the third embodiment of the present invention may be CCA wire including, as the conductive portion 31, a central conductor 32 composed of aluminum (Al) or aluminum alloy and a cover layer 33 composed of copper (Cu) covering the central conductor 32.

The entire CCA wire desirably has a diameter of about 0.05 mm to 0.6 mm. The cross-sectional area of the cover layer 33 is not more than 15% of the cross-sectional area of the entire electric wire composed of the central conductor 32 and cover layer 33, desirably about 3% to about 15%, more preferably about 3% to about 10%, and still more preferably about 3% to about 5%. The lower the ratio of the cross-sectional area of the cover layer 33 to that of the entire electric wire, the lower the AC resistance. The central conductor 32 can be made of electrical aluminum (EC aluminum) or aluminum alloy such as Al—Mg—Si alloy (JIS6000s), for example. The aluminum alloy is more desirable than the EC aluminum because the volume resistivity of the aluminum alloy is higher than that of the EC aluminum.

The AC resistances of the electric wire according to the third embodiment of the present invention and Cu wire as the comparative example are calculated through simulation using the aforementioned theoretical equation. This results in finding characteristics that the electric wire according to the third embodiment of the present invention has a smaller eddy-current loss than Cu wire of the same diameter because of the proximity effect and therefore has a lower AC resistance.

FIG. 13 shows the relationship between the frequency and AC resistance of brass wire and Cu wire as the comparative example at an external magnetic strength H of 1 A/mm, the brass wire and Cu wire having a diameter of 0.4 mm. In a frequency range lower than the first frequency f1, the AC resistance of the brass wire is higher than that of the Cu wire. At the first frequency f1, the AC resistance of the brass wire is equal to that of the Cu wire. In a frequency range higher than the first frequency f1, the eddy current loss is dominant, and the relative magnitudes of the AC resistances of the brass wire and Cu wire are therefore reversed. In a frequency range between the first frequency f1 and the second frequency f2, the AC resistance of the Cu wire is higher than that of the brass wire. At the second frequency f2, the AC resistance of the brass wire equals to that of the Cu wire again. In a frequency range higher than the second frequency f2, the proximity effect in the brass wire has more influence than that in the Cu wire has, and the relative magnitudes of the AC resistances of the brass wire and Cu wire are therefore reversed.

FIG. 14 shows a relationship in the brass wire having a diameter of 0.4 mm between the frequency of current and the sum of the skin effect component $R_s$ and DC resistance component $R_{dc}$ and between the frequency and the proximity effect component $R_p$ at an external magnetic field strength H of 1 A/mm. The DC resistance component $R_{ac}$ is a value when the frequency is 0.

Figure 59:
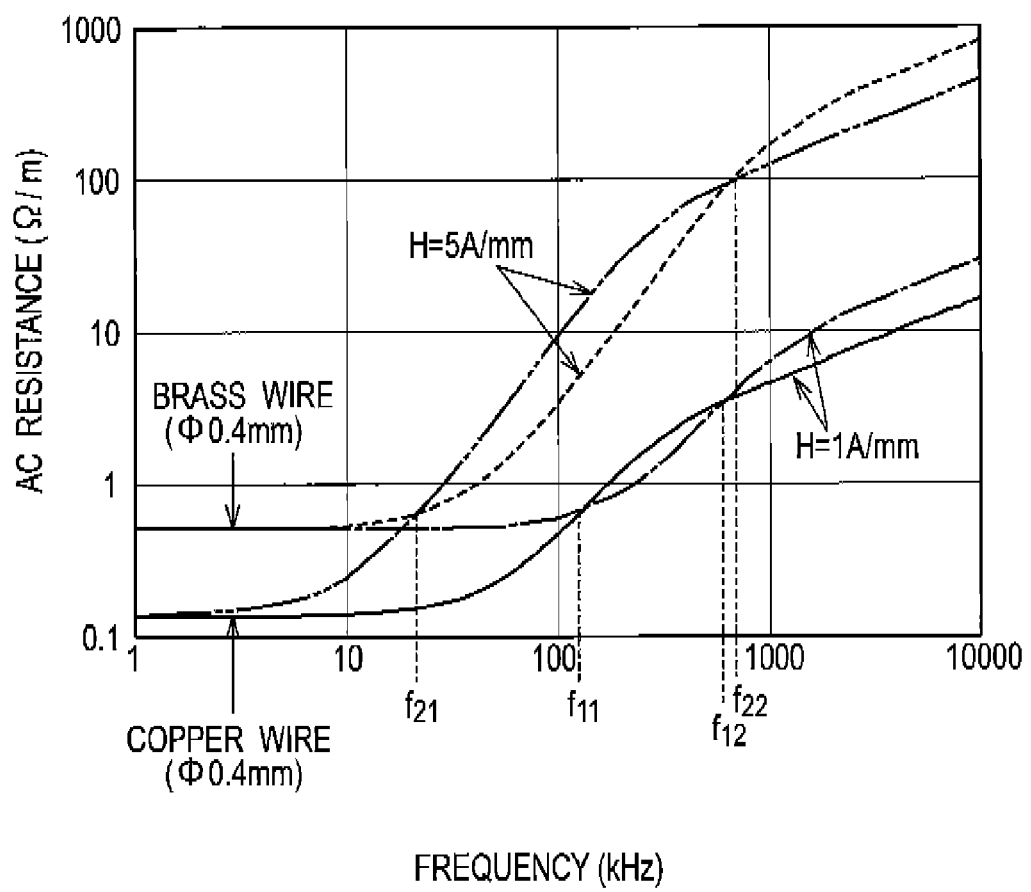
FIG. 59 is a graph illustrating the relationship between the frequency and AC resistance of Cu wire and brass wire according to the third embodiment of the present invention.

FIG. 59 shows a relationship between the frequency and AC resistance of brass wire and Cu wire when the external magnetic field strength H is 1 or 5 A/mm. Herein, the brass wire and Cu wire have a diameter of 0.4 mm. As shown in FIG. 59, the proximity effect component $R_p$ is more strongly dependent on the magnetic field strength than that of the skin effect component $R_s$ is. The AC resistances $R_{ac}$ of the Cu wire and brass wire at the second frequency (f12, f22) each of which is almost occupied by the proximity effect component $R_p$, proportionally increase as the magnetic field strength increases. Accordingly, the second frequency (f12, f22) changes very little. On the other hand, as the external magnetic field strength increases, the proximity effect component $R_p$ increases, and the first frequency (f11, f21), which is greatly influenced by the DC resistance component $R_{dc}$, shifts to lower frequency.

Figures 61, 62:
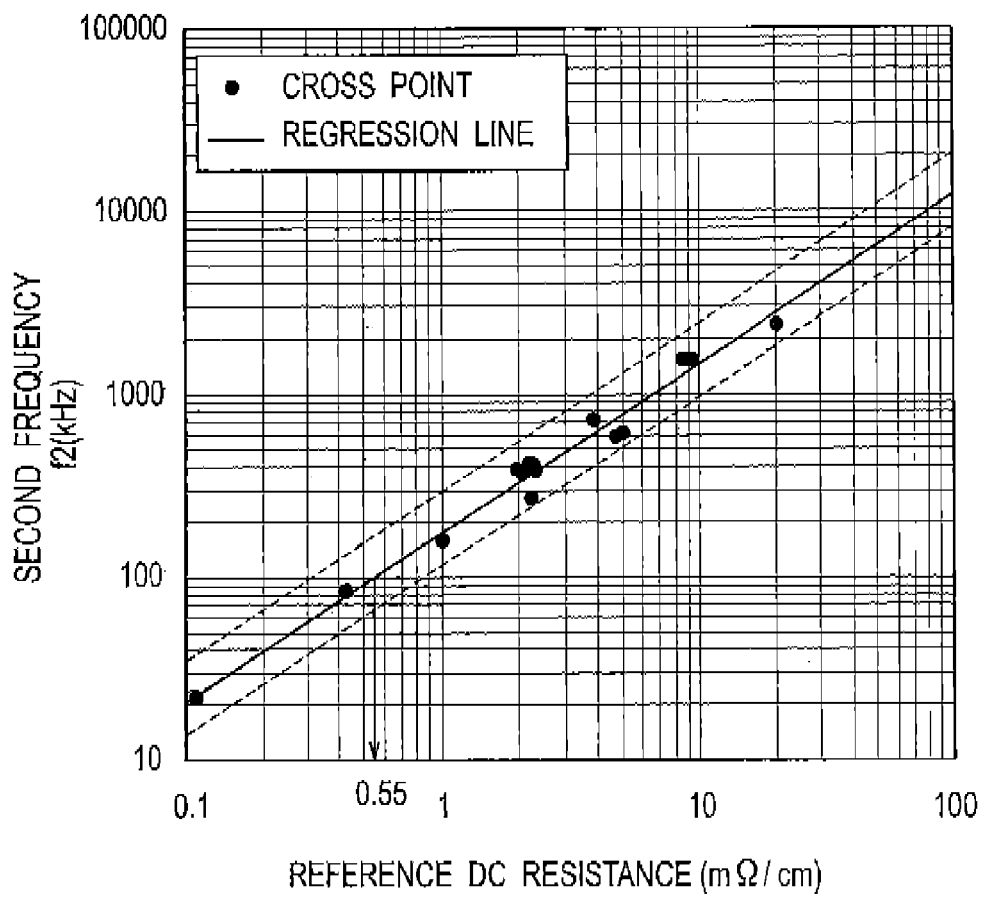
FIG. 61 is a graph illustrating the relationship between the reference DC resistance and second frequency according to the third embodiment of the present invention.
FIG. 62 is a table showing losses of brass and copper winding wires.

Herein, the DC resistance per unit length, which is obtained by dividing the volume resistivity of metal applied to the conductor by the cross-sectional area thereof, is defined as reference DC resistance. As shown in FIG. 60, the reference DC resistance and second frequency are calculated by varying the material and diameter of the conductor. FIG. 60 shows the calculation results for the following materials of the conductor: Al wire in which the central conductor 31 shown in FIG. 58A is made of pure aluminum; 5% CCA wire in which the central conductor 22 shown in FIG. 58B is made of aluminum and the cross-sectional area of the cover layer 33 is 5% of the cross-sectional area of the entire electric wire; 10% CCA wire in which the central conductor 32 shown in FIG. 58B is made of aluminum, and the cross-sectional area of the cover layer 33 is 10% of that of the entire electric wire; 15% CCA wire in which the central conductor 32 shown in FIG. 58B is made of aluminum and the cross-sectional area of the cover layer 33 is 15% of that of the entire electric wire; 5% CCA (alloy Al) wire in which the central conductor 32 shown in FIG. 58B is made of aluminum alloy and the cross-sectional area of the cover layer 33 is 5% of that of the entire electric wire; and wires in which the conductive portion 31 shown in FIG. 58A is made of brassy silicon bronze, and phosphor bronze. The volume resistivity of CCA wires is an equivalent volume resistivity calculated by conversion using the ratio of cross-sectional areas of the two layers. The calculation results are subjected to a regression analysis, thus providing a regression line as represented by a solid line in FIG. 61. To be specific, FIG. 61 shows that the reference DC resistance and the second frequency has a relationship of the following equation (53) where the reference DC resistance is $R_{dc}$ and the second frequency is $f_2$.

$$f_2 = 10^{(0.925 \times log_{10} Rdc + 2.24)} \quad (53)$$

In the electric wire according to the third embodiment of the present invention, the reference DC resistance value of the conductive portion 31 is specified using the equation (53) so that the second frequency is not less than the upper limit of the particular frequency range in which the electric wire is used. In other words, the volume resistivity, cross-sectional area, material, shape, diameter, and the like of the conductive portion 31 are specified so as to give the specified reference DC resistance value.

There is increasing use of devices driven by high-frequency current of a frequency of about several kHz to 100 kHz. Accordingly, the second frequency is desirably set to about 100 kHz or more, for example, and therefore the reference DC resistance is desirably set to about 0.55 mΩ/cm or more.

As shown in FIG. 10, magnetic field generating coils for an IH cooker were manufactured in such a manner that 55 strands (diameter: 0.4 mm, length: 6.6 m) in a litz wire construction are used to be wound in 17 turns, each strand being composed of the brass wire according to the third embodiment of the present invention or the Cu wire according to the comparative example. The manufactured coils were subjected to the characteristic confirmation tests. The test results are shown in FIGS. 11 and 12. IH cookers generally use high frequency current of about 20 kHz to 60 kHz. The test revealed that in a frequency range including about 20 kHz to 60 kHz, the AC resistance of the brass wire is lower than that of the Cu wire.

Moreover, in a winding wire of a high-frequency transformer incorporated in a switching power supply, as shown in FIG. 20, current having a highly distorted waveform flows. This is because the frequency of the alternating current contains many high-order harmonic components in addition to the frequency (fundamental frequency) of the fundamental. Accordingly, the loss (copper loss) generated in the high-frequency transformer is the sum of the direct-current component and the fundamental frequency and high-order harmonic components. As shown in FIG. 62, for example, the loss of a brass winding wire according to the third embodiment of the present invention, which has a diameter of 0.2 mm, is 5.3 W, and the loss of a Cu winding wire according to the comparative example, which has a diameter of 0.6 mm, is 14.5 W.

Accordingly, it is preferable that the second frequency is set to not lower than the high-order harmonic component of used alternating current. It may be properly determined depending on the intended purpose of the CCA wire which ones of the high-order harmonic components are to be considered. For example, it is possible to consider the frequency range from the fundamental frequency up to the tenth-order harmonic component or the frequency range from the fundamental frequency up to the twentieth-order harmonic component.

According to the high-frequency electric wire according to the third embodiment of the present invention, the reference DC resistance value of the conductive portion 31 of the electric wire is specified using the equation (53) so that the second frequency is not less than the upper limit of the particular frequency range. As a result, when the electric wire is used in a particular frequency range, the eddy current loss of the electric wire can be made equal to or less than that of Cu wire having the same diameter, and the AC resistance thereof can be therefore reduced.

FIG. 61 shows two dashed lines which are 0.7 and 1.3 times the regression line represented by the solid line. In the third embodiment of the present invention, the reference DC resistance value may be specified in a range of the band width between the two dashed lines shown in FIG. 61 in consideration of variations of the regression line of about +/−30%. To be specific, the reference DC resistance value $R_{dc}$ of the high-frequency electric wire according to the third embodiment of the present invention may be specified as the following relationship. Herein, the second frequency is indicated by $f_2$.

$$0.7 \times 10^{(0.925 \times log_{10} Rdc + 2.24)} \leq f_2 \leq 1.3 \times 10^{(0.925 \times log_{10} Rdc + 2.24)} \quad (54)$$

This allows for a margin of the reference direct-current in an effective range, thus enhancing the flexibility in designing the volume resistivity, cross-sectional area material, shape, diameter, and the like of the conductive portion 31 which determine the reference DC resistance value.

In the above-described example, the reference DC resistance value is specified in a range of +/−30% of the regression line. However, from the perspective of ensuring that the second frequency be equal to or more than the upper limit of the particular frequency range, the reference DC resistance value is specified preferably in a range of +/−20% of the regression line and more preferably in a range of +/−10% thereof.

The reference DC resistance value $R_{dc}$ may be specified to as to satisfy the following equation.

$$f_0 \leq 10^{(0.925 \times log_{10} Rdc + 2.24)} \quad (55)$$

Herein, $f_0$ is the upper limit of the particular frequency range. The second frequency can be therefore set equal to or higher than the upper limit of the particular frequency range. Moreover, the reference DC resistance value can be specified in a range satisfying the relationship of the equation (55). This can therefore enhance the flexibility in designing the volume resistivity, crass-sectional area, material, shape, diameter, and the like of the conductive portion 31 which determine the reference DC resistance value.

<Electric Wire Designing Apparatus>

Figure 63:
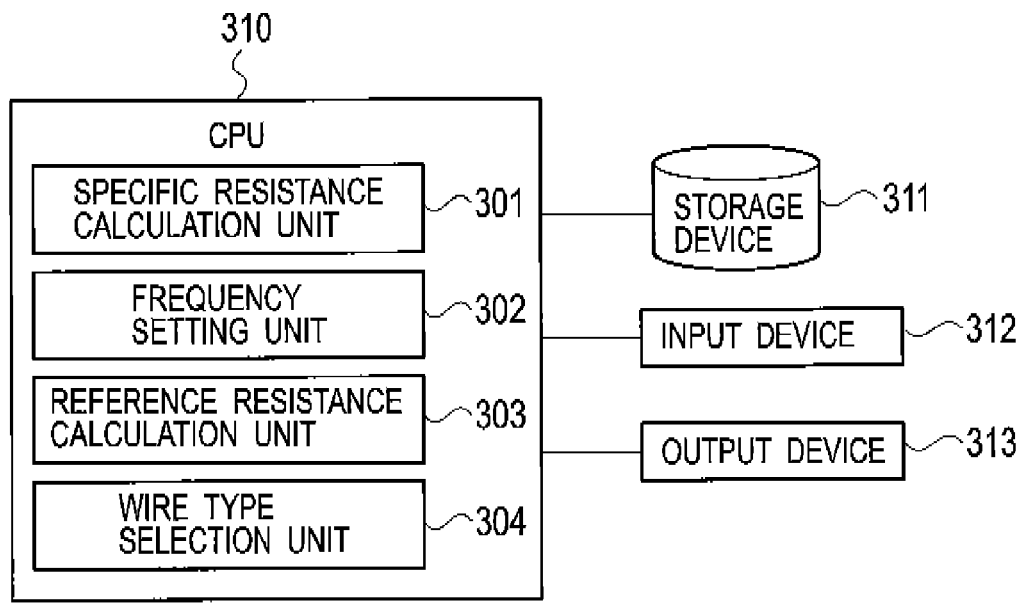
FIG. 63 is a schematic diagram showing an example of an apparatus for designing the electric wire according to the third embodiment of the present invention.

As shown in FIG. 63, an electric wire designing apparatus according to the third embodiment of the present invention includes a central processing unit (CPU) 310, a storage device 311, an input device 312, and an output device 313.

The CPU 310 logically includes a specific resistance calculation unit 301, a frequency setting unit 302, a target resistance calculation unit 303, and a wire type selection unit 304 as modules (logical circuits) which are hardware sources.

The specific resistance calculation unit 301 reads necessary information from the storage device 311 and calculates a reference DC resistance value specific to each wire type of electric wire which can be produced. The wire type includes a combination of the material, shape, diameter, and the like. The reference DC resistance value of each wire type may be stared in the storage device 311 in advance or may be inputted from the input device 312.

The frequency setting unit 302 reads from the storage device 311, the particular frequency range in which the designed electric wire is used and sets, among the first frequency and second frequency higher than the first frequency, the second frequency which is equal to or higher than the upper limit of the particular range, the first and second frequencies being frequencies at which the AC resistance of the electric wire is equal to that of Cu wire having the same diameter as that of the electric wire and between which the AC resistance of the electric wire is lower than that of the Cu wire. For example, the second frequency is set equal to the upper limit of the particular frequency range. At this time, the upper limit of the particular frequency range which is set as the second frequency may be a tenth-order harmonic frequency or higher or may be a twentieth-order harmonic frequency or higher, for example.

The target resistance calculation unit 303 calculates a target reference DC resistance value using the equations (53) and (54) based on the second frequency set by the frequency setting unit 302. Moreover, the target resistance calculation unit 303 may read from the storage device 311, the particular frequency range in which the designed electric wire is used and calculate the target reference DC resistance value so as to satisfy the relationship of the equation (55).

The wire type selection unit 304 selects the type of electric wire according to the specific and target reference DC resistance values which are calculated by the specific resistance calculation unit 301 and target resistance calculation unit 303, respectively. To be specific, the wire type selection unit 304 selects one from the plural wire types whose specific DC resistance value, which is calculated by the specific resistance calculation unit 301, is not less than the target reference DC resistance value calculated by the target resistance calculation unit 303.

The storage device 311 stores: information necessary to calculate the reference DC resistance values of the plural wire types; the particular frequency range used by each device to which the electric wire is applied; information concerning the equations (53) and (54); the reference direct current resistance values calculated by the specific resistance calculation unit 301; the second frequency set by the frequency setting unit 302; the reference DC resistance value calculated by the target resistance calculation unit 303; the wire type determined by the wire type selection unit 304; and the like. The storage device 311 can be a semiconductor memory, a magnetic disk, an optical disk, or the like, for example. The storage device 311 can be caused to function as a storage device or the like storing programs executed by the CPU 310 (the programs are described in detail). The storage device 311 can be caused to function as a temporary data memory or the like which temporarily stores data used in the program execution process of the CPU 310 or is used as a work area.

The input device 312 can include a recognition device such as a touch panel, a keyboard, a mouse, or an OCR, an image input device such as a scanner or a camera, a voice input device such as a microphone, or the like, for example. The output device 313 can be a display device such as a liquid crystal device (LCD), an organic electroluminescence (EL) display, or a CRT display, a printing device such as an ink-jet printer, a laser printer, or the like.

<High-Frequency Electric Wire Manufacturing Method>

Figure 64:
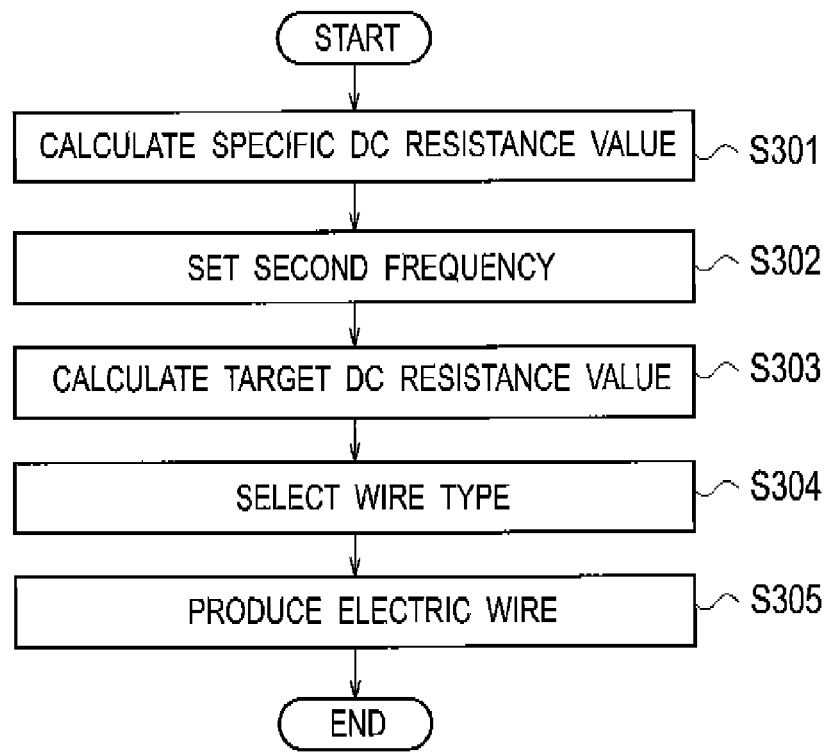
FIG. 64 is a flowchart for explaining examples of methods of designing and manufacturing the electric wire according to the third embodiment of the present invention.

Using a flowchart of FIG. 64, a description is given of an example of the method of manufacturing a high-frequency electric wire including the designing method using the electric wire design apparatus according to the third embodiment of the present invention. Herein, the description is given of the method of manufacturing CCA wire, but it is certain that the high-frequency electric wire is not limited to the same.

i) In step S301, the specific resistance calculation unit 301 reads necessary information from the storage device 311 and calculates the reference DC resistance value for each wire type of high-frequency electric wire, which includes a combination of the material, shape, diameter, and the like. The calculated reference DC resistance values are stored in the storage device 311. The reference DC resistance value of each wire type may be stored in the storage device 311 in advance or may be inputted from the input device 312. Alternatively, the reference DC resistance values specific to the respective wire types may be actually measured instead of being calculated using the theoretical equations.

ii) In step S302, the frequency setting unit 302 reads from the storage device 311, the particular frequency range in which the designed electric wire is used and sets, among the first frequency and second frequency higher than the first frequency, the second frequency equal to or higher than the upper limit of the particular frequency range, the first and second frequencies being frequencies at which the AC resistance of the electric wire is equal to that of Cu wire having the same diameter as that of the electric wire and between which the AC resistance of the electric wire is lower than that of the Cu wire. The set second frequency is stored in the storage device 311.

iii) In step S303, the target resistance calculation unit 303 calculates the target reference DC resistance value using the equation (53) or (54) based on the second frequency set by the frequency setting unit 302, the calculated reference DC resistance value is stored in the storage device 311. Moreover, the target resistance calculation unit 303 may read from the storage device 311, the particular frequency range in which the designed electric wire is used and calculate the target reference DC resistance value so as to satisfy the relationship of the equation (55).

iv) In step S304, the wire type selection unit 304 determines, among the plural wire types, a wire type whose specific DC resistance value, that is calculated by the specific resistance calculation unit 301, is not less than the reference DC resistance value calculated by the target resistance calculation unit 303. The determined wire type is stared in the storage device 311.

v) In step S305, electric wire of the wire type determined by the wire type selection unit 304 is manufactured, the wire type being determined by a combination of the material, shape, diameter, and the like. In the case of CCA wire, for example, the central conductor 32 which has a diameter of 9.5 mm to 12.0 mm and is made of aluminum or aluminum alloy is prepared. The surface of the central conductor 31 is covered with the cover layer 32 by performing TIG welding, plasma welding, or the like with about 0.1 mm to 0.4 mm thick copper tape longitudinally attached to the surface of the central conductor 32. Next, the central conductor 31 covered with the cover layer 32 is subjected to skin pass rolling to have a diameter of about 9.3 mm to 12.3 mm, thus producing a base material composed of the central conductor 21 covered with the cover layer 22. Next, the base material is drawn through plural drawing dies (through about 25 to 26 dies). By causing the base material to pass through the plural drawing dies, the electric wire finally has a diameter equal to the determined diameter.

By the method of manufacturing a high-frequency electric wire including the designing method using the electric wire designing apparatus according to the third embodiment of the present invention, the wire type can be determined from the reference resistance value calculated using the equation (53) or (54). As a result, the second frequency is set higher than the upper limit of the particular frequency range in which the high-frequency electric wire is used. Accordingly, in the particular frequency range, the eddy current loss of the high-frequency electric wire can be made equal to or less than that of Cu wire having the same diameter, so that the diameter of the high-frequency electric wire can be designed to reduce the AC resistance.

<Electric Wire Designing Program>

The series of steps shown in FIG. 64, which includes: i) step of calculating a DC resistance value per unit length for each wire type of the high-frequency electric wire which includes a combination of the material, shape, diameter, and the like; ii) step of, among the first frequency and the second frequency higher than the first frequency, setting the second frequency to a value equal to or higher than the upper limit of the particular frequency range, the first and second frequencies being frequencies at which the alternating-current of the electric wire is equal to that of the Cu wire having a same diameter as the electric wire and between which the alternating-current of the electric wire is lower than that of the Cu wire; iii) step of calculating the reference DC resistance value from the second frequency; iv) step of determining the type of electric wire according to the reference DC resistance value; and the like, can be executed by controlling the electric wire designing apparatus shown in FIG. 63 through a program having an algorithm equivalent to the method shown in FIG. 64.

This program can be stored in the storage device 311 of a computer system constituting the electric wire designing apparatus of the present invention. This program can be also stored in a computer-readable recording medium. By loading this recording medium into the storage device 311 or the like, the series of steps of the third embodiment of the present invention can be executed.

Herein, the computer-readable recording medium refers to a medium in which programs can be recorded, for example, such as a semiconductor memory, a magnetic disk, or an optical disk. For example, the body of the electric wire designing apparatus can be configured to incorporate or be externally connected to a device to read the recording medium. Furthermore, the programs in the recording medium can be stored in the recording device 111 via an information processing network such as a wireless communication network.

The relational equation between the reference DC resistance $R_{dc}$ and the second frequency $f_2$ is described in the equation (53) or (54) by way of example. In the description, the reference DC resistance is calculated using this example. However, to be strict, the relationship between the reference DC resistance $R_{dc}$ and the second frequency $f_2$ is not limited to the equation (53) or (54). The reference DC resistance may be calculated using another theoretical equation.

(Fourth Embodiment)
<High-frequency Electric Wire Structure>

Figure 65:
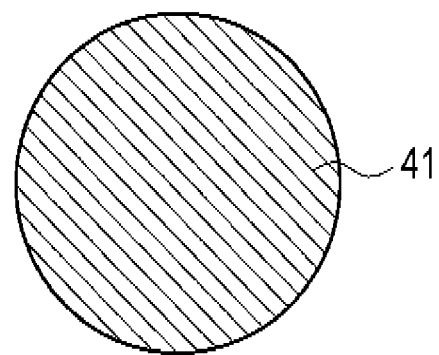
FIG. 65 is a cross-sectional view showing an example of a high-frequency electric wire according to a fourth embodiment of the present invention.

A high-frequency electric wire according to a fourth embodiment of the present invention is an electric wire used in a frequency range of about 10 kHz to about 1 MHz and, as shown in FIG. 65, includes a conductive portion 41 made of copper alloy having a higher volume resistivity than that of copper.

The diameter of the conductive portion 31 is desirably about 0.05 mm to 0.6 mm but is not particularly limited. The copper alloy layer 1 is made of brass, phosphor bronze, silicon bronze, or the like, for example. The brass is an alloy (Cu—Zn) containing copper (Cu) and zinc (Zn) and may contain small amounts of elements other than copper and zinc. The silicon bronze is an alloy (Cu—Sn—Si) containing copper (Cu), tin (Sn), and silicon (Si) and may contain small amounts of elements other than copper, tin, and silicon. The phosphor bronze is an alloy (Cu—Sn—P) containing copper, tin, and phosphor (P) and may contain small amounts of elements other than copper, tin, and phosphor.

Normal winding wires of transformers, reactors, and the like are composed of Cu wire coated and insulated with polyurethane, polyester, polyester, polyesterimide, polyamide-imide, polyimide, or the like. In a coaxial cable, high-frequency current signals flow. Accordingly, coaxial cables are composed of CCA wire, which includes Al wire covered with a thin copper layer outside, for example, in the light of the skin effect characteristics.

In recent years, there are increasing applications of devices through which high-frequency current of several kHz to several hundreds kHz passes, including high-frequency transformers, high-speed motors, reactors, induction heaters, and magnetic head devices. In the high-frequency electric wire used in such devices, generally, thinner winding wires or litz wires are generally used for the purposes of reducing the alternating-current loss. However, there is a limit in thinning wires because the work of removing the insulation coating at the soldering process for connection becomes difficult and the number of strands is increased. On the other hand, with the high-frequency electric wire according to the fourth embodiment of the present invention, electric wires which are thinned to prevent an increase in AC resistance can be further provided with the effect of preventing an increase in AC resistance without using litz wire construction.

As for high-frequency electric wire and high-frequency coils including the same as the strands, the external magnetic field tends to avoid the high-frequency electric wire. However, in a comparatively low frequency range less than several hundreds kHz, the external magnetic field cannot avoid the high-frequency electric wire and uniformly enters the inside of the high-frequency electric wire to induce eddy currents due to the proximity effect. At this time, the higher the conductivity of the material of the high-frequency electric wire (or the smaller the volume resistivity), the larger the eddy current is, and the higher the AC resistance.

Furthermore, in a comparatively high frequency range not lower than about several tens MHz, as shown in FIG. 4, the external magnetic field hardly enter the inside of the high-frequency electric wire as shown in FIG. 4. At this time, the higher conductivity the material of the high-frequency electric wire has (or, the smaller volume resistivity), the more the magnetic field is concentrated in the surface layer of the high-frequency electric wire, so that current in the surface layer is strengthened. Accordingly, it is learned that the higher the frequency, the more the eddy current loss is because of the proximity effect and the higher the AC resistance.

Figure 66:
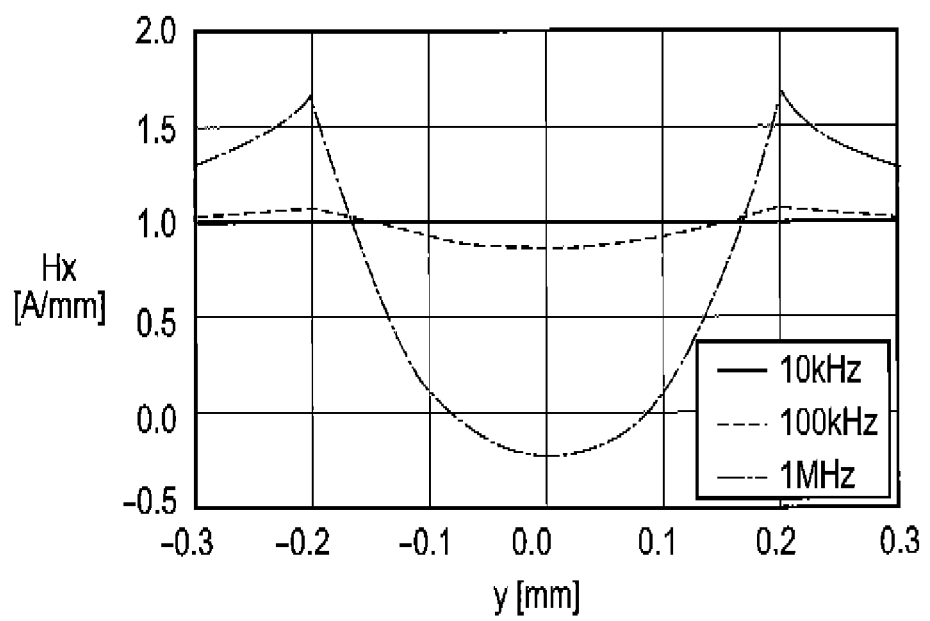
FIG. 66 is a graph illustrating a magnetic field strength distribution of the Cu wire according to the comparative example.
Figures 67, 68:
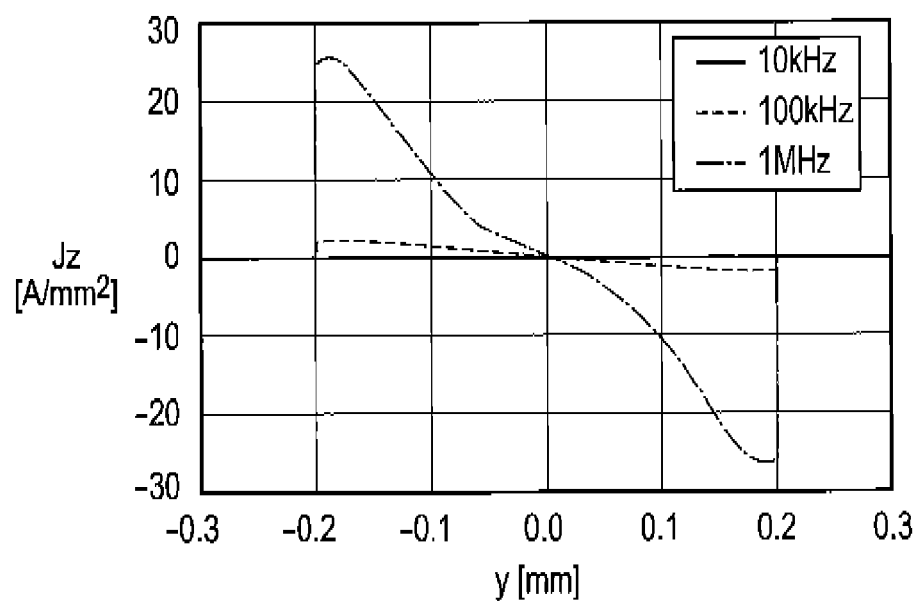
FIG. 67 is a graph illustrating a current density distribution of the Cu wire according to the comparative example.
FIG. 68 is a table showing volume resistivity of the materials of the high-frequency electric wire according to the fourth embodiment of the present invention.

FIGS. 66 and 67 respectively show the magnetic field strength distribution and the current density distribution of Cu wire with a radius of 0.2 mm along the axis y (in the cross-section direction) when high-frequency currents of 10 kHz, 100 kHz, and 1 MHz are applied to the Cu wire in an external magnetic field of 1 A/mm. FIG. 66 shows that the higher the frequency, the higher the magnetic field strength in the surface layer of the Cu wire. FIG. 67 shows that the higher the frequency, the higher the current density in the surface layer of the Cu wire and the larger the eddy currents.

Accordingly, in the fourth embodiment of the present invention, copper alloy having a larger volume resistivity than that of copper is applied to a high-frequency electric wire. As shown in FIG. 68, each of brass, phosphor bronze, and silicon bronze has a volume resistivity higher than copper at 20° C. Although pure aluminum has a volume resistivity higher than that of copper, Al wire is covered with oxide film, which is difficult to remove. On the other hand, copper alloy such as brass, phosphor bronze, and silicon bronze does not have such a problem and are advantageous.

As described above, in the high-frequency electric wire according to the fourth embodiment of the present invention, the conductive portion 41 is made of copper alloy having a volume resistivity higher than that of copper, such as brass, phosphor bronze, and silicon bronze. Accordingly, in the case of using the high-frequency electric wire, the eddy current loss thereof is smaller than that in the case of using Cu wire in the predetermined frequency range, and the AC resistance can be therefore reduced.

FIRST EXAMPLE

Figure 69:
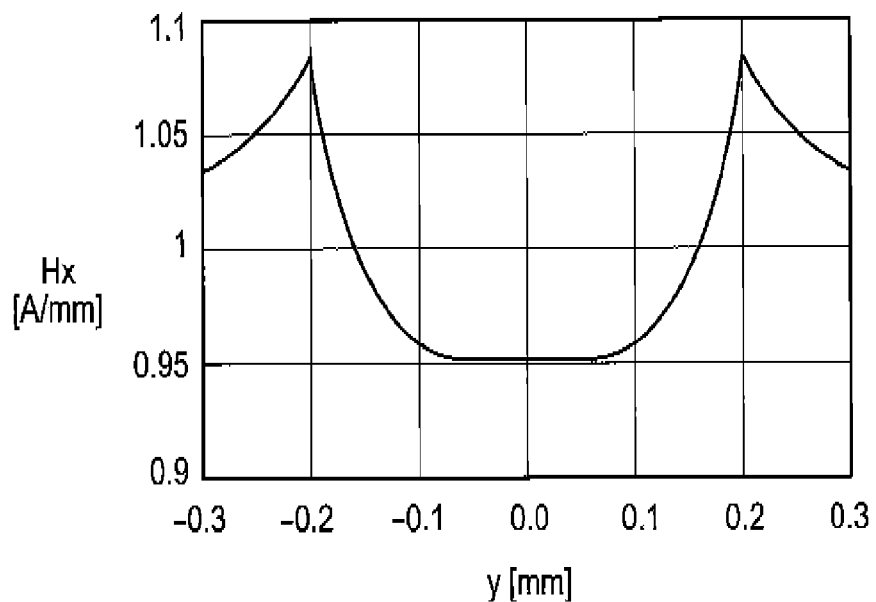
FIG. 69 is another graph illustrating a magnetic field strength distribution of the Cu wire according to the comparative example.
Figure 70:
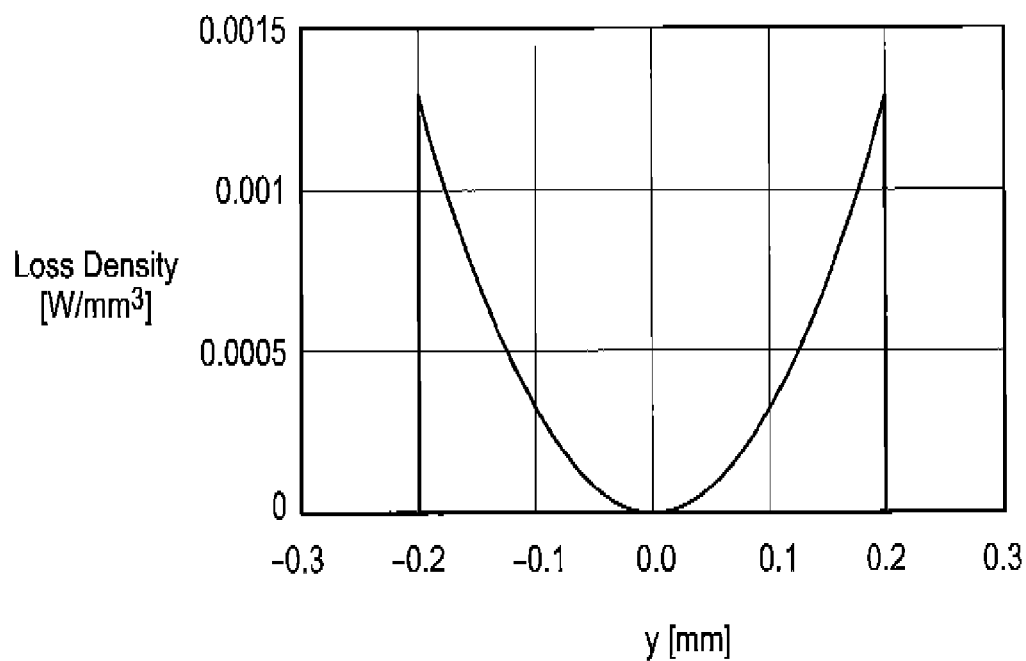
FIG. 70 is a graph illustrating a loss distribution of the Cu wire according to the comparative example.
Figure 71:
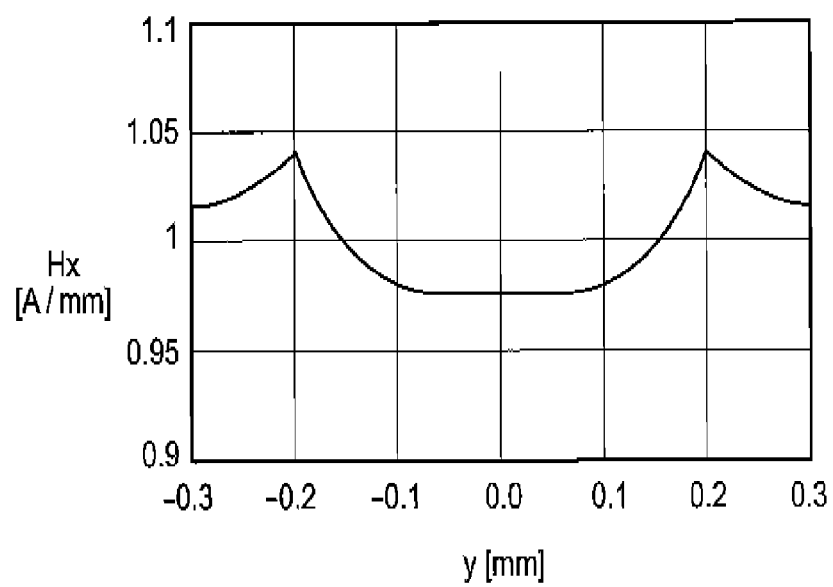
FIG. 71 is a graph illustrating a magnetic field strength distribution of a silicon bronze wire according to the fourth embodiment of the present invention.
Figure 72:
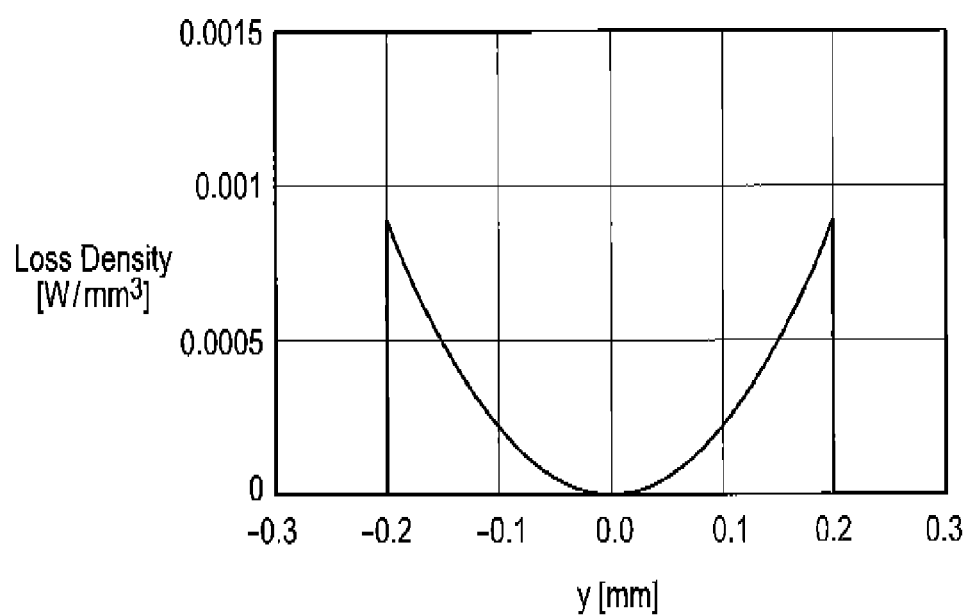
FIG. 72 is a graph illustrating a loss distribution of the silicon bronze wire according to the fourth embodiment of the present invention.

As a first example, a description is given of measurement results of the magnetic field strength distribution and loss distribution of the high-frequency electric wire according to the fourth embodiment of the present invention. FIGS. 69 and 70 respectively show the magnetic field strength distribution and loss distribution of Cu wire having a radius of 0.2 mm along the y axis when current of 100 kHz is applied to the Cu wire at an external magnetic strength of 1 A/mm. FIGS. 71 and 72 respectively show the magnetic field strength distribution and loss distribution of silicon bronze wire (the radius: 0.2 mm) as the high-frequency electric wire according to the fourth embodiment of the present invention, along the y axis when current of 100 kHz is applied to the silicon bronze wire at an external magnetic strength of 1 A/mm. Comparison of FIGS. 71 and 69 reveals that the magnetic field strength of silicon bronze in the surface layer is smaller than that of Cu wire. Moreover, comparison of FIGS. 72 and 70 reveals that the eddy current loss of the silicon bronze wire is smaller than that of the Cu wire.

Figure 73:
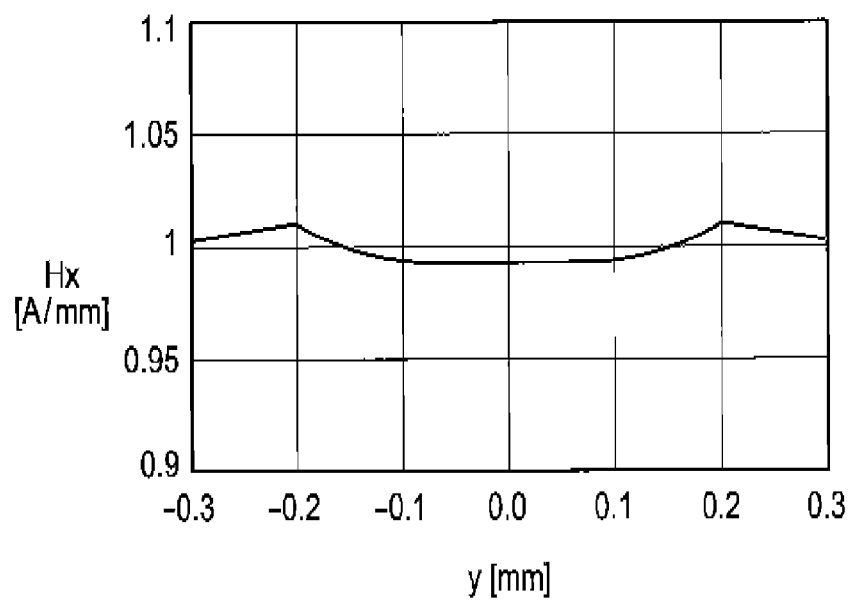
FIG. 73 is a graph illustrating a magnetic field strength distribution of a brass wire according to the fourth embodiment of the present invention.
Figure 74:
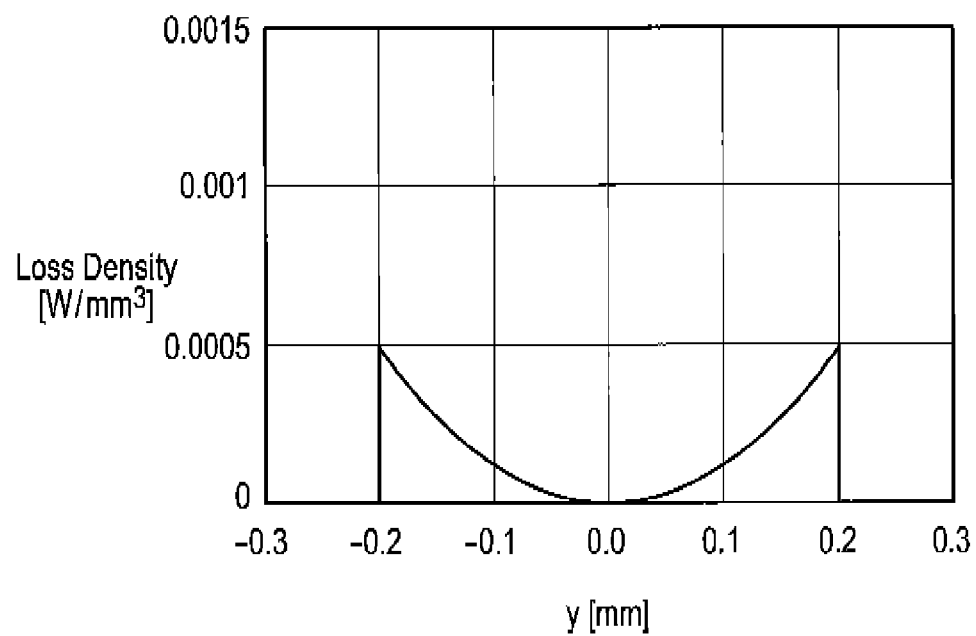
FIG. 74 is a graph illustrating a loss distribution of the brass wire according to the fourth embodiment of the present invention.

FIGS. 73 and 74 respectively show the magnetic field strength distribution and loss distribution of brass wire (the radius: 0.2 mm) as the high-frequency electric wire according to the fourth embodiment of the present invention, along the y axis when current of 100 kHz is applied to the brass wire at an external magnetic strength of 1 A/mm. Comparison of FIGS. 73 and 69 reveals that the magnetic field strength in the surface layer of the brass wire is smaller than that of Cu wire. Moreover, comparison of FIGS. 74 and 70 reveals that the eddy current loss of the brass wire is smaller than that of the Cu wire.

Figure 75:
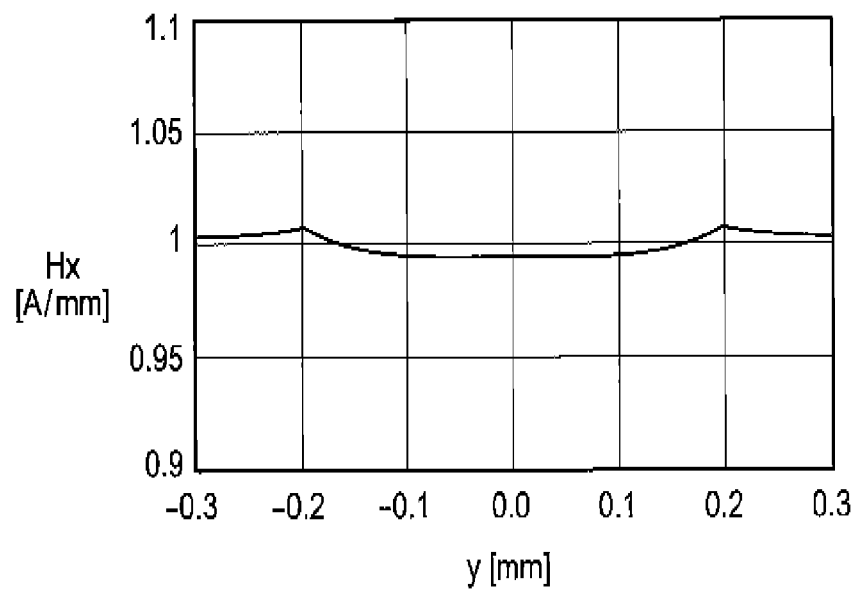
FIG. 75 is a graph illustrating a magnetic field strength distribution of a phosphor bronze wire according to the fourth embodiment of the present invention.
Figure 76:
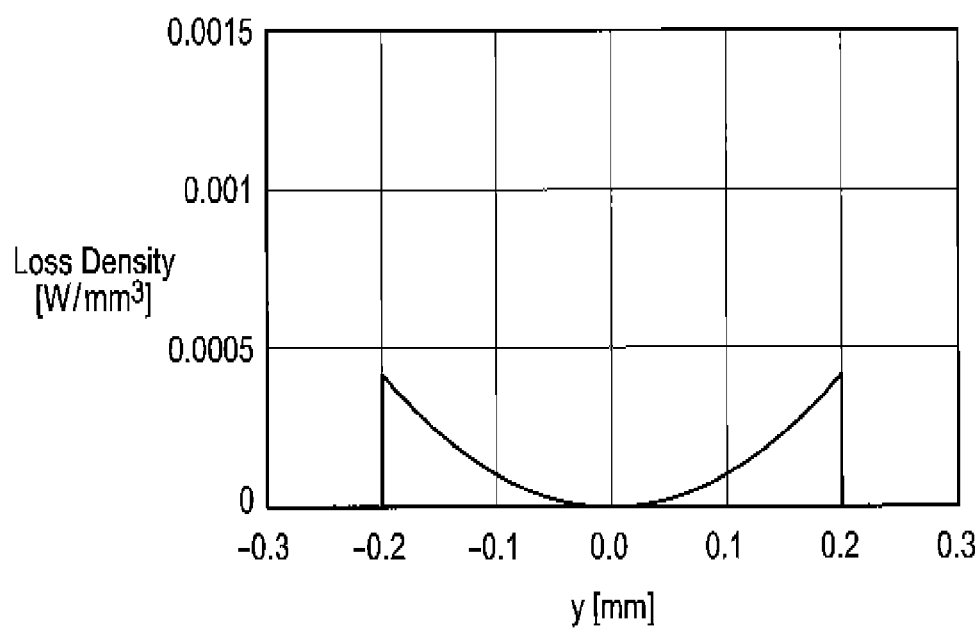
FIG. 76 is a graph illustrating a loss distribution of the phosphor bronze wire according to the fourth embodiment of the present invention.

FIGS. 75 and 76 respectively show the magnetic field strength distribution and loss distribution of phosphor bronze wire (the radius of 0.2 mm) as the high-frequency electric wire according to the fourth embodiment of the present invention along the y axis when current of 100 kHz is applied to the phosphor bronze wire at an external magnetic strength of 1 A/mm. Comparison of FIGS. 75 and 69 reveals that the magnetic field strength in the surface layer of the phosphor bronze wire is smaller than that of Cu wire. Moreover, comparison of FIGS. 76 and 70 reveals that the eddy current loss of the phosphor bronze wire is smaller than that of the Cu wire.

SECOND EXAMPLE

Figure 77:
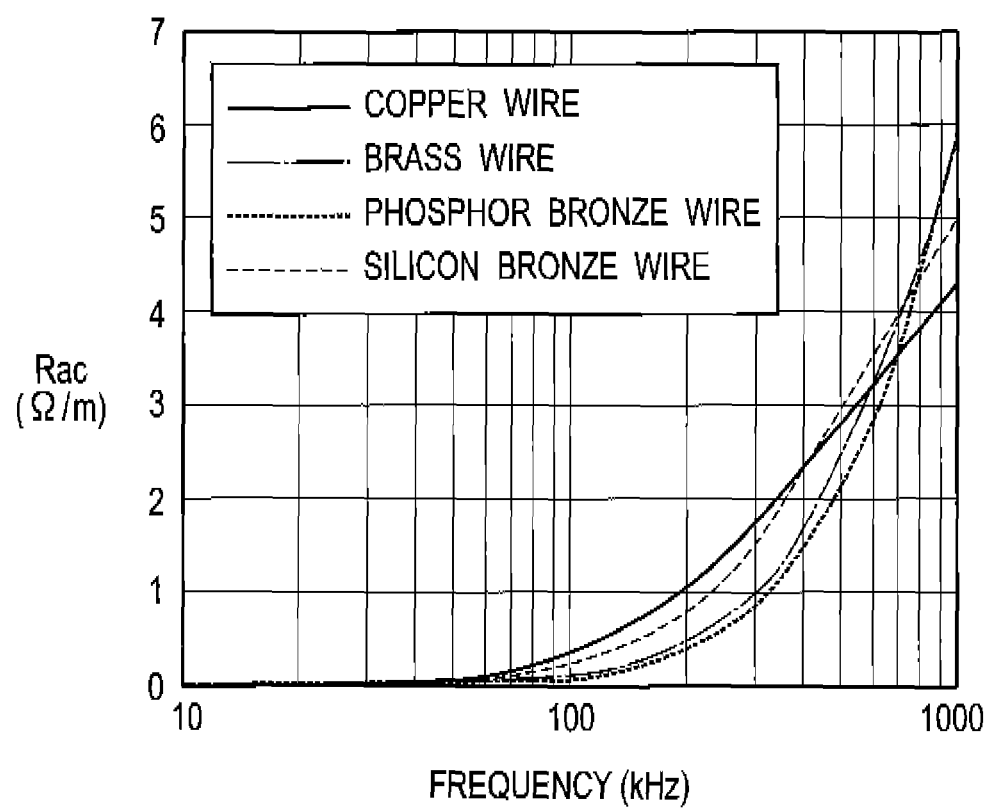
FIG. 77 is a graph illustrating the relationship between the frequency and AC resistance (the proximity effect component) of the brass wire, phosphor bronze wire, and silicon bronze wire according to the fourth embodiment of the present invention and the Cu wire according to the comparative example.

As a second example, FIG. 77 shows AC resistances (proximity effect component) of the brass wire, phosphor bronze wire, and silicon bronze wire according to the fourth embodiment of the present invention and the Cu wire according to the comparative example, the AC resistance being calculated at an external magnetic strength H of 1 (A/mm). FIG. 77 shows that the AC resistance of each of the brass wire, phosphor bronze wire, and silicon bronze wire is smaller than that of the Cu wire in a predetermined frequency range.

THIRD EXAMPLE

As a third example, using each of the brass wire, phosphor bronze wire, and silicon bronze wire according to the fourth embodiment of the present invention and the Cu wire according to the comparative example, 14 strands having a diameter of 0.4 mm are wound 80 turns into a reactor. FIG. 9 shows the measurement results represented by the AC resistance per unit length of the reactor. In FIG. 9, the AC resistance of each of the brass wire, phosphor bronze wire, and silicon bronze wire is smaller than that of the Cu wire. Moreover, compared with a case of the strands shown in FIG. 77, it is revealed that in the case of the reactor, the high-frequency electric wire according to the fourth embodiment has a larger effect on preventing the AC resistance.

FOURTH EXAMPLE

As shown in FIG. 10, magnetic field generating coils for an IH cooker were manufactured in such a manner that 55 strands (diameter: 0.4 mm, length: 6.6 m) in a litz wire construction are used to be wound in 17 turns, each strand being composed of the brass wire according to the first embodiment of the present invention or the Cu wire according to the comparative example. The manufactured coils were subjected to the characteristic confirmation tests. The test results are shown in FIGS. 11 and 12. General IH cookers use high frequency current of about 20 kHz to 60 kHz. In a frequency range including about 20 kHz to 60 kHz, the AC resistance of the brass wire is lower than that of the Cu wire.

<High-Frequency Electric Wire Manufacturing Method>

Next, a description is given of an example of the method of manufacturing the high-frequency electric wire according to the fourth embodiment of the present invention. The manufacturing method below is shown by way of example and is not particularly limited. The high-frequency electric wire according to the fourth embodiment of the present invention can be manufactured by various manufacturing methods.

i) A copper alloy material having a volume resistivity higher than that of copper, including brass, phosphor bronze, and silicon bronze, is prepared. The material has a diameter of about 9.5 mm to 12.0 mm.

ii) Next, the copper alloy member is drawn through plural drawing dies (about 20 dies). By causing the copper alloy member to pass through the plural drawing dies, the electric wire finally has a diameter of about 0.05 mm to about 0.6 mm. The high-frequency electric wire including the conductive portion 41 made of copper alloy shown in FIG. 65 is thus completed.

(Other Embodiment)

As described above, the present invention is described based on the embodiments. However, it should not be understood that the present invention is limited by the description and drawings constituting a part of this disclosure. From this disclosure, various substitutions, examples, and operational techniques will be apparent to those skilled in the art.

The electric wires (high-frequency electric wires) according to the first to fourth embodiments of the present invention are strands (solid wires) in the above description. Some electric wires are bundled into an integrated cable or stranded as a litz wire. In the cases of the integrated cable and litz wire, it is possible to reduce the AC resistance more effectively.

Moreover, the theoretical equations of the AC resistance $R_s$ due to the skin effect and the AC resistance $R_p$ due to the proximity effect are described in the equations (1) to (52) by way of example. However, the methods of calculating the AC resistance $R_{ac}$, the AC resistance $R_s$ due to the skin effect, and the AC resistance $R_p$ due to the proximity effect are not particularly limited to those equations. Moreover, it is certain that the AC resistances $R_s$ due to the skin effect and the alternating-current resistance $R_p$ due to the proximity effect are actually measured instead of being calculated using the theoretical formula.

Moreover, the high-frequency electric wires according to the first to fourth embodiment of the present invention may be enamel wires whose surfaces are covered with an insulating cover layer such as polyurethane.

As described above, it is obvious that the present invention includes various embodiments not shown in the drawings. Accordingly, the technical scope of the present invention is determined by only the features of the invention according to proper claims.

Industrial Applicability

The electric wire of the present invention is applicable to the electronic device industry including manufacturing of various types of devices such as high-frequency transformers, motors, reactors, choke coils, induction heaters, magnetic heads, high-frequency power supply cables, DC power units, switching power supplies, AC adaptors, displacement sensor/flow detectors of the eddy current method or the like, IH cocking heaters, non-contact power supplies, and high-frequency current generators.

What is claimed is:

1. An electric motor, comprising:
a plurality of iron cores arranged on a circle;
a plurality of coils wound with an electric wire on the plurality of iron cores, the electric wire including a material having a higher volume resistivity than copper; and
a rotor rotated by the plurality of coils to which alternating current is applied, wherein
an AC resistance value of the electric wire has a first frequency which is equal to an AC resistance value of a copper wire having the same diameter and length as the electric wire, and a second frequency which is larger than the first frequency and by which the AC resistance value of the electric wire is equal to the AC resistance value of the copper wire,
the AC resistance value of the electric wire is smaller than the AC resistance value of the copper wire between the first frequency and the second frequency, and a frequency of the alternating current applied to the coils is controlled so that the frequency in which the coils is used is set within a frequency range between the first frequency and the second frequency.

2. The electric motor according to claim 1, wherein the frequency of the alternating current applied to the coils is controlled by the inverter method.

3. The electric motor according to claim 1, wherein the electric wire includes either an aluminum wire or a copper-clad aluminum wire.

4. The electric motor according to claim 1, wherein the alternating current includes a high frequency component having an amplitude of one-third or more of a frequency component of a fundamental wave of the alternating current.

5. The electric motor according to claim 1, wherein the shape of a cross-sectional area of the electric wire is round-shaped, flat-shaped, or rectangle-shaped.

6. The electric motor according to claim 1, wherein diameter of the electric wire is between 0.2 mm and 1.8 mm.

* * * * *